US006967347B2

(12) United States Patent
Estes et al.

(10) Patent No.: US 6,967,347 B2
(45) Date of Patent: *Nov. 22, 2005

(54) TERAHERTZ INTERCONNECT SYSTEM AND APPLICATIONS

(75) Inventors: Michael J. Estes, Longmont, CO (US); Garret Moddel, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/462,491

(22) Filed: Jun. 14, 2003

(65) Prior Publication Data

US 2004/0069984 A1    Apr. 15, 2004

Related U.S. Application Data

(63) Continuation-in-part of application No. 10/337,427, filed on Jan. 6, 2003, and a continuation-in-part of application No. 10/140,535, filed on May 6, 2002, and a continuation-in-part of application No. 10/103,054, filed on Mar. 20, 2002, now abandoned, and a continuation-in-part of application No. 09/860,972, filed on May 21, 2001, now Pat. No. 6,563,185, which is a continuation-in-part of application No. 09/860,988, filed on May 21, 2001, now Pat. No. 6,534,784.

(51) Int. Cl.[7] .......................................... H01L 31/336
(52) U.S. Cl. ................................... 257/25; 257/30
(58) Field of Search ............................ 257/25, 30, 31, 257/32, 34, 35, 36, 46

(56) References Cited

U.S. PATENT DOCUMENTS

| 5,056,111 A | * | 10/1991 | Duling et al. ................ 375/259 |
| 5,093,692 A | * | 3/1992 | Su et al. ..................... 257/104 |
| 5,287,212 A | * | 2/1994 | Cox et al. ................... 398/183 |
| 5,754,948 A | * | 5/1998 | Metze ......................... 455/41.2 |
| 5,825,240 A | * | 10/1998 | Geis et al. .................. 327/570 |
| 5,895,934 A | * | 4/1999 | Harvey et al. ................ 257/49 |
| 6,049,308 A | * | 4/2000 | Hietala et al. ........ 343/700 MS |
| 6,664,562 B2 | * | 12/2003 | Weiss et al. .................. 257/21 |

* cited by examiner

Primary Examiner—David Nelms
Assistant Examiner—Thinh T. Nguyen
(74) Attorney, Agent, or Firm—Michael Pritekau; Yoriko Morita

(57) ABSTRACT

An assembly includes a first electrical circuitry for providing a first electrical signal containing data and a transmitting arrangement, connected with the first electrical circuitry, for receiving the first electrical signal and for converting the first electrical signal into an electromagnetic signal containing at least a portion of the data. The electromagnetic signal has a carrier frequency greater than 300 GHz. The assembly also includes a receiving arrangement for receiving the electromagnetic signal and for converting the electromagnetic signal into a second electrical signal containing at least some of the portion of the data, and a second electrical circuitry connected with the receiving arrangement and configured for receiving the second electrical signal.

53 Claims, 29 Drawing Sheets

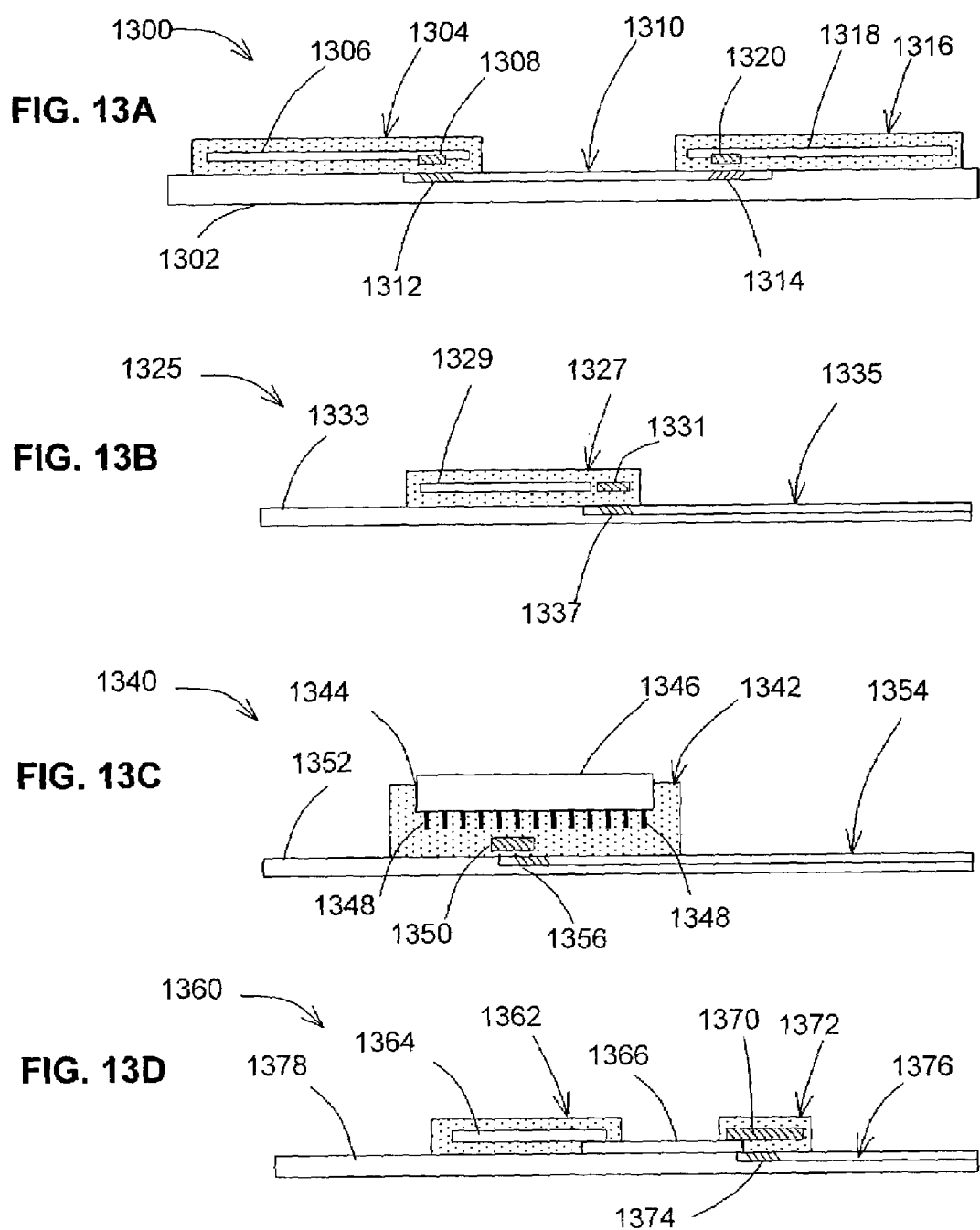

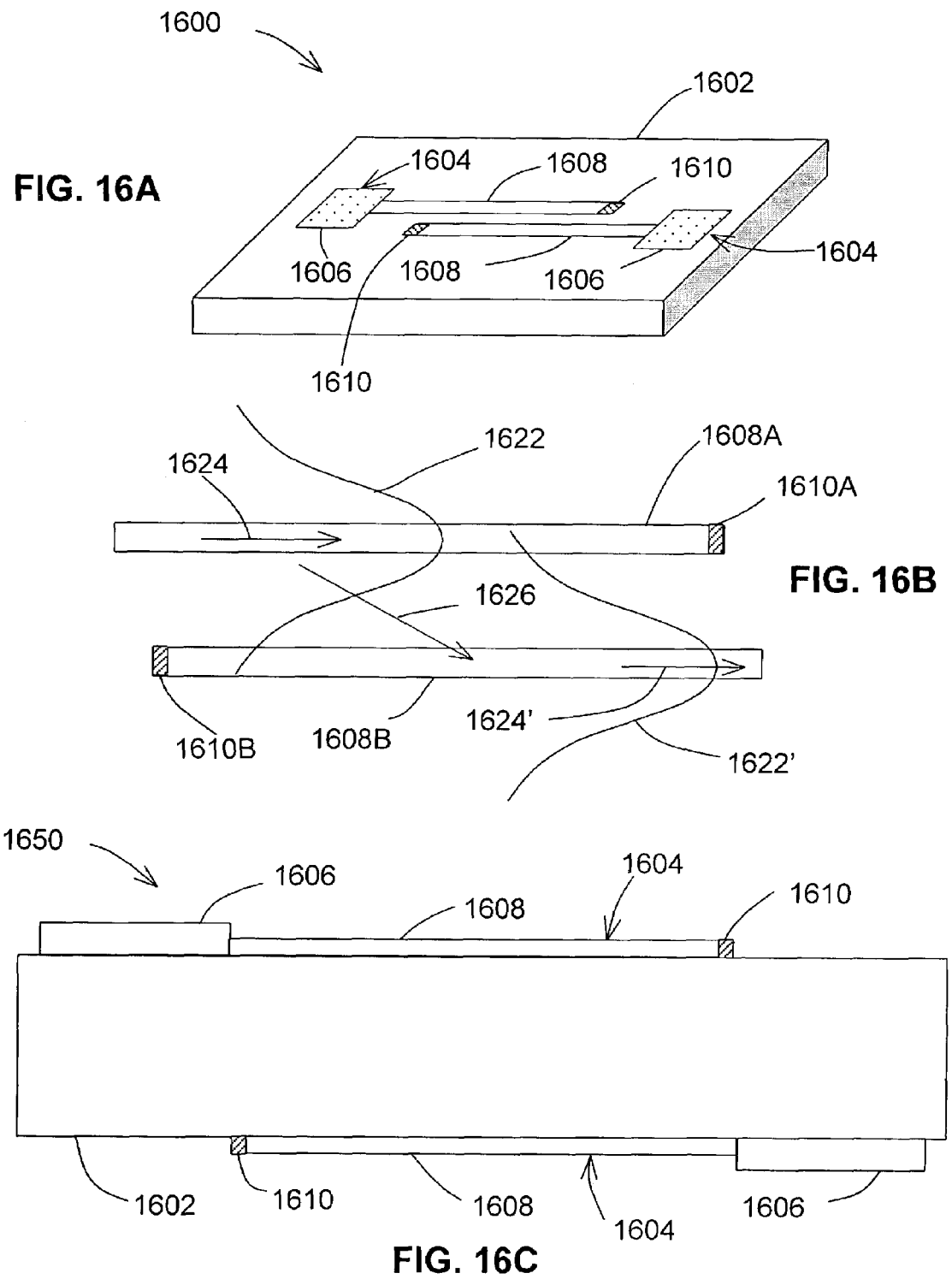

TERAHERTZ INTERCONNECT SYSTEM AND APPLICATIONS

RELATED APPLICATION

The present application is a Continuation-in-Part of U.S. patent application Ser. No. 10/337,427, filed Jan. 6, 2003 entitled OPTICAL INTERCONNECTS FOR USE WITH HIGH SPEED ELECTRON TUNNELING DEVICES, which in turn is a Continuation-in-Part of U.S. patent application Ser. No. 09/860,988 now U.S. Pat. No. 6,534, 784 entitled METAL-OXIDE ELECTRON TUNNELING DEVICE FOR SOLAR ENERGY CONVERSION filed on May 21, 2001, Ser. No. 09/860,972 now U.S. Pat. No. 6,563,185 entitled HIGH SPEED ELECTRON TUNNELING DEVICE AND APPLICATIONS filed on May 21, 2001, Ser. No. 10/103,054 entitled SURFACE PLASMON DEVICES filed on Mar. 20, 2002, now abandoned and Ser. No. 10/140,535 entitled SURFACE PLASMON DEVICES filed May 6, 2002. All of the aforementioned patent applications and patents are incorporated herein by reference in their entirety.

BACKGROUND OF THE INVENTION

The present invention relates generally to electronic devices. More particularly, the present invention relates to interconnection of electronic devices at carrier frequencies in a range from a few gigahertz to several hundreds of terahertz, and more specifically to terahertz interconnection of electronic devices.

Increased amounts and speed of data transfer in communication and computing systems pose a challenge to the current state of device technology. Large quantities of information must be transferred quickly across distances ranging from very short distances, from between chips as well as between boards containing chips, to longer distances between racks of devices, very short reach (VSR)/optical Ethernet and beyond. Even with the development of high-speed communications switches and routers, the data must be taken in and out of such high-speed devices at compatibly high rates in order for the entire system to function efficiently.

Radio frequency (RF) inter-chip and intra-chip connections have been developed as a possible way of transferring data within and between chips. However, RF interconnects use large antennae and/or waveguides on or connected to chips, thus requiring valuable on-clip and device "real estate." RF interconnects are limited in data transfer speed due to the use of radio frequencies. Furthermore, It is submitted that the design and manufacture of such RF lines for high signal frequencies is an expensive part of prior art RF interconnection design.

Other researchers have suggested the use of optical signals as an alternative to electrical signals in providing inter- and intra-chip connections.[1] For instance, parallel fiber-optic interconnects which are edge-connected to semiconductor devices have been developed for use within systems with a large number of electronic components (e.g., computers).[2] Although optical interconnect technology promises the possibility of higher rate data transfer than electrical interconnects, optical interconnect technology, as heretofore suggested, is still cost prohibitive in comparison. There is potentially a huge market for high speed interconnect arrangements because all desktop computers and local area networks would benefit from the use of high speed interconnects between components on chips, between chips, etc.

Currently, electrical interconnects are generally used in communication and computing systems for power and data signal distribution, such as in bus lines, etc. Electrical interconnects, however, require hardwired connections such as, for example, lithographed lead lines on a chip, wire bonds from the chip to a chip package, pins leading from inside the package to a circuit board, printed circuit board wiring, edge connectors from circuit board to other boards, input/output (I/O) devices, data storage devices, and others. Such hardwired connections add parasitic capacitance, inductance, and resistance, which seriously degrade data transmission at high data bandwidths. Thus, the cost and performance limitations of electrical interconnects are compounded as circuits are made to operate at increasingly high frequencies. At high frequencies, electrical interconnects are limited in connection distance and require large amounts of power as well as signal reconditioning. Applicants submit that there are at least two issues contributing to this problem. First issue is the relative change in material properties, such as refractive index and electromagnetic radiation propagation speed, over the bandwidth of the signal. A second, and perhaps more significant, issue is the relative difference in wavelength over the bandwidth of the signal. For example, if the signal bandwidth is centered at zero frequency (i.e., DC), then the wavelength of different signal components may range from infinity (for the DC components) to, for instance, centimeters for components at tens of gigahertz. This enormous range in wavelength makes it difficult to design electrical transmission paths which will work efficiently over the entire bandwidth range.

In addition to the aforementioned RF inter- and intra-chip interconnects, other wireless interconnects at other frequencies have also been suggested. For example, wireless data communications link between circuit components using GaAs-based MIMIC transmit/receive integrated circuit devices, operating at high-bandwidth millimeter-wave frequencies, coupled to corresponding circuit components, such as digital processing units (or CPUs) have been disclosed by Metze in U.S. Pat. No. 5,754,948 (hereinafter, Metze). It is submitted, however, that GaAs-based MIMICs are complex devices which require expensive epitaxial growth techniques in the fabrication. Applicants submit that epitaxial growth techniques are expensive and severely limit the integration of devices with different epitaxial layer structures. Also, the disclosure of Metze is confined to millimeter-wave frequencies; specifically, the transmit/receive circuit of Metze is described as preferably operating:

> at frequency ranges above 35 GHz, and most preferably at frequencies between 60 GHz and 94 GHz . . . other frequencies may be utilized and still fall within the standard I.E.E.E. definition of "millimeter-wave" for purposes of this invention. (Metze, column 5 lines 25–32)

Regarding the "standard I.E.E.E. definition of 'millimeter-wave'" as referred to by Metze, according to the IEEE Virtual Museum website, the millimeter wave region is generally considered to correspond to 30 GHz to 300 GHz.[3]

As another example of wireless interconnects, in U.S. Pat. No. 5,056,111, Duling, III, et al. (hereinafter Duling) discloses a communication system for transmitting and receiving terahertz signals, which involves the generation of sub-picosecond (i.e., terahertz) pulses for transmission of data. However, Applicants submit that ultrashort pulse generation, such as that disclosed in Duling, require complex systems such as femtosecond lasers that are impractical to use as a replacement for local electrical interconnects. As will be described at appropriate points below, the present invention recognizes certain problems with both the electrical interconnects and wireless interconnection schemes which are thought to be unresolved by the prior art.

As will be seen hereinafter, the present invention provides a significant improvement over the prior art as discussed above by virtue of its ability to provide the increased performance while, at the same time, having significant advantages in its manufacturability. This assertion is true for electromagnetic devices generally, which take advantage of the present invention, as well as data communication and computing devices in particular.

SUMMARY OF THE INVENTION

As will be described in more detail hereinafter, there is disclosed herein an integrated circuit chip including a formation of integrated layers. The integrated layers are configured so as to define at least one integrated electronic component as well as an integrated electron tunneling device. The integrated electron tunneling device includes first and second non-insulating layers spaced apart from one another such that a given voltage can be provided across the first and second non-insulating layers. The integrated electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The integrated electron tunneling device further includes an antenna structure connected with the first and second non-insulating layers, and the integrated electron tunneling device is electrically connected with the integrated electronic component.

In one aspect of the invention, a method for fabricating an integrated circuit chip is disclosed. The method includes forming a plurality of integrated layers, where the forming step includes the steps of defining at least one integrated electronic component and defining an integrated electron tunneling device. The integrated electron tunneling device includes first and second non-insulating layers spaced apart from one another such that a given voltage can be provided across the first and second non-insulating layers. The integrated electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The integrated electron tunneling device further includes an antenna structure connected with the first and second non-insulatiig layers. The method further includes electrically connecting the integrated electron tunneling device with the integrated electronic component.

In another aspect of the invention, an integrated circuit chip includes a formation of integrated layers, which integrated layers are configured so as to define at least one integrated electronic component. The integrated circuit chip also includes an electron tunneling device including first and second non-insulating layers spaced apart from one another such that a given voltage can be provided across the first and second non-insulating layers. The electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The electron tunneling device further includes an antenna structure connected with the first and second non-insulating layers, and the electron tunneling device is formned on top of and separately from the formation of integrated layers without interference with an intended function of the integrated electronic component and its spatial location while being electrically connected with the integrated electronic component.

In still another aspect of the invention, an integrated circuit chip includes a formation of integrated layers, which formation of integrated layers is configured to define at least one integrated electronic component and is further configured to define an integrated optoelectronic device having an antenna. The antenna is configured to receive an optical signal. The integrated optoelectronic device is electrically connected with the integrated electronic component.

In yet another aspect of the invention, an integrated circuit chip includes a formation of integrated layers defining at least one integrated electronic component. The integrated circuit chip also includes an optoelectronic device having an antenna, which antenna is configured to receive an optical signal incident thereon. The optoelectronic device is formed on top of and separately from the formation of integrated layers without interference with an intended function of the integrated electronic component and its spatial location while being electrically connected with the integrated electronic component. In an alternative embodiment, the optoelectronic device is configured to provide an optical signal while the antenna is configured instead to transmit the optical signal.

In a further aspect of the invention, an integrated circuit chip includes at least one substrate and circuitry formed on the substrate, which circuitry includes at least first and second integrated electronic components. The integrated circuit chip also includes a first optoelectronic device for providing an optical signal. The first optoelectronic device includes a first antenna, which first antenna is configured to emit the optical signal, and the first optoelectronic device is supported on the substrate while being electrically connected with the first integrated electronic component. The integrated circuit chip further includes a second optoelectronic device. The second optoelectronic device includes a second antenna, which second antenna is configured to receive the optical signal from the first antenna such that first and second optoelectronic devices are in optical communication with one another, while the second optoelectronic device is also supported on the substrate and is electrically connected with the second integrated electronic component.

In a still further aspect of the invention, an integrated circuit assembly includes first and second substrates. First circuitry, including at least a first integrated electronic component, is formed on the first substrate, and second circuitry, including at least a second integrated electronic component, is formed on the second substrate. The integrated circuit assembly also includes a first optoelectronic device for providing an optical signal. The first optoelectronic device includes a first antenna, which is configured to emit the optical signal, and is supported on the first substrate while being electrically connected with the first integrated electronic component. The integrated circuit assembly further includes a second optoelectronic device including a second antenna. The second optoelectronic device is supported on the second substrate and is electrically connected with the second integrated electronic component. The second antenna is configured to receive the optical signal from the first antenna such that the first and second optoelectronic devices are in optical communication with one another.

In another aspect of the invention, an assembly includes an optoelectronic system, in which an optical signal is present and which includes at least one optoelectronic device configured to act on the optical signal. The assembly also includes an electron tunneling device also configured to act on the optical signal. The electron tunneling device includes first and second non-insulating layers, which are spaced apart from one another such that a given voltage can be provided across the first and second non-insulating layers, and an arrangement disposed between the first and second non-insulating layers, which arrangement is configured serve as a transport of electrons between and to the first and second non-insulating layers. The arrangement includes a first amorphous layer configured such that using only the first amorphous layer in the arrangement would result in a given value of nonlinearity in the transport of electrons, with respect to the given voltage. The arrangement also includes a different, second layer disposed directly adjacent to and configured to cooperate with the first amorphous layer such that the transport of electrons includes, at least in part, transport by means of tunneling through the first amorphous layer and the second layer, and such that the nonlinearity, with respect to the given voltage, is increased over and above the given value of nonlinearity by the inclusion of the second layer without the necessity for any additional layer. The assembly further includes an optical configuration cooperating with the electron tunneling device and with the optoelectronic device such that the optical signal is transmitted therebetween.

In a still another aspect of the invention, a device includes a waveguide, which waveguide in turn includes an optical input port. The optical input port is configured for receiving an input light. The waveguide also includes an optical output port and is configured for directing the input light from the optical input port toward the optical output port. The device also includes an optoelectronic assembly, which includes an electron tunneling device. The electron tunneling device includes first and second non-insulating layers, which are spaced apart from one another such that a given voltage can be provided thereacross, and an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The optoelectronic assembly also includes a coupling arrangement configured to cooperate with the electron tunneling device and the waveguide for coupling at least a portion of the input light from the waveguide into the electron tunneling device.

In yet another aspect of the invention, an arrangement includes an optical waveguide with an optical input port, which optical input port is configured for receiving an input light, and an optical output port. The optical waveguide is configured for directing the input light from the optical input port toward the optical output port. The arrangement further includes an optoelectronic assembly with a surface plasmon device, which is configured to act on an input signal. The surface plasmon device includes a device input port, which is configured to receive the input signal, a device output port and a structure including a tunneling junction connected with the device input port and the device output port. The tunnelinig junction is configured in a way (i) which provides electrons in a particular energy state within the structure, (ii) which produces surface plasmons in response to the input signal, (iii) which causes the structure to act as a surface plasmon waveguide for directing at least a portion of the surface plasmons along a predetermined path toward the device output port such that the surface plasmons so directed interact with the electrons in a particular way, and (iv) which produces at the device output port an output signal resulting from the particular interaction between the electrons and the surface plasmons. The optoelectronic assembly further includes a coupling arrangement, which is configured to cooperate with the surface plasmon device and the optical waveguide for coupling at least a portion of the input light from the waveguide into the surface plasmon device as the input signal.

In a further aspect of the invention, an integrated circuit chip includes a substrate and a formation of integrated layers supported on the substrate, which integrated layers are configured so as to define at least one integrated electronic component. The integrated circuit chip also includes an optical waveguide, which is also supported on the substrate and includes an optical input port configured for receiving an input light including a clock signal encoded thereon. The integrated circuit chip further includes at least one optoelectronic assembly electrically connected with the integrated electronic component and including an electron tunneling device. The electron tunneling device includes first and second non-insulating layers spaced apart from one another such that a given voltage can be provided thereacross. The electron tunneling device also includes an arrangement disposed between the first and second non-insulating layers and configured to serve as a transport of electrons between and to the first and second non-insulting layers. The arrangement includes at least a first layer configured such that the transport of electrons includes, at least in part, transport by means of tunneling. The optoelectronic assembly also includes a coupling arrangement configured to cooperate with the electron tunneling device and the optical waveguide for coupling at least a portion of the input light including the clock signal from the waveguide into the electron tunneling device. The electron tunneling device is configured to (i) receive the portion of the input light, (ii) produce an electric signal and (iii) transmit the electric signal toward the integrated electronic component electrically connected with the optoelectronic assembly for use by the integrated electronic component.

In another aspect of the invention, an assembly includes a first electrical circuitry for providing a first electrical signal containing data. A transmitting arrangement is connected with the first electrical circuitry and is configured for receiving the first electrical signal and for converting the first electrical signal into an electromagnetic signal containing at least a portion of the data. The electromagnetic signal has a carrier frequency greater than 300 GHz. The assembly further includes a receiving arrangement configured for receiving the electromagnetic signal and for converting the electromagnetic signal into a second electrical signal containing at least some of the portion of the data, and a second electrical circuitry connected with the receiving arrangement and configured for receiving the second electrical signal.

In still another aspect of the invention, a method for use in an assembly including at least a first electrical circuitry for providing a first electrical signal containing data and a second electrical circuitry for receiving a second electrical signal is disclosed. The method includes connecting the first electrical circuitry with a transmitting arrangement configured for receiving the first electrical signal and for converting the first electrical signal into an electromagnetic signal containing at least a portion of the data. The electromagnetic signal has a carrier frequency greater than 300 GHz. The method further includes connecting the second electrical circuitry with a receiving arrangement configured for receiving the electromagnetic signal and converting the electromagnetic signal into the second electrical signal containing at least some of the portion of data to be received by the second electrical circuitry.

In yet another aspect of the invention, another method for use in an assembly including at least a first electrical circuitry for providing a first electrical signal containing data and a second electrical circuitry for receiving a second electrical signal is disclosed. The method includes, at a first location, receiving the first electrical signal from the first electrical circuitry, and converting the first electrical signal into an electromagnetic signal containing at least a portion of the data. The electromagnetic signal has a carrier frequency greater than 300 GHz. The method further includes, at a second location, receiving the electromagnetic signal, converting the electromagnetic signal into the second electrical signal containing at least some of the portion of the data, and directing the second electrical signal to the second electrical circuitry.

In a further aspect of the invention, an assembly includes a first electrical circuitry for providing a first electrical signal containing data, and a transmitting arrangement connected with the first electrical circuitry and configured for receiving the first electrical signal and for converting the first electrical signal into an electromagnetic signal containing at least a portion of the data. The assembly further includes a receiving arrangement for receiving the electromagnetic signal and for converting the electromagnetic signal into a second electrical signal containing at least some of the portion of the data, and a second electrical circuitry connected with the receiving arrangement and configured for receiving the second electrical signal. At least one of the transmitting and receiving arrangements includes an electron tunneling device, which includes first and second non-insulating layers spaced apart from one another such that a given voltage can be provided across the first and second non-insulating layers. The electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling.

In a still further aspect of the invention, an assembly includes a first electrical circuitry for providing a first electrical signal containing data, and a transmitting arrangement connected with the first electrical circuitry and configured for receiving the first electrical signal and for converting the first electrical signal into an electromagnetic signal containing at least a portion of the data. The electromagnetic signal has a carrier frequency of at least three gigahertz. The assembly further includes a receiving arrangement for receiving the electromagnetic signal and converting the electromagnetic signal into a second electrical signal containing at least some of the portion of the data, and a second electrical circuitry connected with the receiving arrangement and configured for receiving the second electrical signal. At least one of the transmitting and receiving arrangements includes an electron tunneling device.

In a yet further aspect of the invention, an assembly includes a first electrical circuitry for providing a first electrical signal containing data, and a transmitting arrangement connected with the first electrical circuitry and configured for receiving the first electrical signal and for converting the first electrical signal into an electromagnetic signal containing at least a portion of the data. The assembly further includes a receiving arrangement for receiving the electromagnetic signal and for converting the electromagnetic signal into a second electrical signal containing at least some of the portion of the data, and a second electrical circuitry connected with the receiving arrangement and configured for receiving the second electrical signal. At least one of the transmitting and receiving arrangements includes a metal-insulator-based, electron tunneling device.

In another aspect of the invention, an assembly includes a first electrical circuitry for providing a first electrical signal containing first data, and a first transceiver arrangement connected with the first electrical circuitry and configured for receiving the first electrical signal and for converting the first electrical signal into a first electromagnetic signal containing at least a portion of the first data. The assembly further includes a second transceiver arrangement configured for receiving the first electromagnetic signal and for converting the first electromagnetic signal into a second electrical signal containing at least some of the portion of the first data, and a second electrical circuitry connected with the second transceiver arrangement and configured for receiving the second electrical signal. At least one of the first and second transceiver arrangements includes an electron tunneling device. The electron tunneling device includes first and second non-insulating layers spaced apart from one another such that a given voltage can be provided across the first and second non-insulating layers, and an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling.

In still another aspect of the invention, an assembly includes a first electrical circuitry for providing a first electrical signal containing data, and a transmitting arrangement connected with the first electrical circuitry and configured for receiving at least the first electrical signal and for converting the first electrical signal into an electromagnetic signal containing at least a portion of the data. The assembly further includes a receiving arrangement for receiving the electromagnetic signal and for converting the electromagnetic signal into a second electrical signal containing at least some of the portion of the data, and a second electrical circuitry connected with the receiving arrangement and configured for receiving the second electrical, signal. At least one of the transmitting and receiving arrangements is configured to provide electron tunneling and includes an antenna connected therewith.

In a further aspect of the invention, an assembly includes a first electrical circuitry for providing a first electrical signal containing data, and a transmitting arrangement connected with the first electrical circuitry and configured for receiving the electrical signal and for converting the first electrical signal into an electromagnetic signal containing at least a portion of the data. The electromagnetic signal has a carrier frequency greater than 300 GHz. The assembly also includes a receiving arrangement configured for receiving the electromagnetic signal and converting the electromagnetic signal into a second electrical signal containing at least some of the portion of data, and a second electrical circuitry connected with the receiving arrangement and configured for receiving the second electrical signal. The transmitting arrangement and the receiving arrangement are disposed in close proximity to one another such that the electromagnetic signal is transmitted from the transmitting arrangement to the receiving arrangement at least in part by means of coupled-mode energy transfer.

In another aspect of the invention, an assembly includes a first electrical circuitry for providing a first electrical signal containing data, and a transmitting arrangement connected with the first electrical circuitry and configured for receiving the first electrical signal and for converting the first electrical signal into an electromagnetic signal containing at least a portion of the data. The assembly further includes a receiving arrangement configured for receiving the electromagnetic signal and for converting the electromagnetic signal into a second electrical signal containing at least some of the portion of data, and a second electrical circuitry connected with the receiving arrangement and configured for receiving the second electrical signal. At least one of the transmitting and receiving arrangements includes an electron tunneling device, which in turn includes first and second non-insulating layers spaced apart from one another such that a given voltage can be applied across the first and second non-insulating layers. The electron tunneling device further includes an arrangement disposed between the first and second non-insulating layers and configured to serve as a transport of electrons between and to the first and second non-insulating layers, where the arrangement includes at least a first layer configured such that the transport of electrons includes, at least in part, transport by means of tunneling. The transmitting arrangement and the receiving arrangement are disposed in close proximity to one another such that the electromagnetic signal is transmitted from the transmitting arrangement to the receiving arrangement at least in part by means of coupled-mode energy transfer.

In still another aspect of the invention, an assembly includes a substrate and an integrated circuit package supported on the substrate. The integrated circuit package includes an integrated circuit module configured for providing an output electrical signal containing output data, and a transceiver arrangement connected with the integrated circuit module for receiving the output electrical signal and for converting the output electrical signal into an output electromagnetic signal containing at least a portion of the output data. The assembly further includes a waveguide having a first segment and a distinct, second segment, where the first segment is also supported oil the substrate and configured for receiving at least a portion of the output electromagnetic signal and directing the portion of the output electromagnetic signal toward the distinct, second segment of the waveguide.

In yet another aspect of the invention, an assembly for use in a system including an integrated circuit module configured for providing an output electrical signal containing data is disclosed. This assembly for receiving the integrated circuit module and extracting the output data includes a substrate and an integrated circuit package supported on the substrate. The integrated circuit package is configured for accommodating the integrated circuit module thereon, and includes a transceiver arrangement connected with the integrated circuit module for receiving the output electrical signal and for converting the output electrical signal into an output electromagnetic signal containing at least a portion of the output data. The assembly further includes a waveguide having a first segment and a distinct, second segment. The first segment is also supported on the substrate and configured for receiving at least a portion of the output electromagnetic signal and directing the portion of the output electromagnetic signal toward the distinct, second segment of the waveguide.

In still yet another aspect of the invention, an assembly for use in a system including an integrated circuit module configured for providing an output electrical signal containing output data is disclosed. This assembly for receiving the integrated circuit module and extracting the output data includes an integrated circuit package configured for accommodating the integrated circuit module thereon. The integrated circuit package includes a transceiver arrangement connected with the integrated circuit module and configured for receiving the output electrical signal, converting the output electrical signal into an output electromagnetic signal containing at least a portion of the output data, and directing the output electromagnetic signal away from the integrated circuit package.

In another aspect of the invention, an assembly includes a substrate and an integrated circuit package. The integrated circuit package includes an integrated circuit module for providing an output electrical signal containing output data, and a plurality of electrical pin-outs for directing the output electrical signal away from the integrated circuit module and away from the integrated circuit package. The assembly further includes a socket arrangement supported on the substrate and configured for receiving the integrated circuit package thereon. The socket arrangement includes a transceiver arrangement disposed therein such that the transceiver arrangement receives the output electrical signal from the plurality of electrical pin-outs and converts the output electrical signal into an output electromagnetic signal containing at least a portion of the output data. The assembly also includes a waveguide having a first segment and a distinct, second segment, where the first segment is also supported on the substrate and is configured for receiving at least a portion of the output electromagnetic signal and directing the portion of the output electromagnetic signal toward the distinct, second segment of the waveguide.

In still another aspect of the invention, an assembly for use in a system including an integrated circuit package is disclosed. The integrated circuit package includes an integrated circuit module, for providing an output electrical signal containing output data, and a plurality of electrical pin-outs, for directing the output electrical signal away from the integrated circuit module and away from the integrated circuit package is disclosed. This assembly for receiving the integrated circuit module and extracting the output data, includes a substrate and a socket arrangement supported on the substrate and configured for receiving the integrated circuit package thereon. The socket arrangement includes a transceiver arrangement disposed therein such that the transceiver arrangement receives the output electrical signal from the plurality of electrical pin-outs and converts the output electrical signal into an output electromagnetic signal containing at least a portion of the output data. The assembly further includes a waveguide having a first segment and a distinct, second segment. The first segment is also supported on the substrate and is configured for receiving at least a portion of the output electromagnetic signal and directing the portion of the output electromagnetic signal toward the distinct, second segment of the waveguide.

In yet another aspect of the invention, an assembly for use in a system including an integrated circuit package is disclosed. The integrated circuit package includes an integrated circuit module, for providing an output electrical signal containing output data, and a plurality of electrical pin-outs, for directing the output electrical signal away from the integrated circuit module and away from the integrated circuit package. This assembly for receiving the integrated circuit module and extracting said output data includes a socket arrangement configured for accommodating the integrated circuit package thereon. The socket arrangement includes a transceiver arrangement configured for receiving the output electrical signal from the plurality of electrical pin-outs, converting the output electrical signal into an output electromagnetic signal containing at least a portion of the output data, and directing the output electromagnetic signal away from the socket arrangement.

In another aspect of the invention, an assembly includes a substrate and an integrated circuit package supported on the substrate and containing an integrated circuit module. The integrated circuit module is configured for providing an output electrical signal containing output data. The assembly also includes an electrical interconnect also supported on the substrate and having first and second ends, where the first end is connected with the integrated circuit module through the integrated circuit package and is configured to receive the output electrical signal such that the output electrical signal is directed through the electrical interconnect toward the second end. The assembly further includes a transceiver package also supported on the substrate and including a transceiver chip. The transceiver chip is connected with the second end of the electrical interconnect such that the transceiver chip receives the output electrical signal and converts the output electrical signal into an output electromagnetic signal containing at least a portion of the output data. Additionally, the assembly includes a waveguide having a first segment and a distinct, second segment. The first segment is also supported on the substrate and configured for receiving at least a portion of the output electromagnetic signal and directing the portion of the output electromagnetic signal toward the distinct, second segment of the waveguide.

In yet another aspect of the invention, an assembly for use in a system including an integrated circuit package is disclosed. The integrated circuit package includes an integrated circuit module configured for providing an output electrical signal containing output data. This assembly for receiving the integrated circuit module and extracting the output data includes a substrate configured for supporting the integrated circuit module thereon. The substrate includes an electrical interconnect having first and second ends. The first end is connected with the integrated circuit module through the integrated circuit package and is configured to receive the output electrical signal such that the output electrical signal is directed through the electrical interconnect toward the second end. The substrate also includes a transceiver package including a transceiver chip. The transceiver chip is connected with the second end of the electrical interconnect such that the transceiver chip receives the output electrical signal and converts the output electrical signal into an output electromagnetic signal containing at least a portion of the output data. The substrate further includes a waveguide having a first segment and a distinct, second segment. The first segment is configured for receiving at least a portion of the output electromagnetic signal and directing the portion of the output electromagnetic signal toward the distinct, second segment of the waveguide.

In still another aspect of the invention, an assembly for use in a system including an integrated circuit package is disclosed. The integrated circuit package includes an integrated circuit module configured for providing an output electrical signal containing output data. This assembly for receiving the integrated circuit module and extracting the output data includes an electrical interconnect having first and second ends. The first end is connected with the integrated circuit module through the integrated circuit package and is configured to receive the output electrical signal such that the output electrical signal is directed through the electrical interconnect toward the second end. The assembly also includes a transceiver package including a transceiver chip. The transceiver chip is connected with the second end of the electrical interconnect and is configured for receiving the output electrical signal, converting the output electrical signal into an output electromagnetic signal containing at least a portion of the output data, and directing the output electromagnetic signal away from the transceiver package.

BRIEF DESCRIPTION OF THE SEVERAL VIEWS OF THE DRAWING

The present invention may be understood by reference to the following detailed description taken in conjunction with the drawings briefly described below. It is noted that, for purposes of illustrative clarity, certain elements in the drawings may not be drawn to scale.

FIGS. 13A–13D are diagrammatic illustrations of assemblies for integrating electrical circuitry such as, for example, standard integrated circuit chips, into the terahertz interconnect system of the present invention.

FIG. 14A a diagrammatic illustration of a side view of a plurality of boards interconnected by a plurality of interconnected, transceiver chip pairs, while FIGS. 14B–14C are diagrammatic illustrations, in perspective view, of two examples of pairs of interconnected, transceiver chips in accordance with the present invention.

FIGS. 16A–16C are diagrammatic illustrations of embodiments of the terahertz interconnect system of the present invention, shown here to illustrate an example of a transmitter/receiver pair including coupled transmission lines on a surface of a substrate (FIG. 16A), a close-up of the coupled transmission lines (FIG. 16B), and an alternative arrangement of the transmitter and receiver on opposing faces of a substrate (FIG. 16C).

DETAILED DESCRIPTION

Figure 1A:
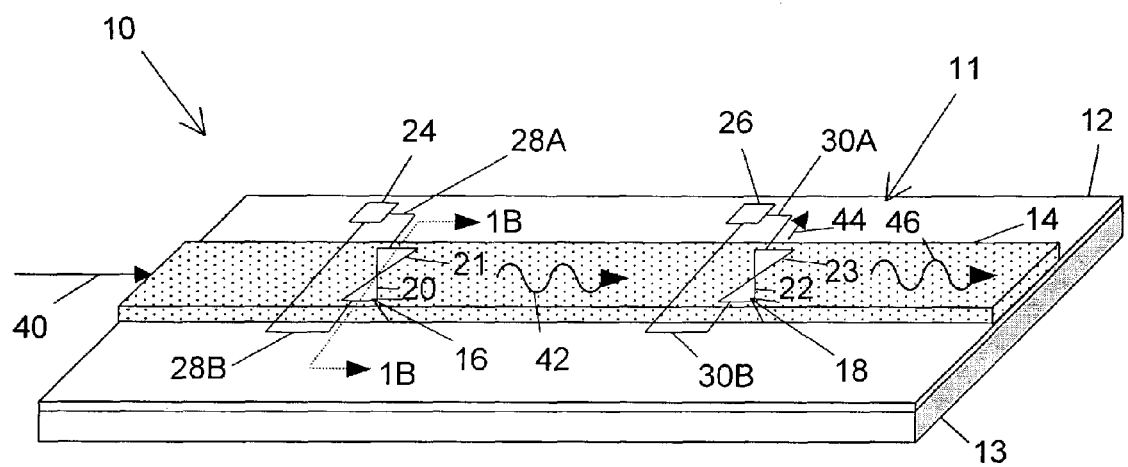
FIG. 1A is a diagrammatic illustration, in perspective view, of an interconnected electron tunneling device of the present invention, shown here to illustrate an embodiment including a planar waveguide on a chip as the interconnection.

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

As described in the Background section, there is a growing need for high speed interconnection between devices over short distances, such as between racks, boards, chips, as well as between components located on a single chip. These interconnection arrangements must be capable of high speed transmission of data and should be low cost. The interconnection arrangements and systems need to be competitive and compatible with current state-of-the-art electrical interconnects in terms of cost, speed, power, distance, requirement for signal processing and allowance of plug-n-play. For low cost, high speed and highest level of integration, the interconnect components may be integrated directly onto silicon integrated circuitry. The interconnect should ideally be compatible with standardized systems and interfaces provided by existing suppliers. In order to accommodate the current state of the technology, the interconnect should be compatible with multi-mode fibers and be time division multiplexing (TDM) or coarse wavelength division multiplexing (CWDM) compatible. Alternatively, depending on the application in which the interconnect is to be used, single-mode fibers might also be used. Polarization-insensitivity is desirable in order to reduce signal loss. VCSEL devices are the mainstay light sources in the current art; therefore the interconnection arrangement should be compatible with VCSEL devices. Currently-available VCSEL devices operate at 850 nm and, potentially, at 1300 and 1550 nm wavelengths. Furthermore, current VCSELs operate at 2.5 Gbps, while 10 Gbps and, in the future, 80 Gbps devices may be available. The interconnect should also be temperature-insensitive in order for the interconnect to be incorporated onto silicon integrated circuitry. For example, as will be described in detail hereinafter, the interconnect may be top-side coupled onto CMOS-integrated components.

Recent progress in tunneling junction technology by the assignee of the present application has greatly increased the flexibility in fabrication and design of electron tunneling devices based on metal-insulator(s)-metal structures, thus allowing the fabrication of high speed electron tunneling devices. For example, see aforementioned U.S. Pat. No. 6,534,784 (hereinafter, P1 patent), U.S. Pat. No. 6,563,185 (hereinafter, P2 patent) and U.S. patent application Ser. No. 10/103,054 (hereinafter, P3 application), Ser. No. 10,140,545 (hereinafter P3-cip application), Ser. No. 10/265,935 (hereinafter P1-cip application) and Ser. No. 10/337,427 (hereinafter P5 application). All of the aforementioned patents and applications are incorporated herein by reference in their entirety.

As described in the P5 application, the electron tunneling devices as disclosed in the aforementioned P1 and P2 patents as well as P3, P3-cip and P1-cip applications are particularly suited for integration onto existing chips because combination of metal and insulating layers forming each electron tunneling device may be deposited directly on the chips without the need for additional semiconductor processing steps. That is, the electron tunneling devices of the aforementioned applications may be formed monolithically on existing semiconductor devices without high temperature or crystalline growth procedures. Additionally, unlike hybrid integration assemblies, in which separately-fabricated devices are surface mounted or flip-chip bonded onto existing chips, the electron tunneling devices developed by the assignee of the present invention may be formed directly on the chips themselves. Furthermore, as described in detail in the P1 and P2 patents and P3, P3-cip and P1-cip applications, the electron tunneling devices as disclosed in these applications are capable of operating at high speeds, thus enabling these devices to function in optical regimes and at high data rates. Still further, the electron tunneling devices may be integrated into the circuitry itself (i.e., formned during the fabrication procedure of the circuitry as a part of the circuitry components), if so desired. Therefore, by incorporating the electron tunneling devices of the aforementioned P1 and P2 patents and P3, P3-cip and P1-cip applications as part of an optical interconnect assembly, a high speed interconnection solution for use between components on chips, between chips and so on may be attained.

Moreover, the electron tunneling devices developed by the assignee of the present invention may be fabricated directly adjacent to a waveguide and be configured to cooperate with the waveguide so as to absorb an evanescent field portion of a lightwave traveling through the waveguide. For example, the electron tunneling device may include an antenna designed to couple light of a particular wavelength (e.g., optical wavelengths) out of the waveguide and into a tunneling junction region of the electron tunneling device. Alternatively, the electron tunneling devices may be fabricated within a waveguide so as to absorb the propagating field portion of the a lightwave traveling through the waveguide. As will be discussed in detail at an appropriate point in the text below, the concept of combining the electron tunneling devices with a waveguide is significant in that it allows the coupling of light energy into and out of the waveguide as well as the directing of light energy to electronic devices as electrical energy. This concept may be utilized to provide high speed interconnections between optical and electronic components, as will be discussed in detail immediately hereinafter.

Turning now to the drawings, wherein like components are indicated by like reference numbers throughout the various figures, attention is immediately directed to FIG. 1A, which illustrates an approach to the interconnection of two electron tunneling structures on a chip in accordance with the present invention. FIG. 1A is a diagrammatic illustration, in perspective view, of an interconnect assembly 10. Interconnect assembly 10 includes a chip 11, which includes circuitry 12 formed on top of a substrate 13. A waveguide region 14 is defined on chip 11, and a first electron tunneling device 16 and a second electron tunneling device 18 are formed on top of waveguide region 14. First and second electron tunneling devices 16 and 18 may be, for instance, high speed electron tunneling devices and variants as disclosed in the aforementioned P1 and P2 patents and P3, P3-cip and P1-cip applications, which high speed electron tunneling devices are formed of thin film layers of non-insulating and insulating materials. Waveguide region 14 may be formed, for example, of polymers, dielectric materials such as glass, fused silica and silicon-on-insulator, photonic crystals, lithium niobate, organic materials and photonic bandgap materials. In the embodiment illustrated in FIG. 1A, first and second electron tunneling devices 16 and 18 include antenna arms 20A–20B and 22A–22B, respectively, defining bowtie antennae. Other antenna designs such as, but not limited to, Vivaldi, Vee, and those designs described in the P1-cip application, may also be used. First and second electron tunneling devices 16 and 18 may be connected to integrated electronic components in the existing electronic circuitry (represented by squares 24 and 26) on the chip by, for example, pairs of metal lines 28A and 28B and 30A and 30B, respectively. The integrated electronic components 24 and 26 may be, for example, driver transistors or amplifier transistors.

Still referring to FIG. 1A, a number of different configurations of the interconnect assembly of the present invention are contemplated. As an example, first electron tunneling device 16 may be a modulator, as described in the P2 patent or P3 or P3-cip application, and second electron tunneling device 18 may be a detector, as described in the aforementioned P1 and P2 patents and P3, P3-cip and P1-cip applications. In this case, an external continuous wave (CW) light source (not shown) may feed a CW light, indicated by an arrow 40, into waveguide 14, then the circuitry on the chip may cause first electron tunneling device 16 (modulator) to modulate the CW light in the waveguide so as to produce a modulated light, indicated by a wavy arrow 42. The manner in which the first electron tunneling device may act as a modulator is described in detail in the aforementioned P2 patent and P3 applications. Waveguide region 14 may be further configured to act as an interconnect between the first electron tunneling device 16 and second electron tunneling device 18 such that second electron tunneling device 18 (detector) detects modulated light 42 to generate an electrical signal, indicated by an arrow 44. Electrical signal 44 can then be directed back into the existing circuitry on the chip or be coupled out to integrated electronic component 26. Alternatively, second electron tunneling device 18 may be configured to detect only a portion of modulated light 42 such that a slightly attenuated, output light, indicated by a wavy arrow 46, is further directed through waveguide 14 to be coupled out of the chip. As yet another alternative, second electron tunneling device 18 may be replaced by a conventional detector which is not based on electron tunneling such as, for example, a semiconductor-based detector.

Continuing to refer to FIG. 1A, interconnect assembly 10 is advantageous in that an optical means of interconnecting various devices on-chip as well as off-chip is provided without additional complications in the chip circuitry itself. As described in detail in the aforementioned P1 and P2 patents and P3 application, the electron tunneling devices disclosed by the assignee of the present invention may be formed of readily depositable materials, such as metals and insulators. As a result, first electron tunneling device 16 may be formed directly on top of a chip, as shown in FIG. 1A, without interference with the intended function of the integrated electronic components in the chip circuitry or displacing existing circuitry on the chip, using relatively simple, deposition and lithography, rather than semiconductor crystalline growth techniques. Also, rather than relying upon a direct, hardwire electrical connection from the portion of the chip circuitry near component 24 to that near component 26, data may be transferred between the two regions on the chip by the optical interconnection between the first electron tunneling device and the second electron tunneling device. Furthermore, modulated light 46, which contains information as encoded onto first electron tunneling device 16 acting as a modulator, may be directed onto a site away from chip 11 such that the encoded information is transmitted off-chip at optical speeds.

Figure 1B:
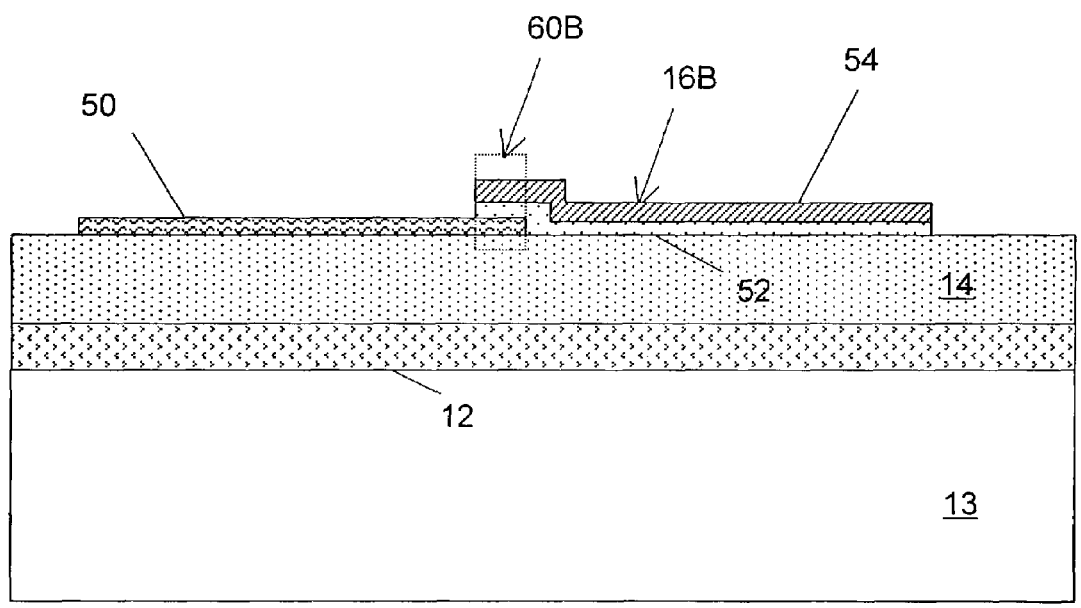
FIGS. 1B and 1C are diagrammatic illustrations, in cross-section, showing details of electron tunneling devices suitable for use in the interconnected electron tunneling device of the present invention.
Figure 1C:
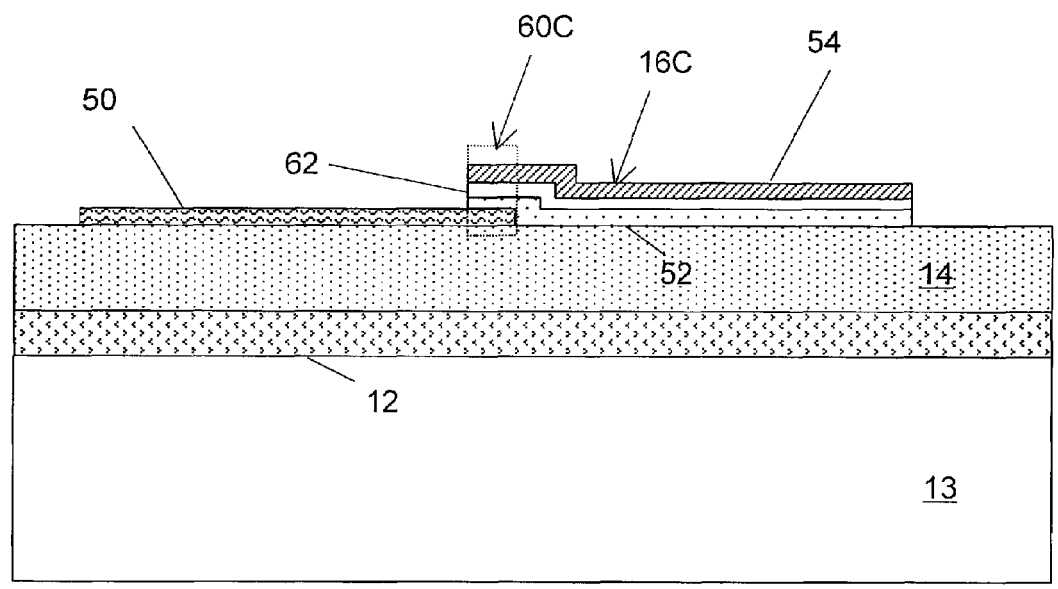

Referring now to FIGS. 1B and 1C, possible configurations for the electron tunneling devices shown in FIG. 1A are described. FIG. 1B illustrates a cross-sectional view of one embodiment of an electron tunneling device suitable for use in the interconnect assembly of the present invention as shown in FIG. 1A. This electron tunneling device is similar in design to those shown in the aforementioned P1 and P2 patents. An electron tunneling device 16B includes a first non-insulating layer 50, which forms one of the antenna arms (e.g., antenna arm 20 in FIG. 1A) of the first electron tunneling device. In the embodiment shown in FIG. 1B, first non-insulating layer 50 is deposited on top of waveguide 14, which in turn has been formed on top of circuitry 12. First non-insulating layer 50 may be, for example, a metal, semi-metal, semiconductor or superconductor. A first layer 52 is deposited also on top of waveguide 14 such that first layer 52 partially overlaps first non-insulating layer 50. First layer 52 may be, for example, an amorphous or crystalline insulating material. The portion which overlaps with first non-insulating layer 50 may be, for instance, an oxide of the first non-insulating layer or a separately deposited, amorphous insulating layer. A second non-insulating layer 54 is deposited on top of first layer 52 such that a tunneling junction region 60B is formned by the overlapping portions of first non-insulating layer 50, first layer 52 and second non-insulating layer 54. Second insulating layer 54 defines the other of the antenna arms (e.g., antenna arm 21 in FIG. 1A) of first electron tunneling device 16B, and may be formned of, for example, a metal, semi-metal, semiconductor or superconductor. In a tunneling junction region (indicated by a dashed box 60B), first and second non-insulating layers are spaced apart from one another such that a voltage (not shown) may be applied thereacross. First layer 52 is further configured to cooperate with the materials forming the first and second non-insulating layers such that electrons are allowed to travel therethrough by means of tunneling depending on the voltage placed across the first and second non-insulating layers. That is, the thickness of first layer 52 as well as the material from which the first layer is formned are selected such that first electron tunneling device exhibits the desired electron tunneling characteristics. For instance, the first non-insulating layer may be 40 nm of nickel, and the second non-insulating material may also be 40 nm of nickel, both deposited by sputtering. The first layer may consist of, for example, a layer of nickel oxide, 4 nm thick, formed by thermal oxidation.

Referring now to FIG. 1C, a variation of the electron tunneling device of FIG. 1B is illustrated. An electron tunneling device 16C is based on the structures described in the co-assigned P1 patent mentioned earlier. Like electron tunneling device 16B shown in FIG. 1B, electron tunneling device 16C includes first and second non-insulating layers 50 and 54, respectively, with a first layer 52 disposed therebetween. Additionally, a tunneling region 60C of electron tunneling device 16C includes a second layer 62. As described in detail in the P1 patent, the addition of second layer 62 serves to increase the nonlinearity in the current-voltage characteristics of the electron tunneling device. Moreover, the inclusion of the second layer allows the possibility of resonant tunneling as the electron transport mechanism through the electron tunneling device. Second layer 62 may be, for example, an amorphous or crystalline insulating layer. For instance, the first non-insulating layer may be 40 mn of niobium, and the second non-insulating material may be 40 nm of tantalum, both deposited by sputtering. The first layer may consist of amorphous niobium oxide, 1.5 nm thick, on top of which is deposited amorphous tantalum oxide, also 1.5 nm thick, both deposited by atomic layer deposition.

It should be noted that, the modifications shown in FIGS. 1B and 1C may be applied to one or both of first and second electron tunneling devices 16 and 18 of FIG. 1A. Additional modifications, such as the addition of three or more adjacent insulating layers or a combination of metal and insulating layers between the first and second non-insulating layers as shown in FIGS. 1B and 1C, are also contemplated and discussed in the aforementioned co-assigned U.S. patent applications.

Figure 1D:
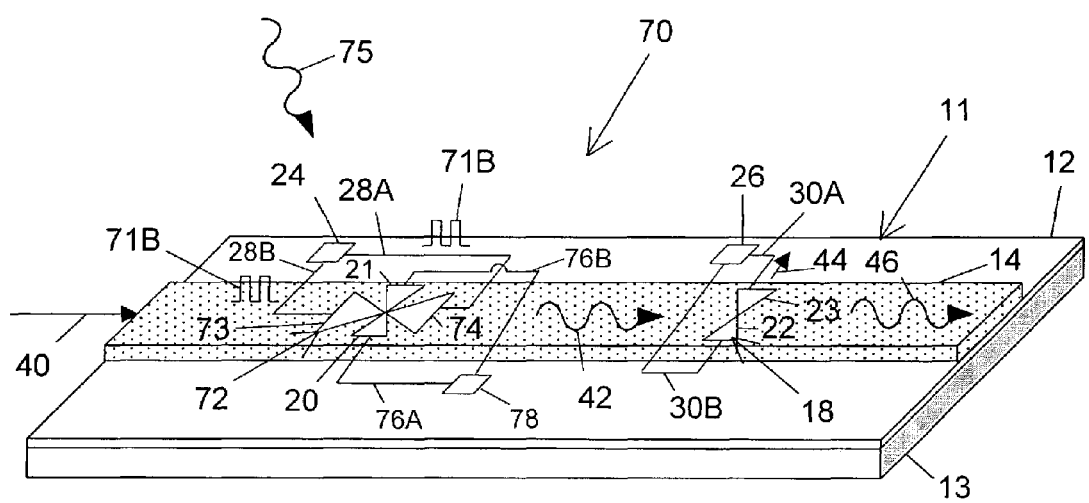
FIG. 1D is a diagrammatic illustration, in perspective view, of an alternative embodiment of an interconnected electron tunneling device of the present invention, shown here to illustrate the use of a double antenna electron tunneling device.
Figure 1E:
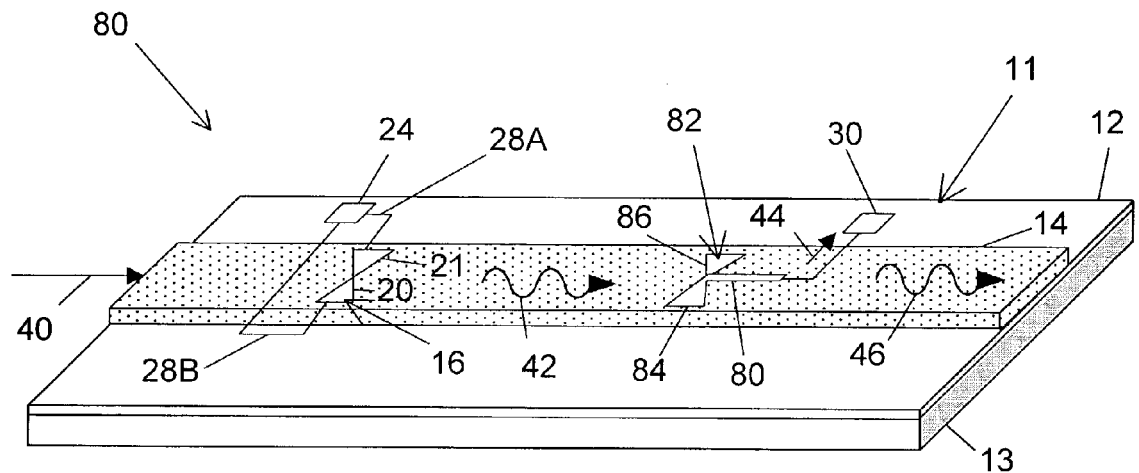
FIGS. 1E and 1F are diagrammatic illustrations, in perspective view, of additional embodiments of an interconnected electron tunneling device of the present invention, shown here to illustrate the use of surface plasmon devices.
Figure 1F:
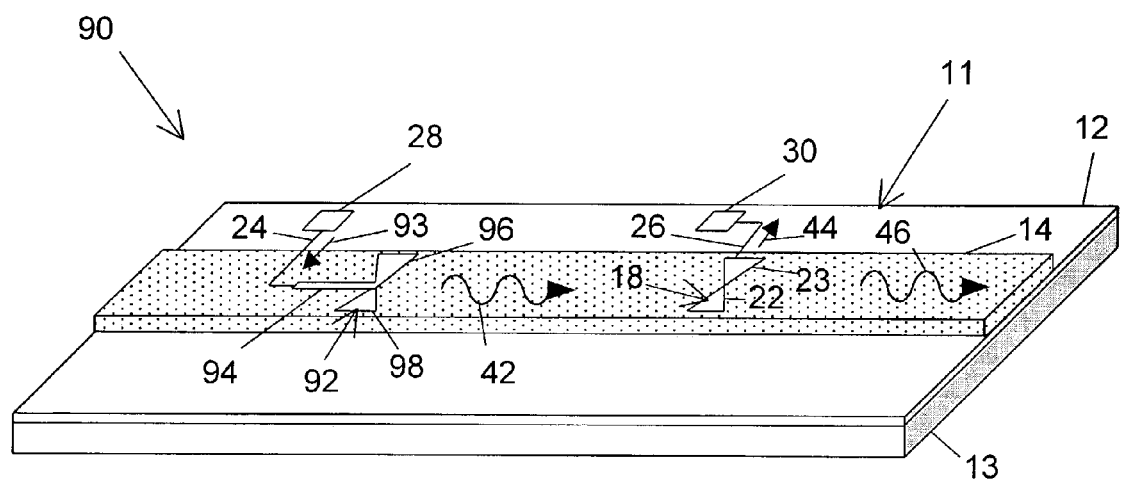

Additional variations on the interconnect assembly of the present invention are shown in FIGS. 1D–1F. FIG. 1D is similar to the interconnect assembly shown in FIG. 1A, but first electron tunneling device 16 has been replaced with an electron tunneling modulator 72. Electron tunneling modulator 72 includes first and second pairs of antenna arms. First pair of antenna arms 20 and 21 is essentially the same as that shown in, for example, FIG. 1A, and is designed to receive input light 40 and modulate it so as to produce modulated light 42. As discussed in reference to FIGS. 1B and 1C, antenna arms 20 and 21 may be configured to overlap such that a tunneling junction region (not shown) is formed. Electrical signals 71A and/or 71B may be provided via wires 28A and 28B, respectively, as a modulation signal so as to vary the electron transport characteristics of the tunneling junction region, thus yielding the modulated light in accordance with the modulation signal. Electron tunneling device 72 further includes a second pair of antenna arms 73 and 74, which may be configured to receive an optical modulation input 75. Optical modulation input 75 acts as an optical modulation signal to vary the electron transport characteristics of the tunneling junction region, thus, again, such that electron tunneling device 72 yields modulated light 42 in accordance with the optical modulation signal. Details of such a crossed-bowtie antenna modulator are disclosed in the aforementioned P2 patent. Additionally, second pair of antenna arms 73 and 74 may be connected with an integrated electronic component 78 in circuitry 12 via wires 76A and 76B.

FIG. 1E shows yet another alternative embodiment of an interconnect assembly 80, this time using a surface plasmon device of the P3 application as a detector device, in place of second electron tunneling device 18 in interconnect assembly 10 of FIG. 1A. A surface plasmon device 82 includes a pair of antenna arms 84 and 86, which are configured to receive modulated light 42 from first electron tunneling device 16. Antenna arms 84 and 86 direct the modulated light so received into a surface plasmon waveguide region 88 as surface plasmon waves. Surface plasmon waveguide region 88 then provides electrical signal 44 in accordance with the received modulated light.

As yet another alternative, an interconnect assembly 90, as shown in FIG. 1F, may include a surface plasmon device 92 acting as an emitter, such as described in the P3 application. For instance, in interconnect assembly 90 as shown in FIG. 1F, surface plasmon device 92 receives an electrical signal 93 from integrated electrical component 28, which is a part of the chip circuitry. The received electrical signal generates surface plasmon waves (not shown) in a surface plasmon waveguide region 94. A pair of antenna arms 96 and 98 of surface plasmon device 92 acts as an emitter antenna to emit the generated surface plasmon waves as an output light 46.

FIGS. 1A–1F illustrate interconnect assemblies in which light coupling from the waveguide into and out of electron tunneling devices and surface plasmon devices is performed using antennae. It should be noted that other light coupling schemes are also possible. For example, as disclosed in the P3 application, surface plasmon evanescent couplers and grating couplers may also be used in the interconnect assembly of the present invention.

Figure 2A:
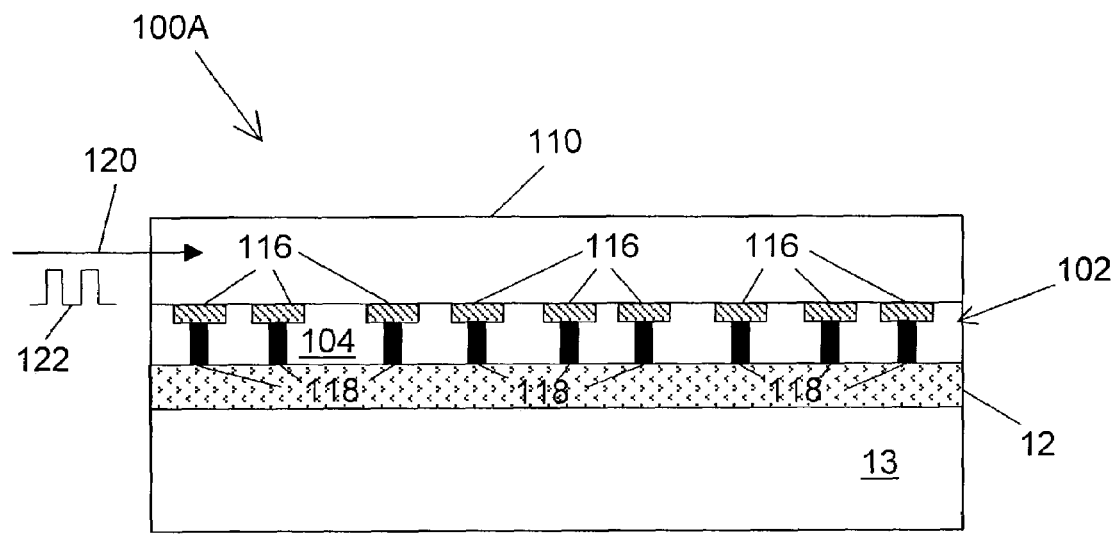
FIGS. 2A and 2B are diagrammatic illustrations, in cross-section, of embodiments of an edge-fed, optical clock distribution scheme of the present invention.
Figure 2B:
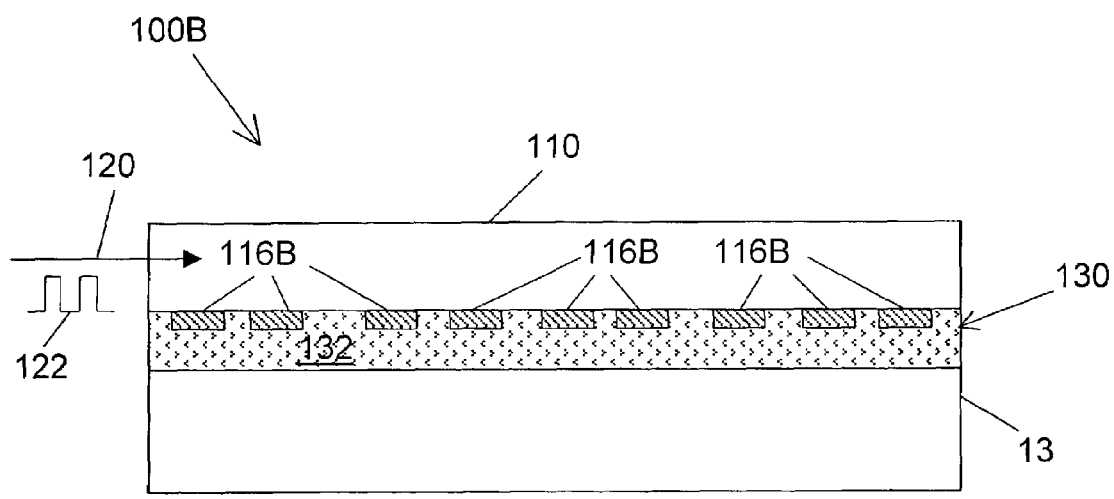

An application of the interconnect assembly of the present invention is shown in FIGS. 2A and 2B. FIG. 2A illustrates a cross-sectional view of an integrated circuit chip 100A including an optical clock distribution configuration. Integrated circuit chip 100A includes circuitry 12 disposed on substrate 13 as discussed earlier. Integrated circuit chip 100A also includes a tunneling device layer 102 based on an insulator 104 with a waveguide layer 110 disposed thereon. Tunneling device layer 102 includes two or more electron tunneling devices 116, which are connected to circuitry 12 through, for example, vias 118. Each one of the electron tunneling devices may be configured as a detector as described, for example, in the P1 and P2 patents and P3 application. In the integrated circuit chip shown in FIG. 2A, an optical signal 120, carrying a clock signal shown as a waveform 122, is edge-coupled into waveguide layer 110. Optical signal 120 may have a sufficiently long wavelength (e.g., 1550 nm) such that the optical signal is not absorbed by, for example, a silicon substrate or silicon components in the circuitry but only by the electron tunneling devices. As optical signal 120 is guided through waveguide layer 110, each one of electron tunneling devices 116 detects a portion of the optical signal, converts the optical signal into an electrical signal (not shown) and communicates the electrical signal to circuitry 12. In this way, the clock signal encoded onto optical signal 120 is very quickly distributed across the entire chip with minimal clock phase skew.

A variation of the optical distribution configuration of FIG. 2A is illustrated in FIG. 2B, showing a cross-sectional view of an integrated circuit chip 100B. Like integrated circuit chip 100A of FIG. 2A, integrated circuit chip 100B includes substrate 13 and waveguide 110, but the electronic circuitry and electron tunneling device layers have been combined. A combination layer 130 includes circuitry 132 with electron tunneling devices 116 monolithically integrated thereon such that electron tunneling devices 116B are disposed alongside electrical components (not individually shown) in the circuitry layer. Electron tunneling devices 116B may be formed during the same fabrication steps as those used to form circuitry 132 or may be formed separately following the fabrication of circuitry 132.

The optical clock distribution configurations shown in FIGS. 2A and 2B present an improvement over the conventional, electrical clock distribution schemes, in which clock signals are provided as electrical signal through electrical lines that take up chip real estate, produce significant clock skew and produce electromagnetic pickup. The optical clock distribution configurations of FIGS. 2A and 2B avoid these problems inherent to electrical clock signals by taking advantage of the fact that the interconnect assembly of the present invention, including the electron tunneling devices and waveguide, may be added on top of an existing integrated circuitry chip. It is often a difficult task in chip layout design to ensure that the clock signal reaches all parts of the chip simultaneously without degradation and while maintaining a constant phase across the chip. Since optical signals in waveguides travel much more quickly and more directly than electrical signals in electrical lines, an optical clock signal may be distributed over the chip much more quickly than an electrical clock signal. The optical clock signal broadcast into the waveguide layer may be picked up by the electron tunneling devices through, for instance, vias where needed.

Figure 3A:
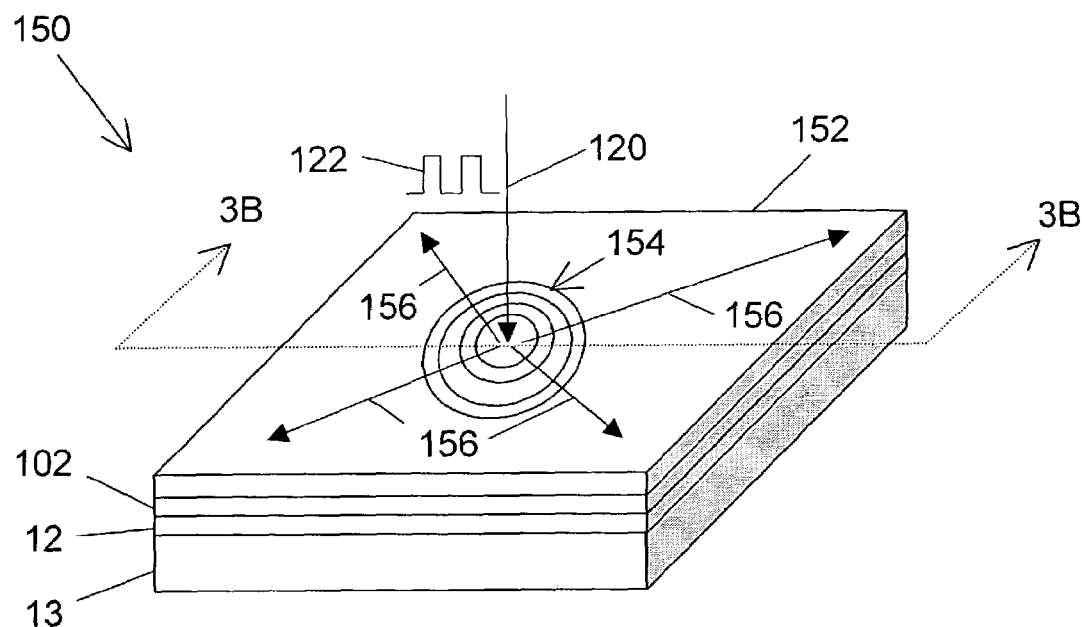
FIGS. 3A and 3B are diagrammatic illustrations of a top-fed, optical clock distribution scheme of the present invention.
Figure 3B:
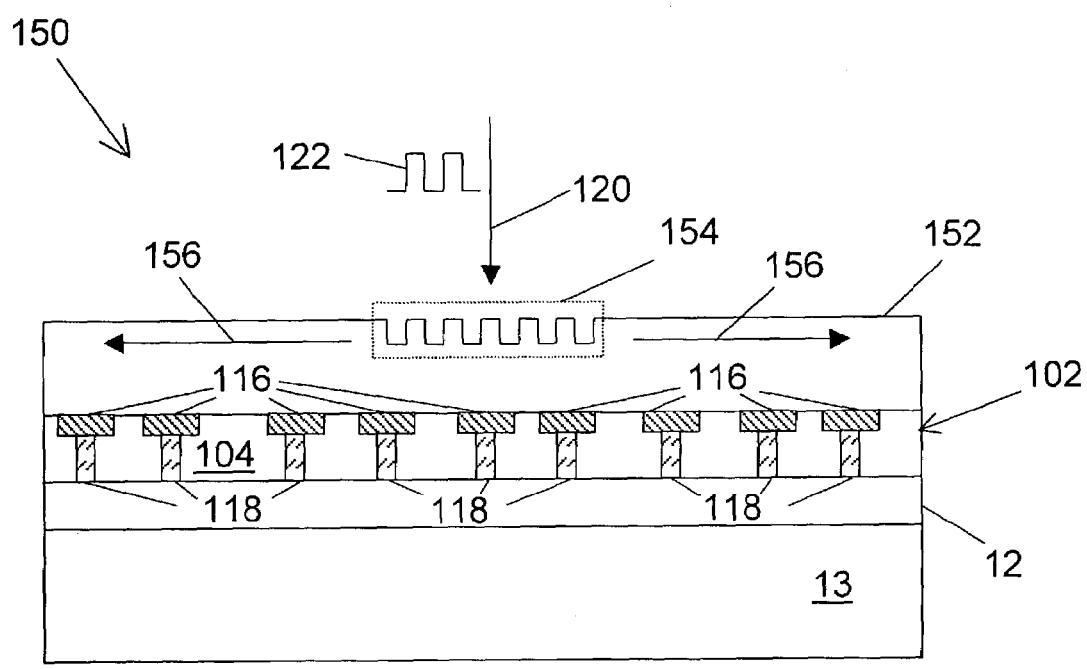

Various modifications to the optical clock distribution configuration of FIGS. 2A and 2B are contemplated. One such example is shown in FIGS. 3A and 3B. Like previously discussed embodiments of the present invention, an integrated circuit chip 150 shown in FIG. 3A includes circuitry 12 on top of a substrate 13. Like integrated circuit chip 100A of FIG. 2A, integrated circuit chip 150 also includes tunneling device layer 102. Integrated circuit chip 150 further includes a modified waveguide layer 152, which is designed to receive optical signal 120 carrying a clock signal 122 when the optical signal is incident normally on modified waveguide layer 152. A grating coupler 154, which is integrated into modified waveguide layer 152, couples optical signal 120 into modified waveguide layer 152 such that optical signal 120 is radially broadcast throughout modified waveguide layer 152 as an optical clock signal (represented by arrows 156).

Details of modified waveguide layer 152 as well as tunneling device layer 102 are more readily apparent in FIG. 3B, which illustrates integrated circuit chip 150 in cross section. As shown in FIG. 3B, modified waveguide layer 152 includes grating coupler 154, which is designed to receive optical signal 120 and to direct the optical signal so received throughout modified waveguide layer 152 as optical clock signal 156. Optical clock signal 156 is picked up by electron tunneling devices 116 at desired points across the integrated circuit chip. Electron tunneling devices 116 then communicate the optical clock signal to electrical components in the circuitry wherever needed.

As in the case of integrated circuit chip 100A of FIG. 2A, the optical clock distribution scheme used in integrated circuit chip 150 is advantageous because the optical clock signal is distributed over the entire chip within picoseconds without being hampered by electrical delays. As a result, the clock signal received at the chip circuitry does not experience significant delay that may cause phase differences in different part of the chip. Also, since the optical clock signal is transmitted optically and is converted to an electrical signal by an electron tunneling device only where needed, electromagnetic pickup is reduced in comparison to conventional, electrical clock distribution through electrical transmission lines.

Various modifications to the optical clock distribution schemes shown in FIGS. 2A–2B and 3A–3B are possible. For example, the optical clock signal may be broadcast over the integrated circuit chip through free-space and subsequently picked up by the electron tunneling devices at various locations on the integrated circuit chip. Such a free-space transmission scheme may include, for instance, additional optical components such as lenses, holographic optical elements and filters. Other modifications may be apparent to those skilled in the art while remaining within the spirit of the present invention.

Figure 4A:
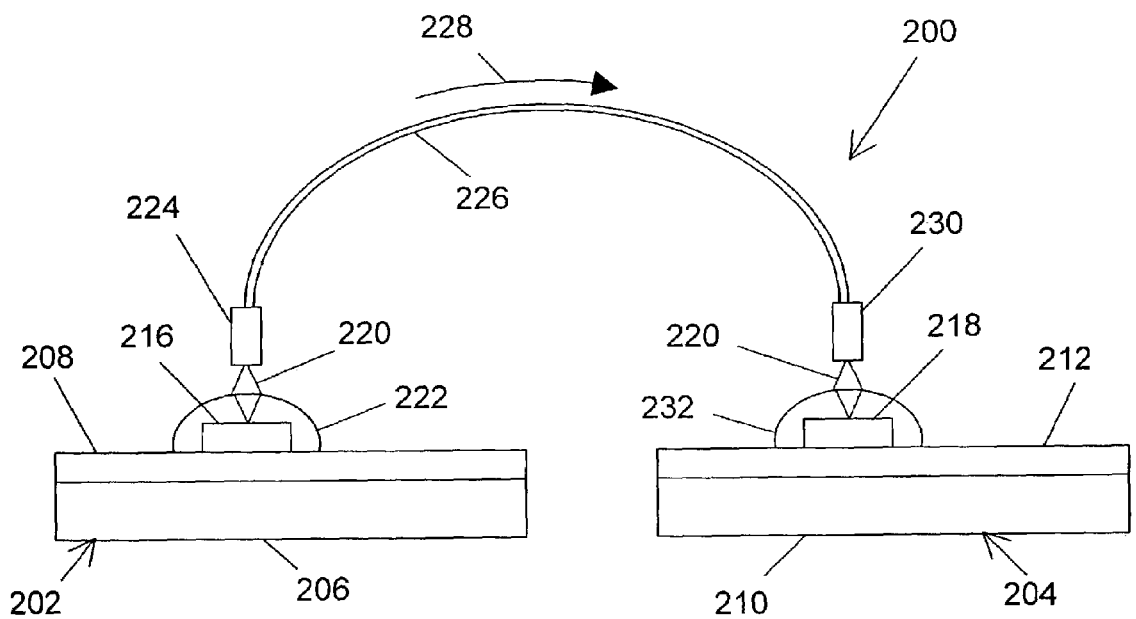
FIGS. 4A–4D are diagrammatic illustrations of another interconnected electron tunneling device of the present invention, shown here to illustrate embodiments including optical fiber as the interconnection between devices on separate chips.
Figure 4B:
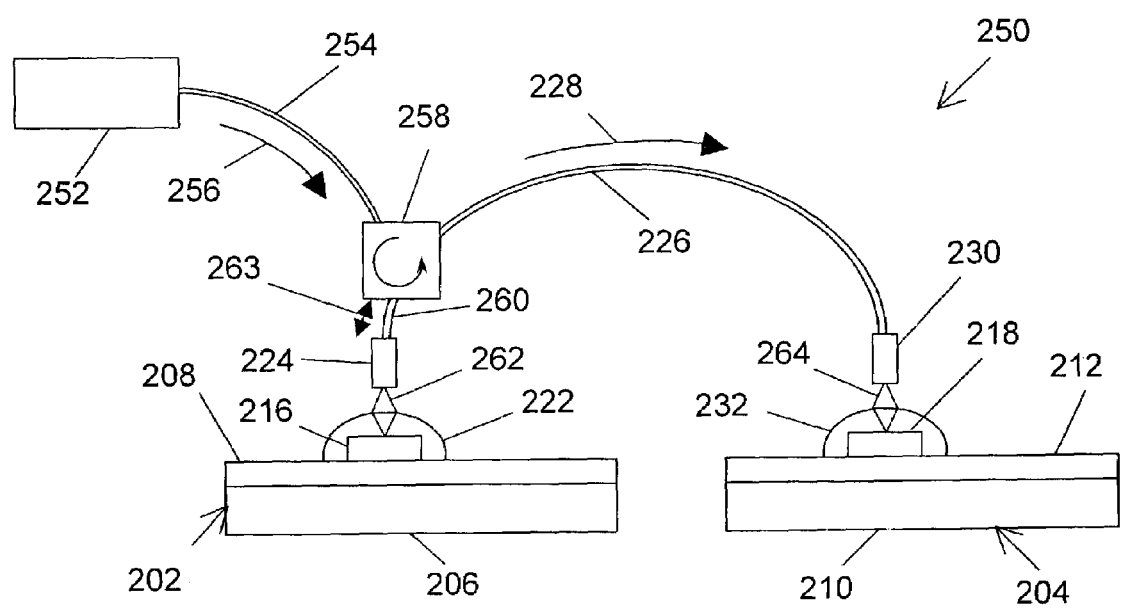

Turning now to FIGS. 4A and 4B, still other alternative embodiments of an interconnect assembly of the present invention using optical fibers are illustrated. FIG. 4A shows an interconnect assembly 200. Interconnect assembly 200 includes first and second chips 202 and 204, respectively. First chip 202 includes a substrate 206, on which circuitry 208 is formned. Similarly, second chip 204 includes a substrate 210 with circuitry 212 formed thereon. The first and second chips further include a first electron tunneling device 216 and a second electron tunneling device 218, respectively, formed thereon. In the embodiment as shown in FIG. 4A, first electron tunneling device 216 is configured to act as an emitter, such as those disclosed in the patent applications referenced above. First electron tunneling device 216 emits a light beam 220, which is focused by a first lens arrangement 222 onto an optical fiber input 224. Light beam 220 is then transmitted through an optical fiber 226 in the direction indicated by an arrow 228 toward an optical fiber output 230. At optical fiber output 230, light beam 220 is then focused by a second lens arrangement 232 onto second electron tunneling device 218. For instance, second electron tunneling device 218 may be an electron tunneling device, as disclosed in the P1 and P2 patents and P3, P3-cip and P1-cip applications, which is configured to act as a detector so as to receive light beam 220. Alternatively, a conventional detector, such as a silicon-based detector, may be used as second electron tunneling device 218. In this way, an optical interconnection is established between devices on first and second chips 202 and 204, thereby allowing transfer of data therebetween. Such an optical interconnection is advantageous over, for example, electrical interconnections in terms of speed, signal loss, propagation distance and drive power.

FIG. 4B shows an alternative embodiment of an interconnect assembly using optical fiber. An interconnect assembly 250 is similar to interconnect assembly 200 of FIG. 4A with a number of key differences. Interconnect assembly 250 includes a laser 252 configured to direct an input laser light (not shown) through an input optical fiber 254 in the direction indicated by an arrow 256. Input optical fiber 254 directs the input laser light into an optical circulator 258, which then directs the input laser light through a fiber segment 260 toward first electron tunneling device 216. In the embodiment shown in FIG. 4B, first electron tunneling device 216 is configured to act as a reflective modulator, which receives and modulates the input laser light. As a result, a light beam 262 as shown in FIG. 4B includes both the input laser light and a modulated light (not shown) as reflected from first electron tunneling device 216 such that fiber segment 260 contains light traveling into and out of circulator 258, as indicated by a double-headed arrow 263. Circulator 258 is configured such that any light entering the circulator from input optical fiber 254 is directed into fiber segment 260 while light entering the circulator from fiber segment 260 is directed toward optical fiber 226 in direction 228. In this way, modulated light from first electron tunneling device 216 is directed through optical fiber 226 and detected at second electron tunnelinig device 218. It is noted that multi-mode optical circulators are not commercially available at the current state of technology. Therefore, input optical fiber 254 and fiber segment 260 shown in FIG. 4B would be required to be single mode fibers if single mode circulators are used. However, it is anticipated that future development of a multi-mode optical circulator would enable the interconnect scheme of FIG. 4B to be compatible with multi-mode optical signal transmission, therefore the use of single mode optical fiber as well as the use of multi-mode optical fiber in the configuration shown in FIG. 4B are considered to be within the spirit of the present invention. Alternatively, the optical circulator may be replaced by an optical coupler, albeit with loss of optical power into fiber 226.

Still referring to FIG. 4B, first electron tunneling device 216 may be configured to receive a modulation signal from on-chip circuitry 208. Consequently, data from circuitry 208 may be encoded onto the modulated light produced at first electron tunneling device 216 and optically transmitted at high speeds to devices on chip 204 by way of second electron tunneling device 218. Also, second electron tunneling device 218 may be configured with a second optical circulator such that light reflected by second electron tunneling device 218 may be passed down a chain or around a token ring.

Figure 4C:
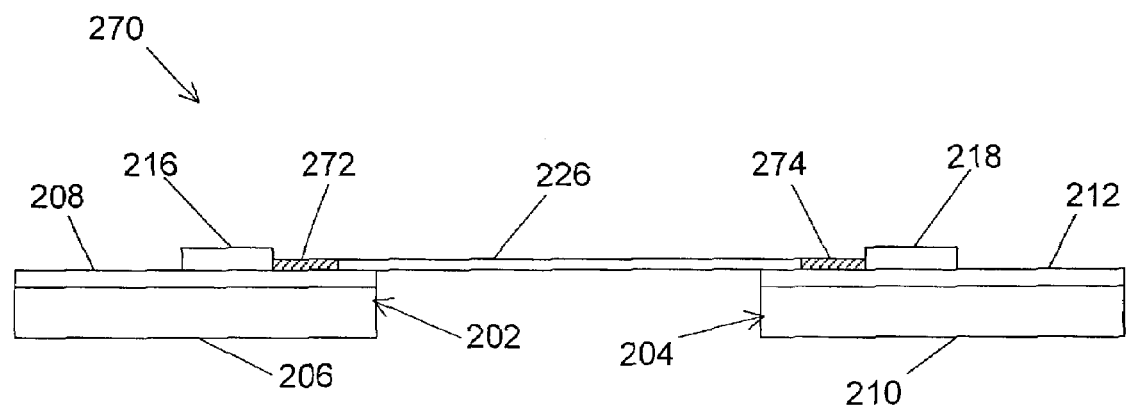
Figure 4D:
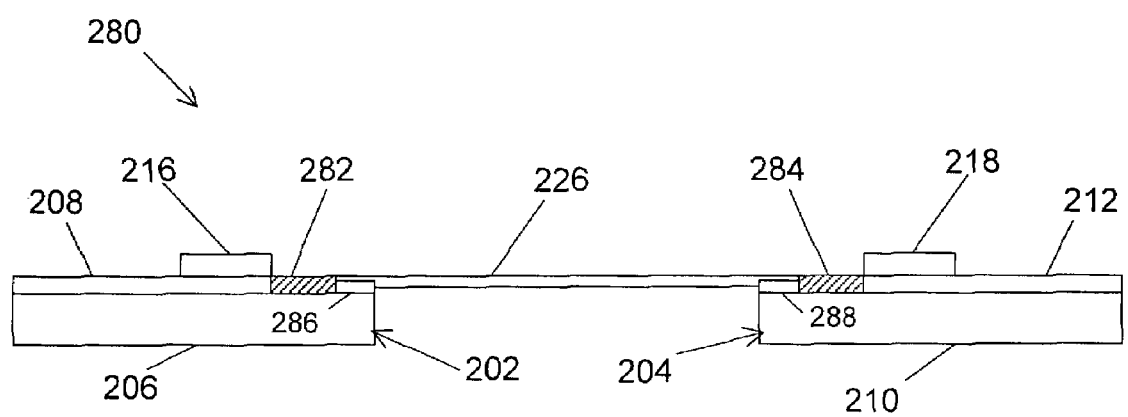

Alternative optical interconnect configurations using optical fiber are shown in FIGS. 4C and 4D. As shown in FIG. 4C, an interconnect assembly 270 includes first and second chips 202 and 204, respectively. In addition, interconnect assembly 270 includes first and second waveguides 272 and 274, which are connected with first and second electron tunneling devices 216 and 218, respectively. First and second waveguides 272 and 274 couple light into or out of the electron tunneling devices such that light from the electron tunneling devices may be fed into optical fiber 226 and vice versa. For instance, if first electron tunneling device 216 is configured as an emitter (as described, for example, in the P2 patent or the P3 application), light emitted by first electron tunneling device 216 is coupled through first waveguide 272 and into one end of optical fiber 226. The light then travels through optical fiber 226 and, at a distinct end of the optical fiber, is coupled through second waveguide 274 and into second electron tunneling device 218, which receives the transmitted light. Optical fiber 226 may be, for example, butt-coupled to first and second waveguides 272 and 274, which are disposed on top of circuitry 208 and 212, respectively, as shown in FIG. 4C. Instead, the waveguides may be embedded in the chip circuitry, as shown in FIG. 4D as first and second waveguides 282 and 284. Additionally, alignment aids, such as first and second v-grooves 286 and 288, may be included in the chips to assist in the alignment of the optical fiber with respect to the waveguides.

Figure 5:
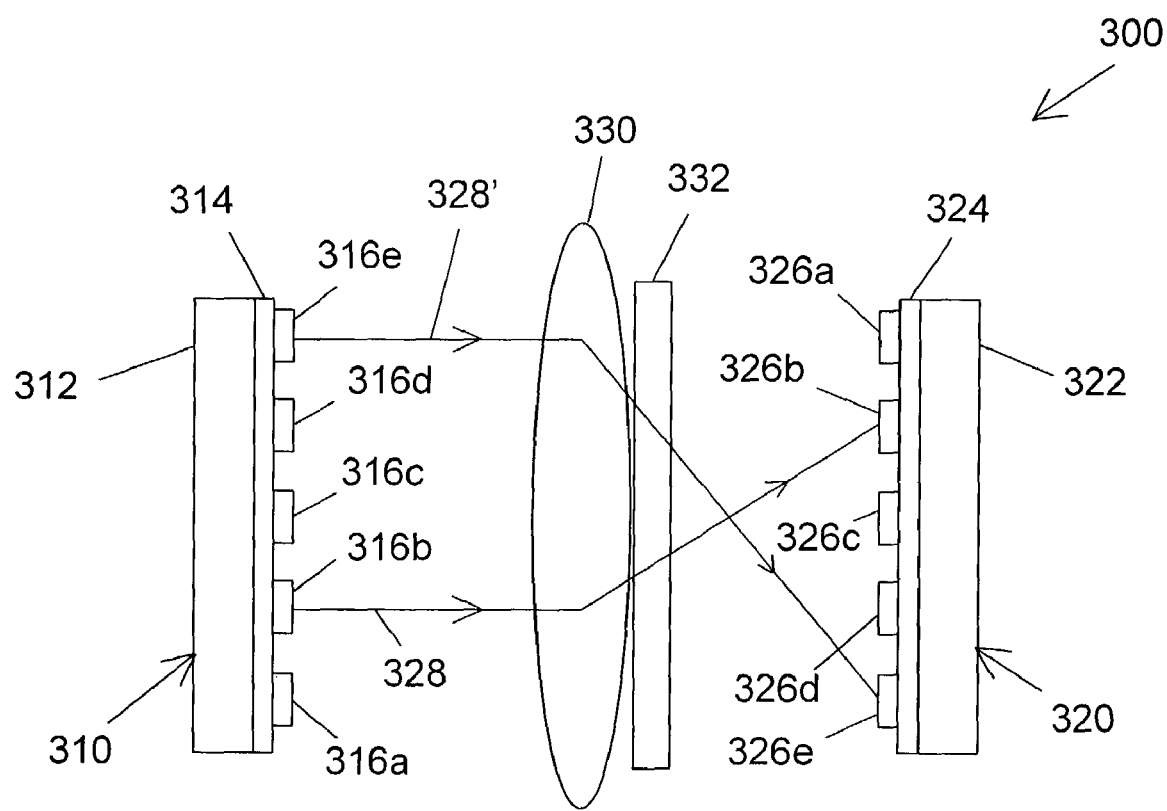
FIG. 5 is a diagrammatic illustration of still another interconnected electron tunneling device in accordance with the present invention, shown here to illustrate the use of free-space optical interconnection between electron tunneling devices on separate chips.

Yet another alternative embodiment of an interconnect assembly is shown in FIG. 5. FIG. 5 illustrates an interconnect assembly 300 in a free space optical interconnect scheme. Interconnect assembly 300 includes a first chip 310, which includes a first substrate 312 and first circuitry 314. A first plurality of electron tunneling devices 316a–316e are disposed on first circuitry 314. Interconnect assembly 300 also includes a complementary, second chip 320, which includes a second substrate 322, second circuitry 324 and a second plurality of electron tunneling devices 326a–326e formed thereon. In the embodiment shown in FIG. 5, first chip 310 and second chip 320 are positioned such that first plurality of electron tunneling devices 316a–316e on chip 310 are spaced apart from and in opposing relationship with second plurality of electron tunneling devices 326a–326e on chip 322. For instance, first plurality of electron tunneling devices 316a–e are configured to each emit a light beam of at least a given frequency, indicated by arrows 328 and second plurality of electron tunneling devices 326a–326e are configured to detect light of at least the given frequency. Interconnect assembly 300 further includes a lens arrangement 330, which is configured to direct light from each of first plurality of electron tunneling devices 316a–316e to a corresponding one of second plurality of electron tunneling devices 326a–326e. For instance, as shown in FIG. 5, lens 330 is designed such that light beam 328 emitted by electron tunneling device 316b on chip 310 is directed to electron tunneling device 326b on chip 320. Moreover, one or more additional optical components, as represented by a component 332, may also be included to perform additional optical operations. For example, component 332 may be another lens, filter, holographic optical element, reflector, grating, transmissive spatial light modulator, etc. In this way, data may be transferred optically from chip 310 to chip 320 through a free space optical interconnect scheme.

Various modifications to the free space, interconnect assembly of FIG. 5. Optical components, such as mirrors and beamsplitters, may be added to enable a non-parallel configuration of the chips. Also, lens arrangement 330 may be configured to cooperate with the electron tunneling devices on chips 310 and 320 such that operation of the interconnect assembly in the reverse direction is possible. That is, it is possible to configure the second plurality of electron tunneling devices on chip 320 to act as emitters and configure the first plurality of electron tunneling devices on chip 310 to act as detectors so as to enable the transfer of data from chip 320 to chip 310. Also, component 332 may be configured as, for instance, a waveguide including a grating or evanescent coupler such that at least portions of light beams 328 and 328' may be transferred out of interconnect assembly 300. In this case, an additional light beam (not shown) may also be inserted into the interconnect assembly at component 332 configured as a waveguide. Furthermore, the free space interconnect assembly of FIG. 5 may be combined, for instance, with the optical clock distribution schemes illustrated in FIGS. 2, 3A and 3B such that, rather than having an optical clock signal be indiscriminately broadcast over the entire chip, the optical clock signal may be selectively imaged onto specific electron tunneling devices on the chip.

As described above, the interconnect assembly of the present invention, including electron tunneling devices, is advantageous due to the high speed and integrability with silicon devices (such as chips). The interconnect assembly of the present invention allows high speed interconnection between components on a chip, between chips, between boards and racks, etc., by taking advantage of high speeds possible in the optical regime. It should be noted that an important benefit of the approach of the present invention involving the use of electron tunneling devices in optical interconnect arrangements is the fact that the present invention takes advantage of the ability of the electron tunneling devices to detect, modulate or emit light directly into or out of a waveguide or optical fiber. That is, the electron tunneling device technology developed by the assignee of the present invention allows efficient coupling and conversion between optical and electrical signals in a compact configuration which is compatible with existing integrated circuit chip technology. This feature is in contrast to conventional silicon devices with waveguides, in which light traveling through the waveguide must be redirected away from the waveguide and into the silicon in order to be detected or otherwise acted upon.

It is notable that the electron tunneling devices, for example as shown in FIGS. 1A–1F, 2A–2B and 3A–3B, may be fabricated directly adjacent to a waveguide to allow fast, guided transmission of optical signals from one electron tunneling device to another. Furthermore, the electron tunneling devices may be used to couple light energy into and out of the waveguide as well as to direct light energy to electronic devices as electrical energy. Further details of such waveguide-coupled assemblies are discussed in further detail immediately hereinafter.

Figure 6A:
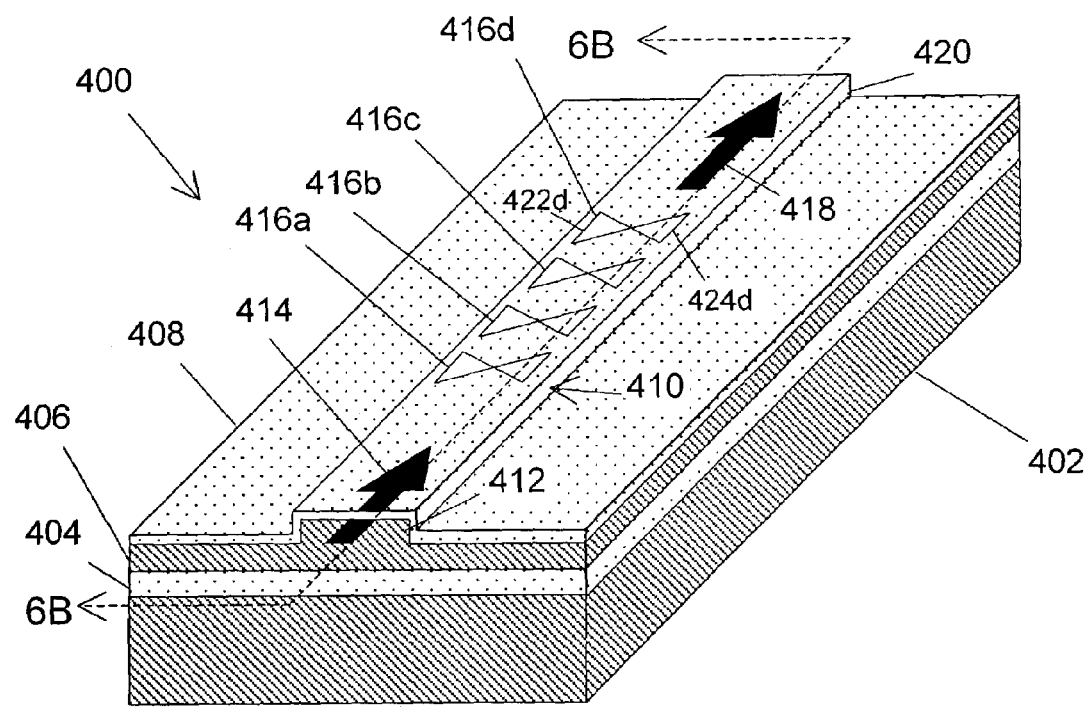
FIGS. 6A–6E are diagrammatic illustrations of a waveguide-coupled device of the present invention, shown here to illustrate various embodiments of the coupling of electron tunneling devices with a waveguide, as used in the aforementioned interconnected electron tunneling devices.
Figure 6B:
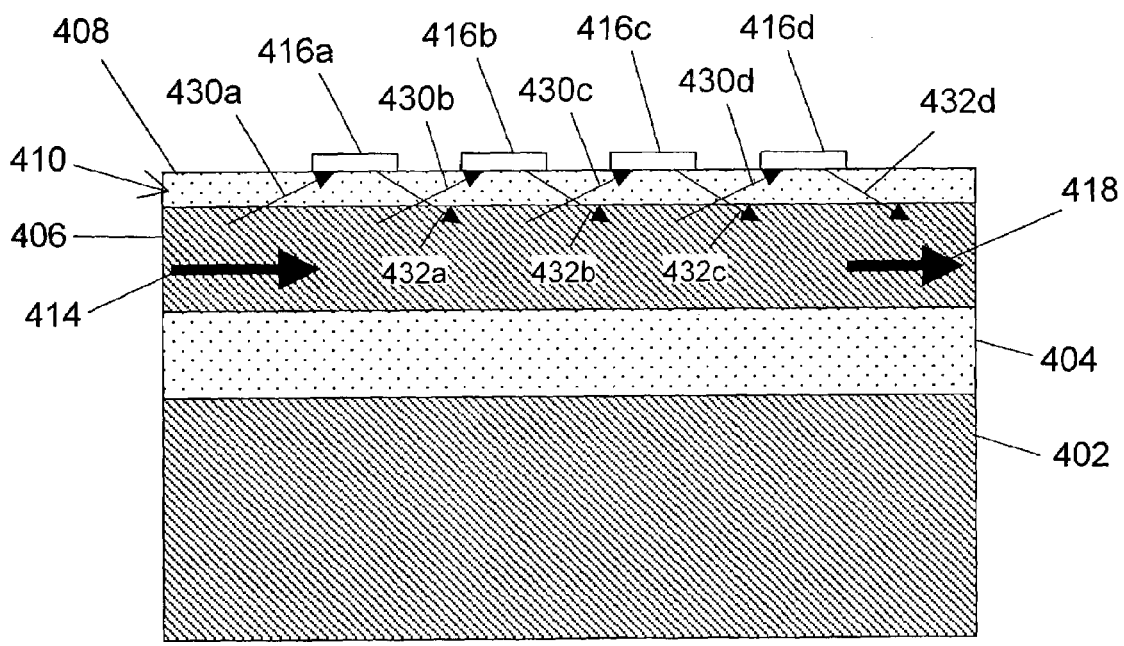

Turning now to FIGS. 6A and 6B, a waveguide-coupled assembly 400 fabricated in accordance with the present invention is illustrated. Waveguide-coupled assembly 400 includes a substrate 402, which supports a first insulating layer 404. For example, substrate 402 may be formed of silicon, while insulating layer 404 is formed of silicon dioxide. Waveguide-coupled assembly 400 further includes an optical waveguide layer 406 and a second insulating layer 408. Optical waveguide layer 406 and second insulating layer 408 cooperate to define a raised, rib waveguide section 410. Rib waveguide section 410 includes an optical input end 412, which directs input light incident thereon (indicated by an arrow 414) into the rib waveguide section. Waveguide-coupled assembly 400 further includes at least one electron tunneling device 416, which is formed on top of rib waveguide section 410. Electron tunneling device 416 is designed to receive a portion of input light 414, modulate the received portion of the input light, and produce a modulated, output light (indicated by an arrow 418), which output light 418 is directed toward an optical output end 420. For instance, bowtie antenna arms 422 and 424 of electron tunneling device 416 may be formed in a particular shape and size so as to pick up a portion of the input light of a given wavelength. Different antenna designs may also be used to optimize coupling to particular waveguide modes, such as transverse-magnetic and transverse-electric nodes. Alternatively, other coupling arrangements, such as grating couplers, may be used in place of an antenna in electron tunneling device 416. Also, a coupling arrangement and an electron tunneling component may be formned at physically separate locations while still being connected with each other such that an optical or electrical signal may be communicated therebetween. Electron tunneling device 416 may be a modulator fabricated in accordance with the disclosure in the aforementioned P1 and P2 patents and P3, P3-cip and P1-cip applications. As a possible variation, waveguide-coupled assembly 400 of FIG. 6A is shown to include a linear array of four electron tunneling devices 416 to provide additional interaction with an evanescent light field portion of the input light so as to provide output light 418 having a desired degree of modulation. More or fewer electron tunneling devices may be used in a linear or two-dimensional array such that the resulting waveguide-coupled assembly provides a particular function. That is, by using more than one electron tunneling devices in the waveguide-coupled assembly, the interaction length between the input light and the electron tunneling devices may be effectively increased. Coupling between the antenna and waveguide may also be controlled by varying the spacing or cladding thickness between antenna and waveguide core. Any combination of the aforedescribed variations is also considered to be within the scope of the present invention.

It should be noted that, although waveguide-coupled assembly 400 of FIG. 6A is shown to include a silicon-on-insulator rib waveguide, other waveguide types, such as buried waveguides, fully etched waveguides, or photonic crystal waveguides, and different waveguide materials, such as glass or polymer, may also be used. In many instances, higher index and thinner waveguides couple more efficiently to the antenna and also take up less space on chip.

An example of the interaction of the electron tunneling devices with the input light is discussed in reference to FIG. 6B, showing a cross-sectional view of waveguide-coupled assembly 400 of FIG. 6A. As shown in FIG. 6B, electron tunneling devices 416a–416d pick up evanescent field portions of input light 414 (shown as arrows 430a–430d), modulate the received portions, then re-transmit modulated light (indicated by arrows 432a–432d) back into waveguide layer 406 so as to provide modulated, output light 418. Evanescent coupling between the rib waveguide region and the electron tunneling devices is particularly efficient for thin, high index waveguides.[4]

Continuing to refer to FIGS. 6A and 6B, it is noted that further modifications to waveguide-coupled assembly 400 are possible. For example, each of electron tunneling devices 416a–416d may be configured to pick up a different wavelength of input light such that waveguide-coupled assembly 400 acts as a wavelength-dependent modulator of input light, which input light may include a variety of wavelengths. Alternatively, one or more of electron tunneling devices 416a–416d may be configured as a detector (see, for example, aforementioned P1 and P2 patents and P3 application) so as to receive a portion of the input light and generate an electrical signal in accordance with the input light so received, which electrical signal may be directed to an electronic device located off of substrate 402 or also supported on the substrate. As yet another alternative, one or more of electron tunneling devices 416a–416d may be configured as an amplifier (see, for instance, aforementioned P2 patent and P3 application) so as to receive a portion of the input light or a portion of modulated light, as produced by another of the electron tunneling devices, and produce an amplified output light. In still another alternative, one or more of the electron tunneling devices may be configured as an emitter (see, for example, aforementioned P2 patent and P3 application) so as to emit additional light into the rib waveguide region to contribute to the output light. Still further, one or more of the electron tunneling devices may be configured to re-emit the portion of input light received at that electron tunneling device, for example, in a direction away from the waveguide and the substrate so as to produce a free-space optical signal in accordance with the input light.

As yet another option, one or more of the electron tunneling devices may be configured to receive free-space illumination and re-transmit the received optical energy into the waveguide.

Figure 6C:
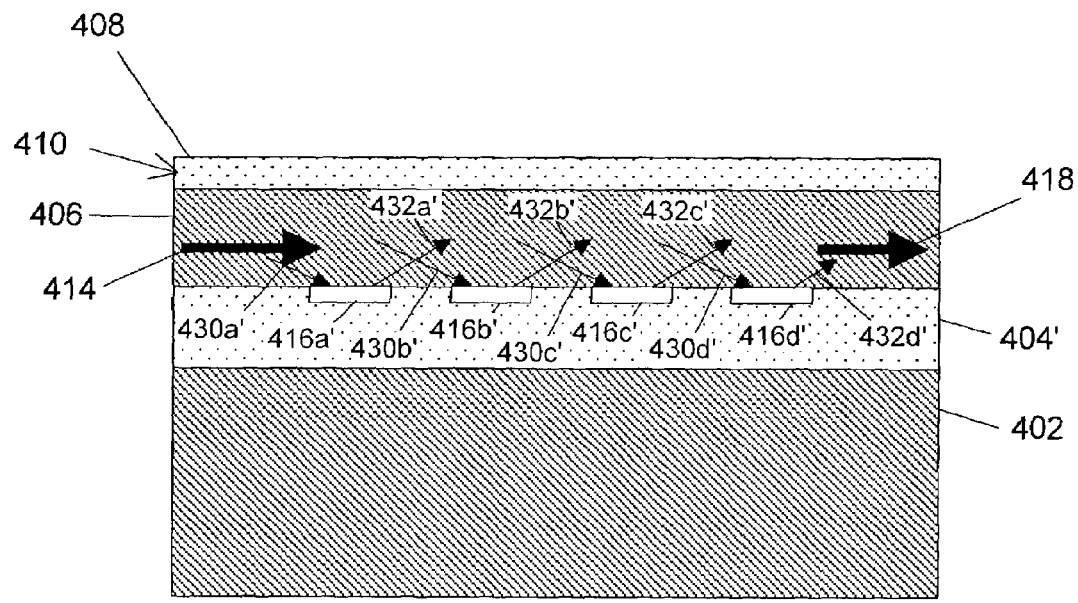
Figure 6D:
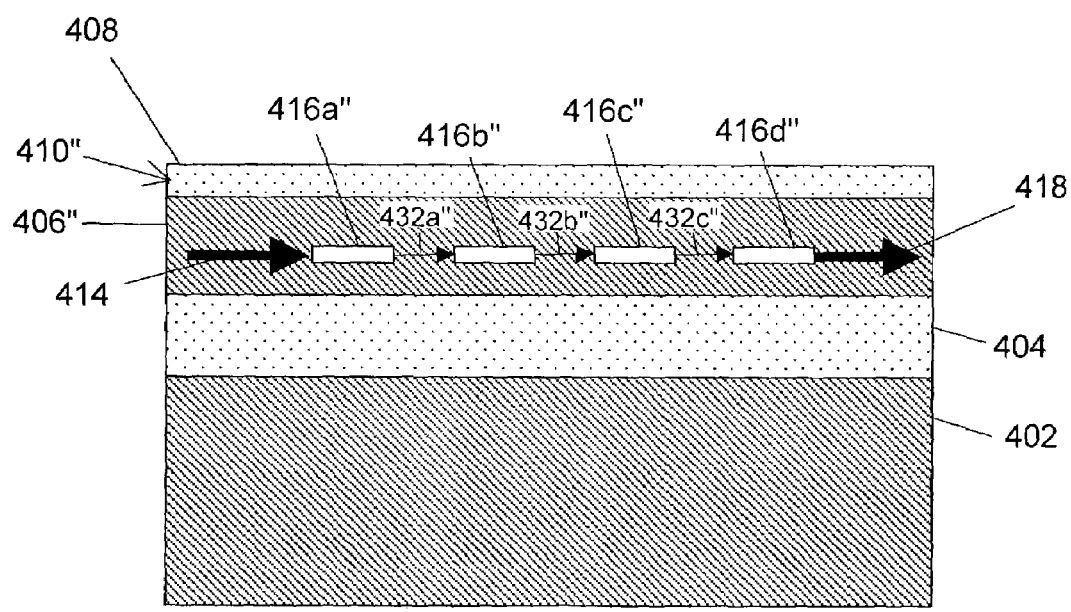

FIGS. 6C and 6D illustrate still more alternative configurations to waveguide-coupled assembly 400 shown in FIGS. 6A and 6B. For example, as shown in FIG. 6C, modified electron tunneling devices 416a'–416d' are integrated into a modified insulating layer 404', rather than being formned on top of rib waveguide section 410. As in the embodiment illustrated in FIGS. 6A and 6B, the modified electron tunneling devices also couple to evanescent field portions of input light 414 (shown as arrows 430a'–430d'), modulate the received portions, then re-transmit modulated light (indicated by arrows 432a'–432d') back into waveguide layer 406 so as to provide modulated, output light 418. In contrast, modified electron tunneling devices 416a"–416d", shown in FIG. 6D, are integrated into a modified optical waveguide layer 406". In this case, input light 414 directly couples into modified electron tunneling device 416a", which re-emits a modulated light 432a". Modulated light 432a" then couples into modified electron tunneling device 416b", and so on until the output from the last device in the series, in this case modified electron tunneling device 416d", becomes output light 418. Thus, each one of the configurations shown in FIGS. 6B–6D is advantageous in different situations, depending on the level of integration required. For example, although the electron tunneling devices are most readily fabricated on top of the rib waveguide region, it may be desirable in certain cases to have the direct coupling of the principal portion of the input light with the electron tunneling devices as allowed by the configuration shown in FIG. 6D. Alternatively, closer coupling of the evanescent field portions of input light 414 may be enabled by the positioning of the electron tunneling regions as shown in FIG. 6C without drastically altering the lightwave-guiding characteristics of the rib waveguide region.

Figure 6E:
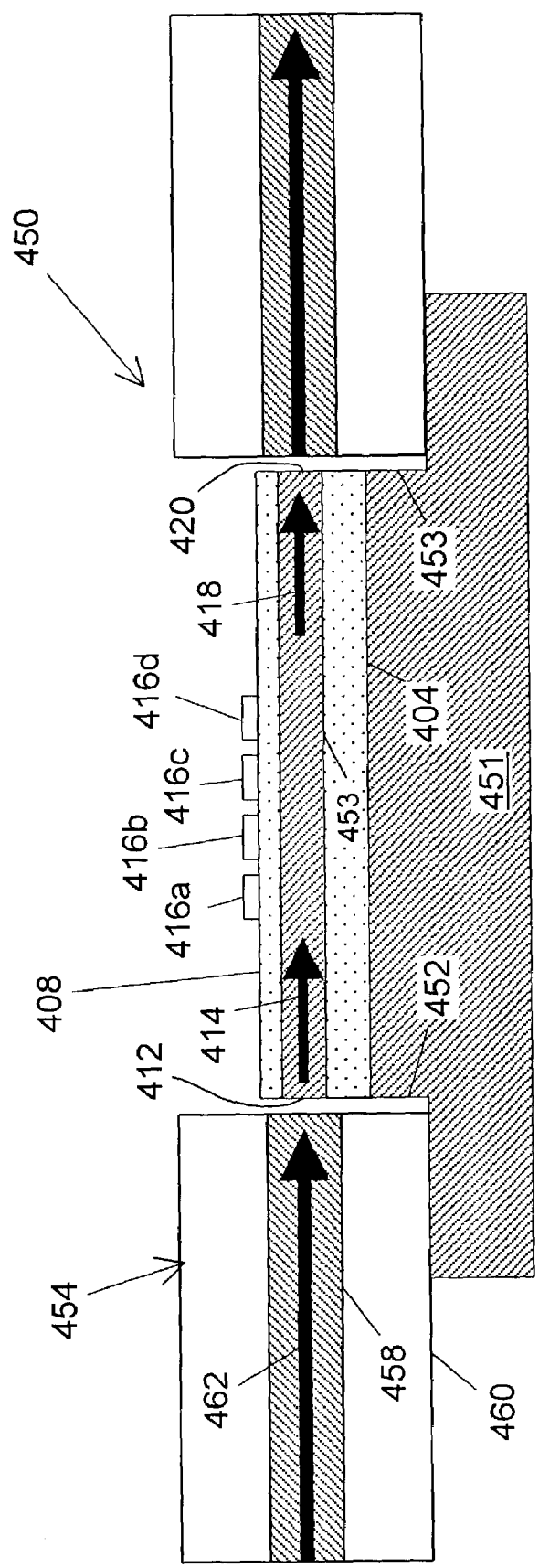

Attention is now directed to FIG. 6E, which illustrates an end-fire variation of the waveguide-coupled assembly of FIG. 6A, generally indicated by a reference number 450. To the extent that waveguide-coupled assembly 450 resembles previously described waveguide-coupled assembly 400, for example, with respect to its layered structure and the location of the electron tunneling devices, such descriptions are not repeated for purposes of brevity. A substrate 451 of waveguide-coupled assembly 450 includes first and second v-grooves 452 and 453, respectively, for accommodating an input optical fiber 454 and an output optical fiber 456, respectively. For example, input optical fiber 454 includes a fiber core 458 surrounded by a cladding 460, and is designed to direct an input optical signal 462 therethrough and into rib waveguide region 410 as input light 414. Output light 418 provided at optical output end 420 is then coupled into output optical fiber 456. As shown in FIG. 6E, output optical fiber 456 includes a fiber core 464 surrounded by a cladding 466 so as to direct at least a portion (indicated by an arrow 468) of output light 418 away from optical output end 420. The coupling of optical fiber to the rib waveguide region enables ready insertion of waveguide-coupled assembly 450 into optical fiber-based systems, such as long distance communication systems. This end-fire embodiment allows higher coupling efficiency for single-mode fibers. Furthermore, inclusion of alignment aids, such as v-grooves 452 and 453 in substrate 451 allows self-alignment of optical fiber with the waveguide-coupled assembly of the present invention.

Figure 7A:
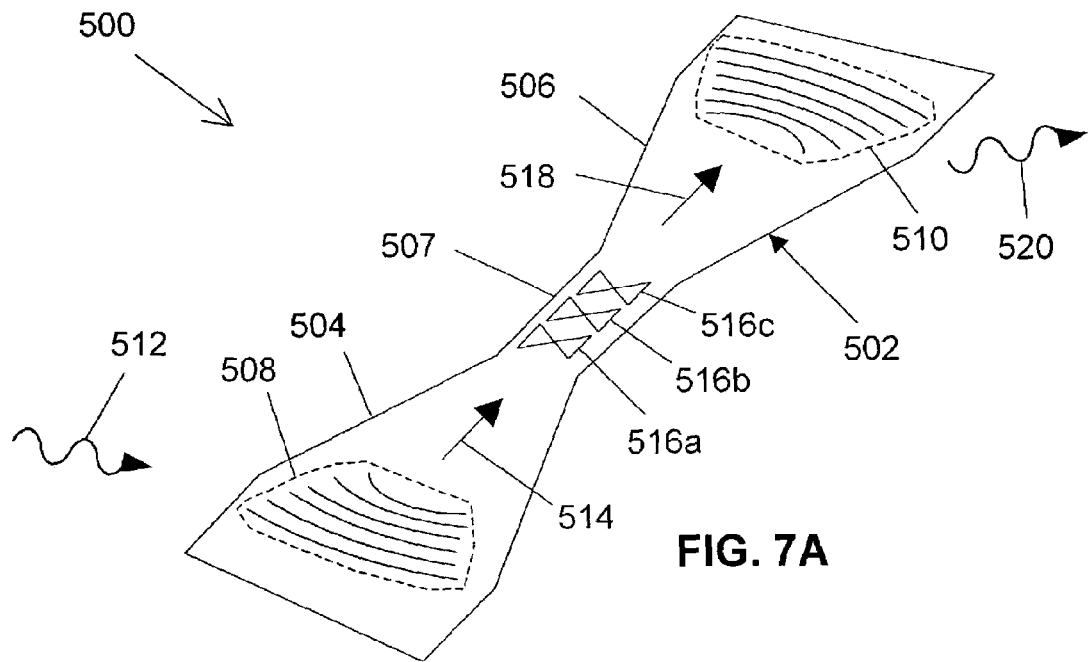
FIGS. 7A–7D are diagrammatic illustrations of an alternative waveguide-coupled device of the present invention and applications.

Referring now to FIGS. 7A–7D, still further variations of the waveguide-coupled assembly of the present invention are discussed. FIG. 7A shows a waveguide-coupled assembly 500, which includes a shaped waveguide 502. Shaped waveguide 502 includes first and second tapered sections 504 and 506, respectively, on either side of a middle section 507. First and second chirped, focusing grating couplers (surrounded by dashed lines 508 and 510, respectively) are formed near opposite ends of shaped waveguide 502 such that first chirped, focusing grating coupler 508 receives an input optical signal 512 and couples the optical signal so received into shaped waveguide 502 as an input light (indicated by an arrow 514). Input light 514 is then directed through first tapered section 504 into middle section 507. One or more electron tunneling devices (three are shown, indicated by reference numerals 516a–516c) are disposed on top of middle section 507 and are configured for, for example, modulating the input light then producing a modulated, output light (indicated by an arrow 518). Modulated, output light 518 is then directed through second tapered section 506 and coupled out of shaped waveguide 502 through second chirped, focusing grating coupler 510 as an output optical signal 520.

Figure 7B:
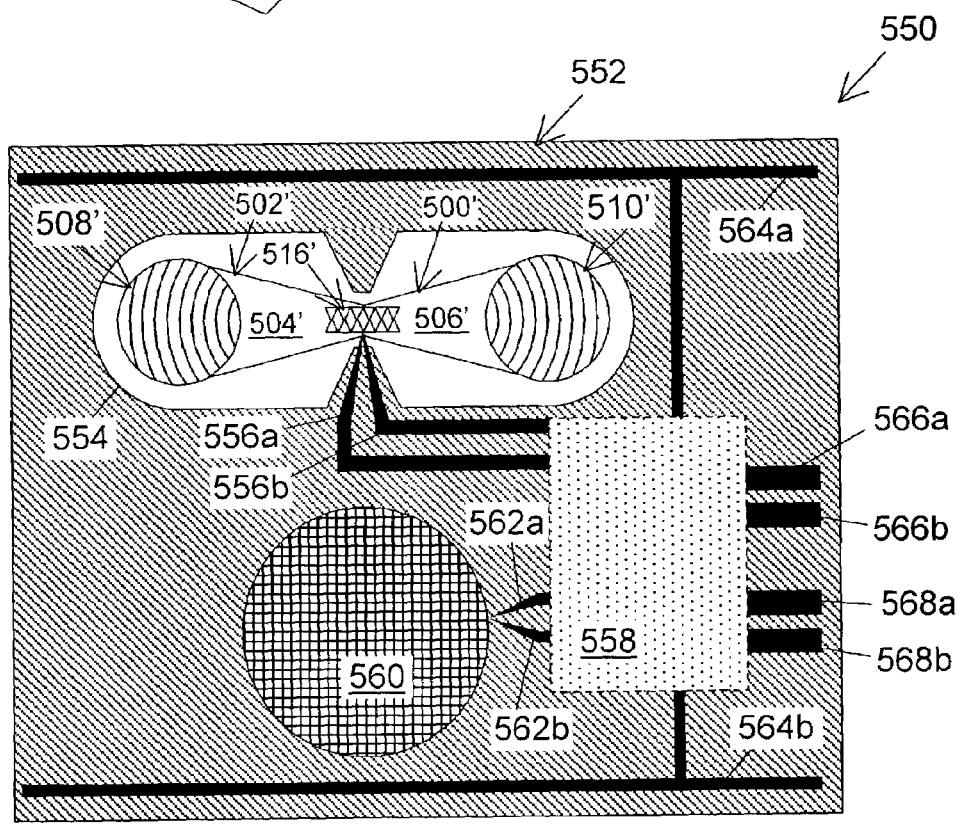

FIG. 7B is an illustration of an integrated optical transceiver chip including the waveguide-coupled assembly of FIG. 7A. The integrated optical transceiver chip, generally indicated by reference numeral 550, includes a substrate 552 on which various components are supported, as will be described in detail immediately hereinafter. Substrate 552 includes an etched-out section 554, in which a modified waveguide-coupled assembly 500', which is similar in design to waveguide-coupled assembly 500 as shown in FIG. 7A. To the extent that waveguide-coupled assembly 500' resembles previously described waveguide-coupled assembly 500, for example, with respect to its tapered waveguide structure, focused grating couplers and the location of the electron tunneling devices, such descriptions are not repeated for purposes of brevity. An array of electron tunneling devices 516' of waveguide-coupled assembly 500' are connected with modulation inputs 556a and 556b, which lead from circuitry 558 supported on substrate 552. Circuitry 558 is also connected with a detector 560, which is also supported on substrate 552, via leads 562a and 562b. Power may be supplied to circuitry 558 through DC power lines 564a and 564b.

Figure 7C:
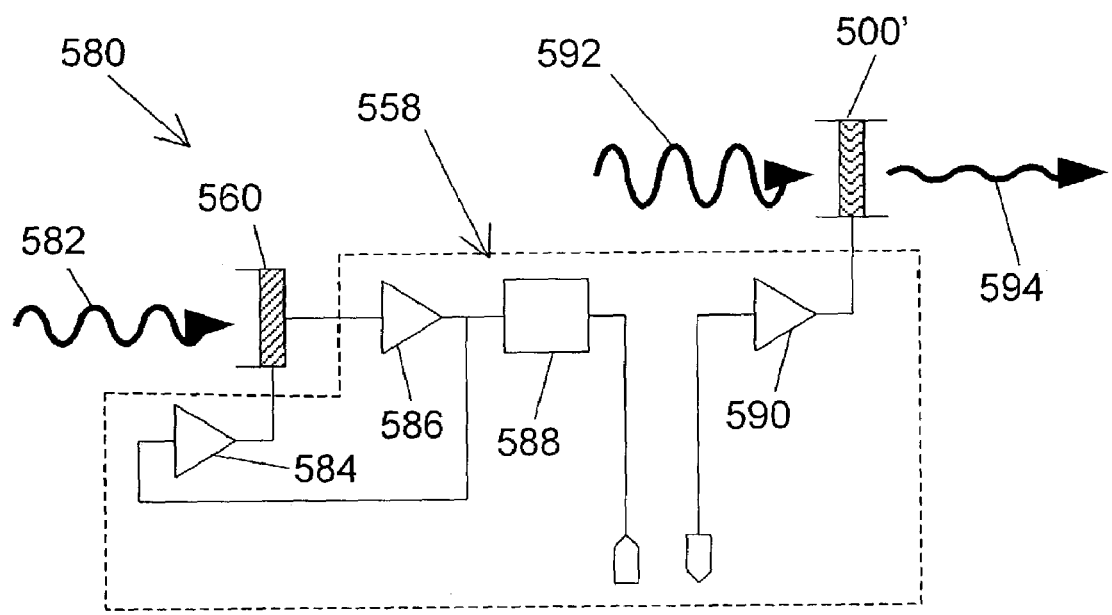

Referring now to FIG. 7B in conjunction with FIG. 7C, one example of the operation of integrated optical transceiver chip 550 is described in reference to a schematic 580 as shown in FIG. 7C. It is noted that corresponding components in the two figures are labeled with the same reference numbers for clarity. In one possible configuration, detector 560 may be designed to receive an optical signal 582, including data encoded thereon, and to provide an electrical, detector signal (not shown), also including the data, via leads 562a and 562b to circuitry 558. Circuitry 558 may include, for example, electrical components such as bias control/automatic gain control (AGC) 584, a pre-amplifier 586, a clock recovery circuit 588 as well as a modulator driver 590. Modulator driver 590 generates a modulation signal in accordance with the detector signal and directs the modulation to the array of electron tunneling devices of waveguide-coupled assembly 500'. As a result, when a continuous wave (CW) light input 592 is incident on first chirped, focusing grating coupler 508', the array of electron tunneling devices modulate the CW light input and, consequently, waveguide-coupled assembly 500' provides a modulated light output 594.

Figure 7D:
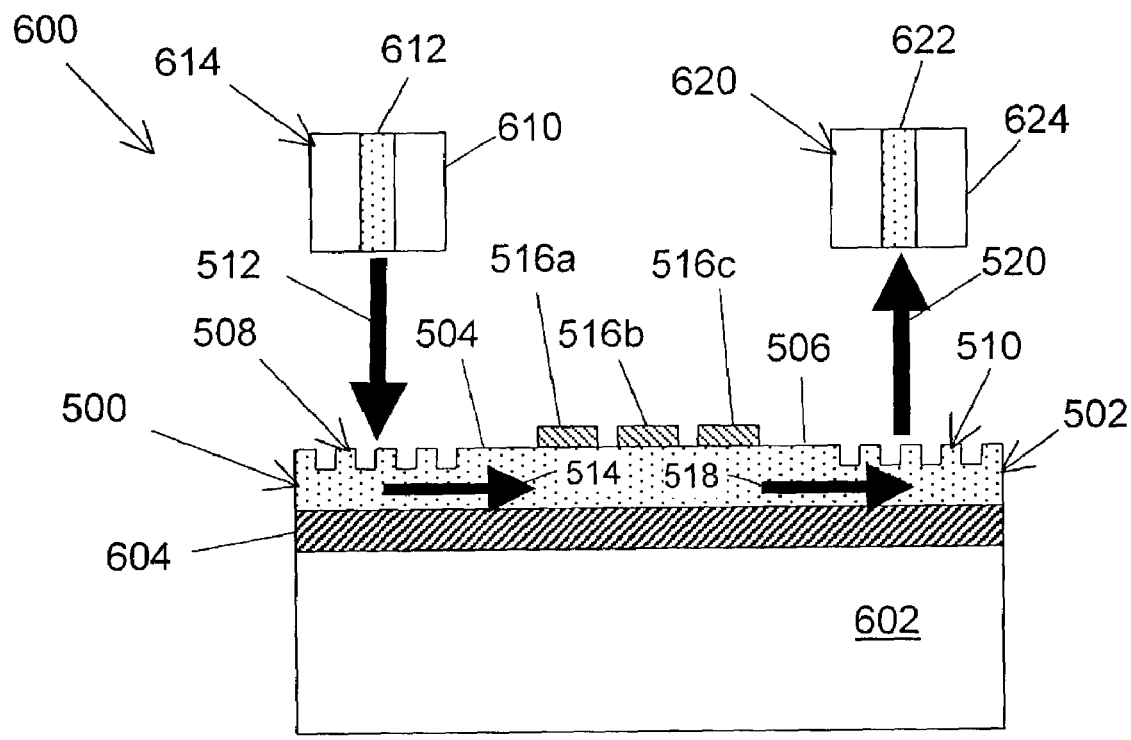

FIG. 7D illustrates a further variation on the waveguide-coupled assembly of the present invention as illustrated in FIG. 7A. FIG. 7D is a diagrammatic view, in cross section, of a modified waveguide-coupled assembly 600. Modified waveguide-coupled assembly 600 includes waveguide-coupled assembly 500, as shown in FIG. 7A, supported on a substrate 602 with an insulating layer 604 disposed therebetween. Input light 512 is provided through an input optical fiber 610, which includes a fiber core 612 surrounded by a cladding 614. As described previously in reference to FIG. 7A, waveguide-coupled assembly 500 provides a modulated, output light 520. In the case of modified waveguide-coupled assembly 600, output light 520 is received by an output optical fiber 620, which also includes a fiber core 622 surrounded by a cladding 624 for guiding the output light away from the modified waveguide-coupled assembly.

Figure 8A:
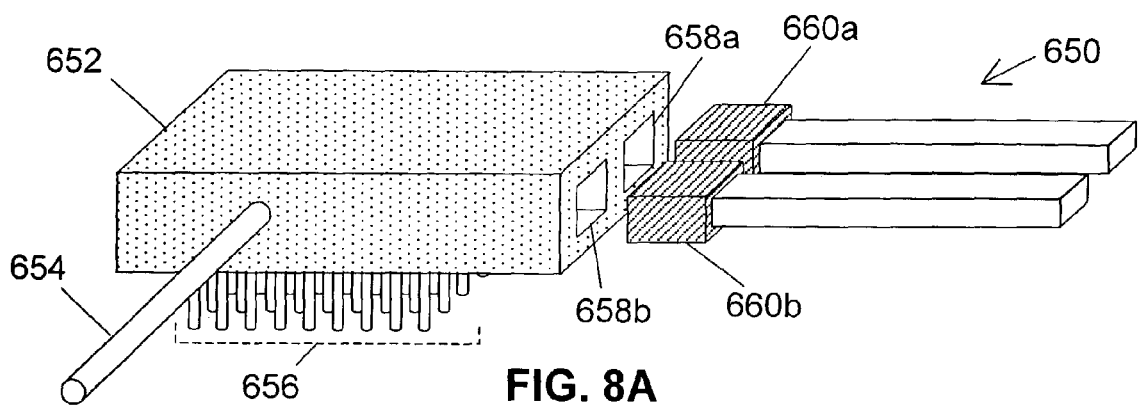
FIGS. 8A–8C are diagrammatic illustrations, in perspective view, of examples of packaging options and applications for the waveguide-coupled device of the present invention.
Figure 8B:
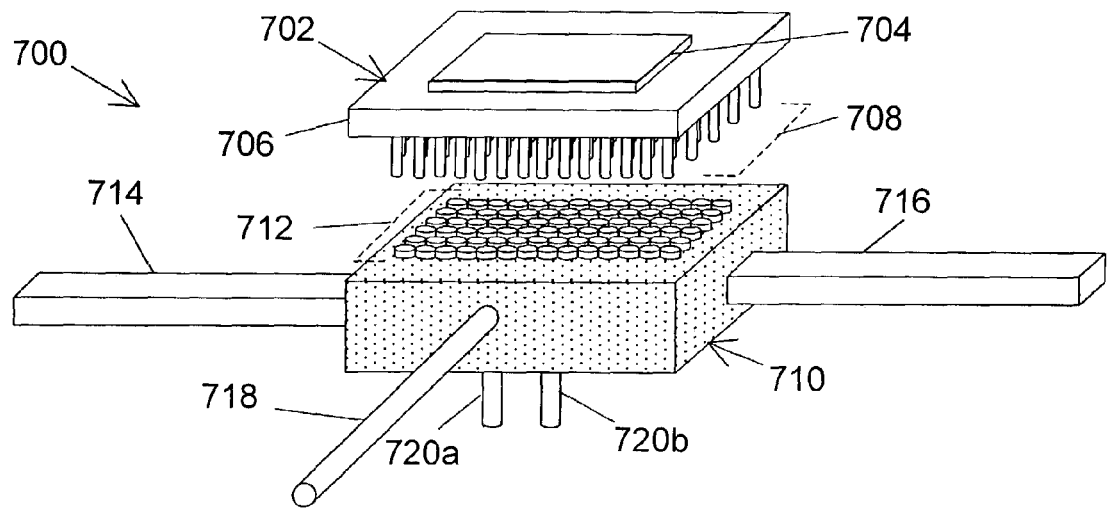
Figure 8C:
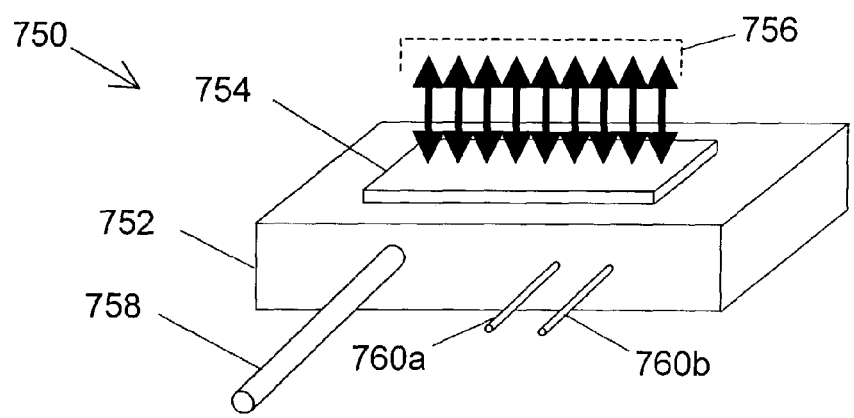

Turning now to FIGS. 8A–8C, several packaging options for integrated optical transceiver chip 550 as shown in FIG. 7B are described. FIG. 8A shows a parallel optical transceiver 650 including a transceiver module 652 containing a plurality of integrated optical transceiver chips 550 therein (not visible). A single mode fiber 654 serves as a CW input for modulation. A plurality of pin-outs (indicated by dashed bracket 656) serves to provide the various RF inputs/outputs as well as DC power input. Transceiver module 652 includes an input receptacle 658a and an output receptacle 658b, both of which are designed to accept multi-mode fiber (MMF) ribbons. For example, a first MMF ribbon 660a may provide a plurality of optical data inputs for the plurality of integrated optical transceiver chips, while a second MMF ribbon 660b may serve to extract the plurality of optical data outputs produced by the integrated optical transceiver chips.

FIG. 8B illustrates a scheme in which two or more chips may be optically interconnected. A chip-to-chip optical backplane 700 is designed to accept a lead frame-mounted chip 702. Lead frame-mounted chip 702 includes a die 704 containing circuitry and connected to a lead frame 706 including a plurality of pin-outs (indicated by a dashed bracket 708). Optical backplane 700 includes an integrated circuit socket 710 including a plurality of receptacles (indicated by a dashed bracket 712) corresponding to the pin-outs of the lead frame-mounted chip. Optical backplane 700 further includes a MMF ribbon input 714, a MMF ribbon output 716, CW input 718 and DC power input through leads 720a and 720b. Integrated circuit socket 710 includes a plurality of the aforedescribed optical transceiver chips so as to directly connect a chip in a standard lead frame package with the optical transceivers.

FIG. 8C illustrates yet another packaging option for the optical transceiver chip of the present invention. An optical processor chip 750 includes a package 752 containing a plurality of optical transceiver chips (not visible). Package 752 includes an optical window 754, which allows direct, optical connection of the optical processor chip with other optical components through a parallel optical bus (indicated by arrows bracketed by a dashed bracket 756). Package 752 also includes the usual inputs for CW optical input (an optical fiber 758) and DC power input (leads 760a and 760b).

In addition to the optical interconnect applications described in the P5 application, the metal-insulator-based, electron tunneling device technology, as described in the aforementioned P1 and P2 patents and P3, P3-cip and P1-cip applications, is readily adaptable to operate at frequencies other than in the optical regime. The aforedescribed metal-insulator-based, electron tunneling devices may be configured to transmit, receive and/or modulate signals with virtually any carrier frequency ranging, for example, from microwave (approximately 3 to 30 GHz) to millimeter-wave (approximately 30 to 300 GHz), sub-millimeter-wave (approximately 300 GHz to 3 THz) and through optical frequencies by suitable selection of, for instance, tunneling junction, antenna, and waveguide dimensions. Additionally, if the signal is riding on a carrier frequency much higher than the signal bandwidth, the relative change in wavelength over the signal bandwidth is small. As a result, transmission paths for such a high carrier frequency signal are much simpler to design than for signals exhibiting a large relative difference in wavelength over the bandwidth of the signal. In particular, if one doesn't have to design transmission lines that operate at DC, one can use electromagnetic radiation, guided or not, to transmit the information over the communication path.

In particular, metal-insulator-based, electron tunneling devices transmitting/receiving signals with carrier frequencies above three gigahertz and into the terahertz (THz; i.e., $10^{12}$ Hz) realm are suited for intra- or inter-chip interconnection for applications such as signal transmission, power distribution and clock signal broadcasting. By THz frequency range, Applicants generally refer to frequencies from approximately one to several hundreds of THz, and, in particular, a frequency range of approximately 0.03 to $10 \times 10^{12}$ Hz for the signal carrier frequency. It should be noted that the electron tunneling device technology as described in detail in the P1 and P2 patents as well as P1-cip, P3, P3-cip and P5 applications is particularly advantageous in that it is adaptable to provide devices in a wide range of frequencies including, and not limited to, approximately 3 GHz and up to several hundreds of THz. While the optical interconnection system disclosed in the P5 application provides significant advantages over commercially available electrical and wireless interconnects, interconnects based on the aforedescribed metal-insulator-based, electron tunneling device technology operating in a range from approximately 30 GHz into several THz may provide further advantages as described immediately hereinafter.

A terahertz interconnect system of the present invention is advantageous over known prior art in that electrical lines and RF lines are eliminated. The THz carrier transmitter/receiver of the present invention provide sufficiently high frequency for efficient bandwidth use. For example, ten 10-Gb/s signals may be carried on one THz carrier. Also, the carrier frequency is high enough such that the carrier waves do not interfere with most of the electronic circuitry, thus keeping electromagnetic interference to acceptably low levels. That is, the carrier frequency is sufficiently high such that critical components in the electronic circuitry cannot respond to it. Alternatively, filters may be included in the electronic circuitry to filter out the THz carrier signals. Moreover, the 30 GHz through several THz frequency range is low enough such that the carrier signal is capable of penetrating many types of chip packaging and enclosure. As a result, separate chips, with the THz interconnect components of the present invention disposed or integrated thereon, may be separately hermetically sealed but still communicate in the present interconnect system. In addition, the THz carrier transmitter/receiver may be made tunable with the inclusion of tuning means such as, for instance, voltage-controlled capacitors.

Furthermore, the antennae required in the terahertz interconnect system of the present invention have dimensions on the order of one millimeter, which are readily fabricated using existing deposition and lithography technology. The large collection area of such antennae provide correspondingly high sensitivity, and precise beam focusing or device alignment, as required in optical interconnects, is not necessary in terahertz interconnects. The antennae may be designed, for example, to receive power, clock signals, and other forms of electromagnetic radiation. For example, the metal-insulator-based, electron tunneling device technology developed by the assignee of the present invention (as described in, for example, P1 and P2 patents as well as P3, P3-cip, P1-cip and P5 applications) allows efficient generation/detection/modulation of signals using metal/insulator antenna/diode systems at the relevant frequencies. Alternatively, more traditional high speed components, such as Schottky diodes, may be used. The carrier signal may be encoded by schemes such as digital on/off, amplitude modulation (AM), frequency modulation (FM), spread spectrum and others.

In addition, the terahertz interconnect system of the present invention allows flexible placement of the receivers and transmitters. Each of the terahertz devices, acting as an interconnect node, may be placed anywhere within the reception and transmission cross sections of each other device to/from which signals are to be transmitted or received. The limitation on device placement is basically a function of the directionality and strength of the signal to be radiated and detected. Chips containing the interconnect nodes may be laid out, for instance, randomly, end-to-end or even one on top of another. One or more transceivers may be formed on a single chip or on a plurality of chips. In particular, in comparison to devices requiring epitaxial growth techniques for fabrication, the electron tunneling device technology as disclosed in the P1 and P2 patents as well as in the P1-cip, P3, P3-cip and P5 applications and based on a thin film approach, different layer structures are much more easily integrated onto the same chip.

Figure 9A:
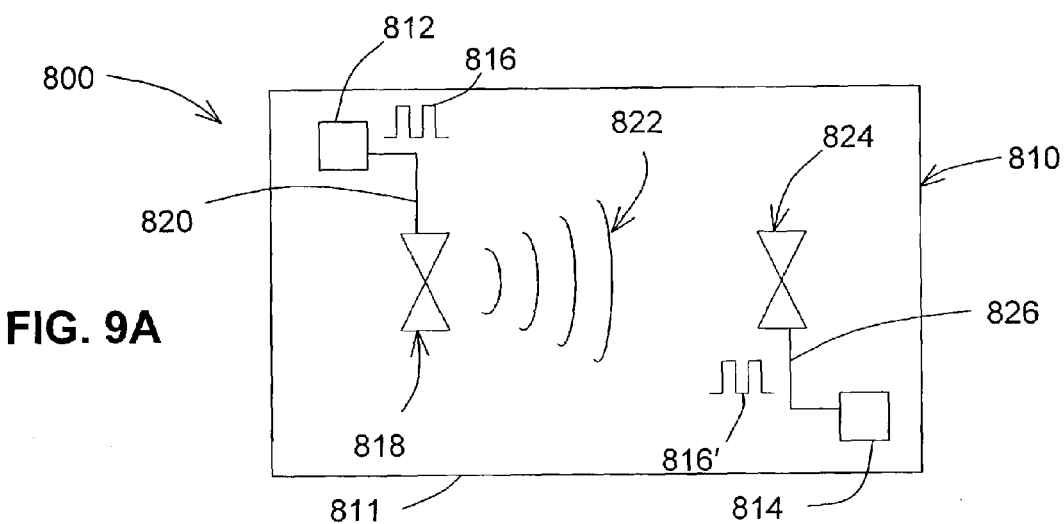
FIGS. 9A–9D are diagrammatic illustrations of examples of layout configurations for a terahertz interconnect system in accordance with the present invention.

Some examples of device layout for the terahertz interconnect system of the present invention are shown in FIGS. 9A–9D. FIG. 9A illustrates a terahertz interconnect system 800 in which a chip includes a terahertz receiver on one part of the chip and a terahertz transmitter on another part of the chip. A chip 810 of terahertz interconnect system 800 includes a substrate 811 with first and second electrical circuitry 812 and 814, respectively, disposed thereon different parts of substrate 811. First electrical circuitry 812 is configured to provide a first electrical signal 816 containing data and to direct first electrical signal 816 toward a first electron tunneling device 818, which is connected with first electrical circuitry 812 by a first electrical connection 820. Upon receipt of first electrical signal 816 from first electrical circuitry 812, first electron tunneling device 818 broadcasts through free space a terahertz carrier signal 822 corresponding to first electrical signal 816. Terahertz carrier signal 822 is received at a second electron tunneling device 824, which converts the terahertz carrier signal so received into a second electrical signal 816'. First and second electron tunneling devices 818 and 824 are configured to cooperate with each other such that second electrical signal 816' contains at least a portion of the data contained in first electrical signal 816. For instance, first electron tunneling device 818 may be sized so as to generate terahertz carrier signal 822 at a particular frequency, while second electron tunneling device 824 is of dimensions designed to receive that particular frequency of carrier signal. For example, first and second electron tunneling devices 818 and 824, respectively, may be, but not limited to, metal-insulator, thin-film based electron tunneling devices as disclosed in the P1 and P2 patents and P1-cip, P3, P3-cip and P5 applications. Alternatively, first and second electron tunneling devices 818 and 824 may be based on another high speed component, such as Schottky diodes. Second electron tunneling device 824 is connected with second electrical circuitry 814 by a second electrical connection 826 such that second electrical signal 816' is transmitted to electrical circuitry 814. In this way, data from electrical circuitry 812 is transmitted to electrical circuitry 814 without the necessity for a direct electrical connection therebetween.

Figure 9B:
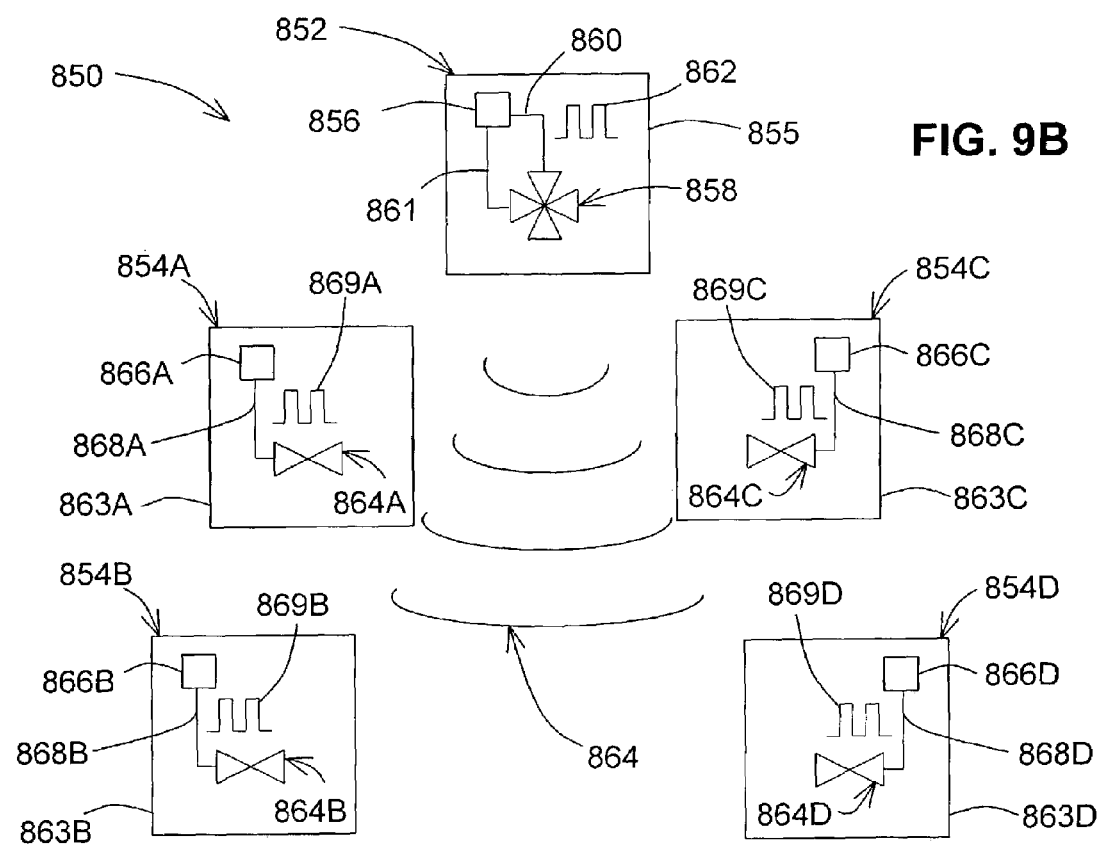

Another possible configuration of the terahertz interconnect system of the present invention is shown in FIG. 9B. FIG. 9B illustrates an arrangement in which a plurality of chips are laid out in a V-configuration. A terahertz interconnect system 850 includes a master chip 852 and a plurality of slave chips 854A–D. Master chip 852 is located at the apex of the V-configuration and includes a master substrate 855 with a master electrical circuitry 856 disposed thereon. Master electrical circuitry 856 is connected with a transceiver arrangement 858 by electrical connection 860 and 861. Transceiver arrangement 858 may be based, for example, on the aforedescribed metal-insulator-based, electron tunneling device technology of the P1 and P2 patents and P3, P3-cip, P1-cip and P5 applications. Master electrical circuitry 856 provides a first electrical signal 862, which contains data and is communicated to transceiver arrangement 858 via electrical connection 860. Transceiver arrangement 858 converts first electrical signal 862 into a terahertz carrier signal 864, which is broadcast over the other chips in the V-configuration. Slave chips 854A–D include substrates 863A–D with receivers 864A–D, respectively, disposed thereon. Receivers 864A–D are respectively connected with slave electrical circuitry 866A–D by electrical connections 868A–D, respectively. Receivers 864A–D are configured to receive terahertz carrier signal 864 broadcast from transceiver arrangement 858 and convert the signal so received into electrical signals 869A–D, respectively, containing at least a portion of the data contained in electrical signal 862. Then, electrical signals 869A–D are respectively received at slave electrical circuitry 866A–D. In this way, data in electrical signal 862 from master chip 852 is transmitted to slave electrical circuitry 866A–D without direct hardwired connections therebetween.

Figure 9C:
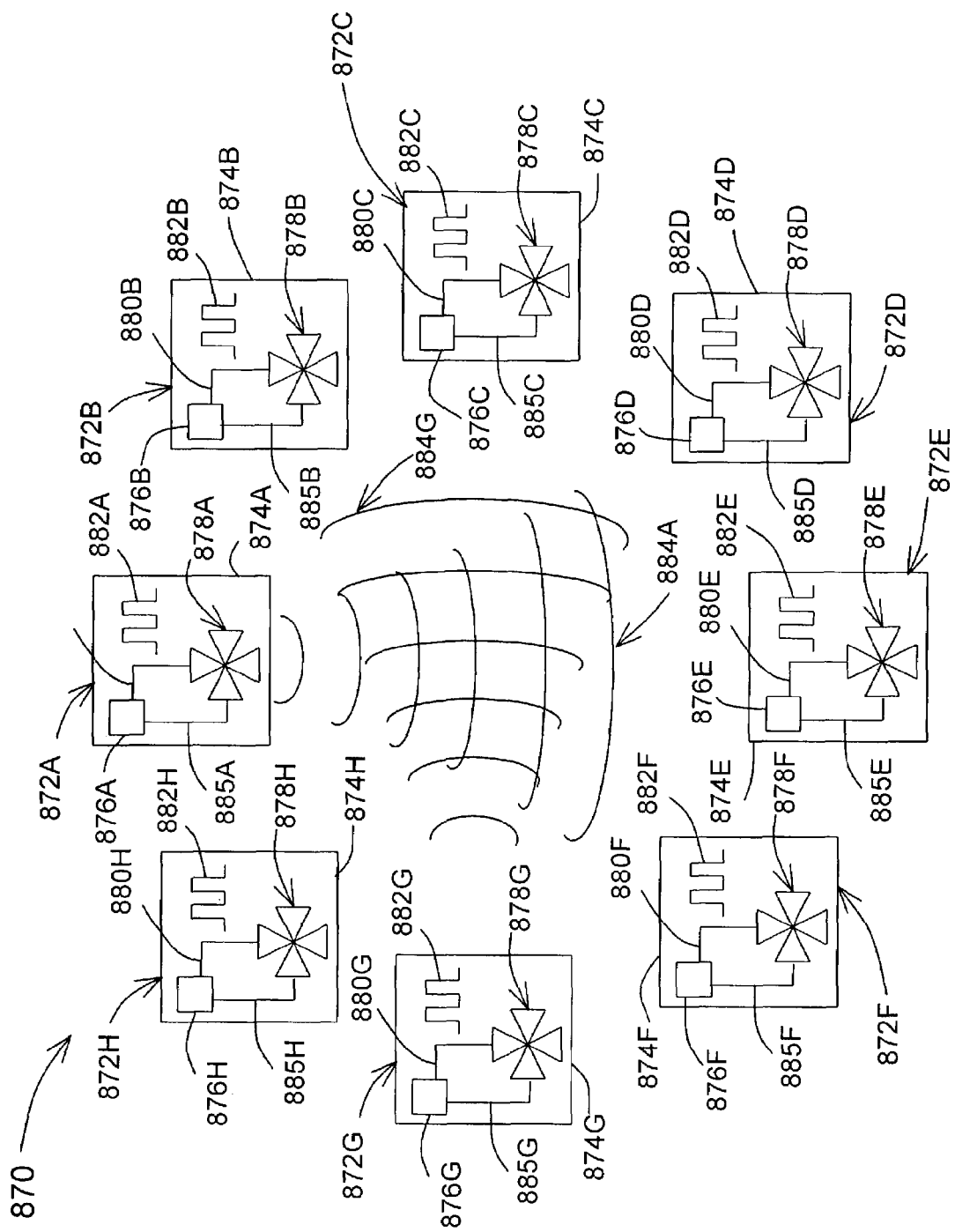

Yet another layout configuration is shown in FIG. 9C. A terahertz interconnect system 870 of FIG. 9C includes a plurality of chips 872A–H. Chips 872A–H includes substrates 874A–H, respectively, with electrical circuitry 876A–H respectively disposed thereon. Electrical circuitry 876A–H are connected with transceivers 878A–H, respectively, by primary electrical connections 880A–H such that electrical signals 882A–H respectively produced by electrical circuitry 876A–H are respectively communicated to transceivers 878A–H. Transceivers 878A–H convert the electrical signals so received into terahertz carrier signals such as, for example, terahertz carrier signals 884A (produced at transceiver 878A) and 884G (produced at transceiver 884G) as shown in FIG. 9C. Transceivers 878A–H as shown in FIG. 9C are further connected electrical circuitry 876A–H via secondary electrical connections 885A–H, respectively, such that terahertz carrier signals may be received from other chips and communicated to the electrical circuitry on a given chip in the system. Transceivers 878A–H may be based on, for example, the aforedescribed metal-insulator-based, electron tunneling device technology as described in the P1 and P2 patent and P3, P3-cip, P5 and P1-cip applications. In one embodiment, each of transceivers 878A–H may be configured to transmit and receive the terahertz carrier signal from only one other of transceivers 878A–H. For example, transceiver 878A on chip 872A may be formed of predetermined dimensions so as to transmit and receive terahertz carrier signals of only a particular frequency. At the same time, transceiver 878E on chip 872E may be configured transmit and receive terahertz carrier signals of that same particular frequency while all other transceivers are configured to transmit and receive terahertz carrier signals of frequencies other than the particular frequency. In this way, although a plurality of chips are in close proximity, chips 872A and 872E may only communicate with each other while ignoring the terahertz carrier signals from other chips. Chips other than 872A and 872E may also be configured to cooperate in pairs or in other groupings so as to communicate only within those groupings. Alternatively, each chip may be configured to communicate with every other chip.

Figure 9D:
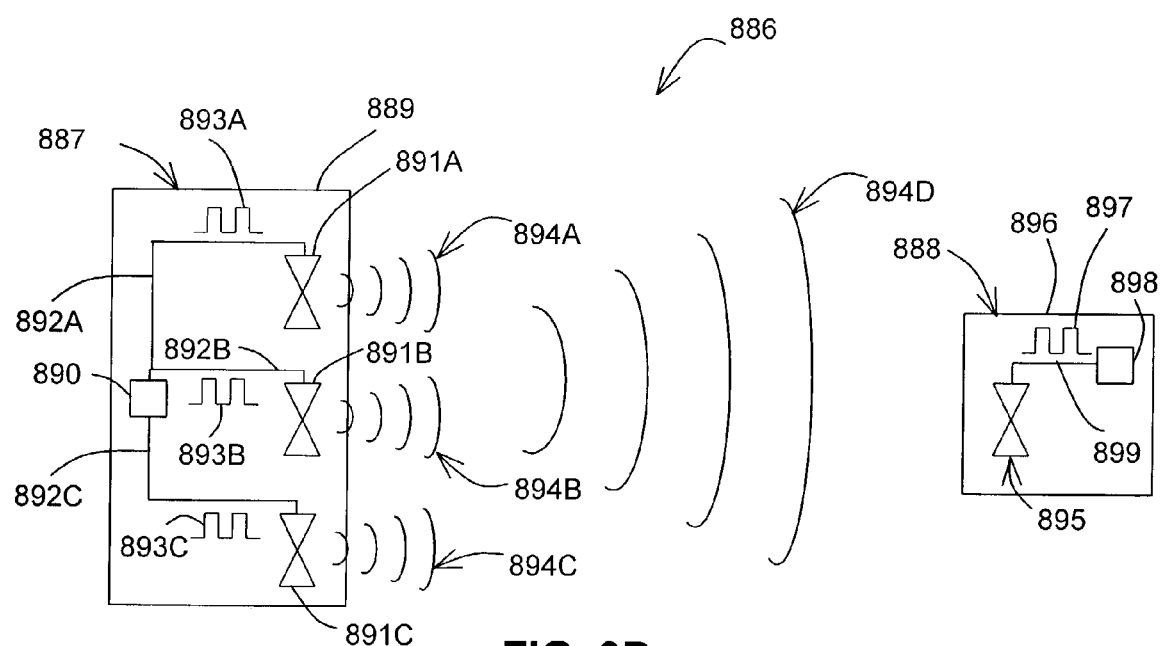

Still another configuration is shown in FIG. 9D, which illustrates a terahertz interconnect system 886. Terahertz interconnect system 887 includes a transmitter chip 887 and a receiver chip 888. Transmitter chip 887 includes a substrate 889, on which a first electrical circuitry 890 is formed. First electrical circuitry 890 is connected with a plurality of transmitters 891A–C by electrical connections 892A–C, respectively, so as to respectively and provides electrical signals 893A–C therethrough. In one example, electrical signals 893A–C are synchronized and identical such that transmitters 891A–C essentially receive copies of the same electrical signal. Transmitters 891A–C respectively convert electrical signals 893A–C into synchronized terahertz carrier signals 894A–C. Synchronized terahertz carrier signals 895A–C add constructively to yield a sum signal 894D with greater broadcasting power and potentially greater directionality than each one of synchronized terahertz carrier signals 894A–C. Sum signal 894D is then received at a receiver 895 formed on a substrate 896 of receiver chip 888. Receiver 895 converts sum signal 894D into a converted electrical signal 897, which is transmitted to a second electrical circuitry 898 via electrical connection 899.

It is noted that FIGS. 9A–D illustrate only a few of the possible configurations for the terahertz interconnect system of the present invention. Other layout configurations are also contemplated and are considered to be within the scope of the present invention.

Further advantages of the terahertz interconnect system of the present invention includes the ease with which additional components may be added into the overall system. For example, additional components, such as memory or devices with different functionality, may be provided with a transmitter or receiver or transceiver operating in a terahertz wavelength range compatible with the existing components. Then, the additional components may simply be placed within the active region (i.e., within the broadcast range) of the existing components to be able to exchange data with other components so as to be incorporated into the system. In this way, defective or obsolete components may be removed or exchanged at will without affecting the remaining components in the system.

Additionally, the terahertz carrier signals used in the interconnect system of the present invention may be communicated by means of free space transmission, as shown in, for example, FIGS. 9A–9D or by guided wave transmission, Such as shown in FIG. 1A for instance. It may be noted that guided wave transmission may limit the placement of the transmitters/receivers on, for instance, a chip substrate, but transmission of the terahertz carrier signal through a waveguide may result in a reduction in electromagnetic interference and improved power efficiency. Other possible embodiments of the terahertz interconnect system of the present invention are discussed in detail immediately hereinafter. For purposes of the present application, the term "chip" is considered to encompass any type of compact device, set of components, input/output device or port, or a small system.

Figure 10:
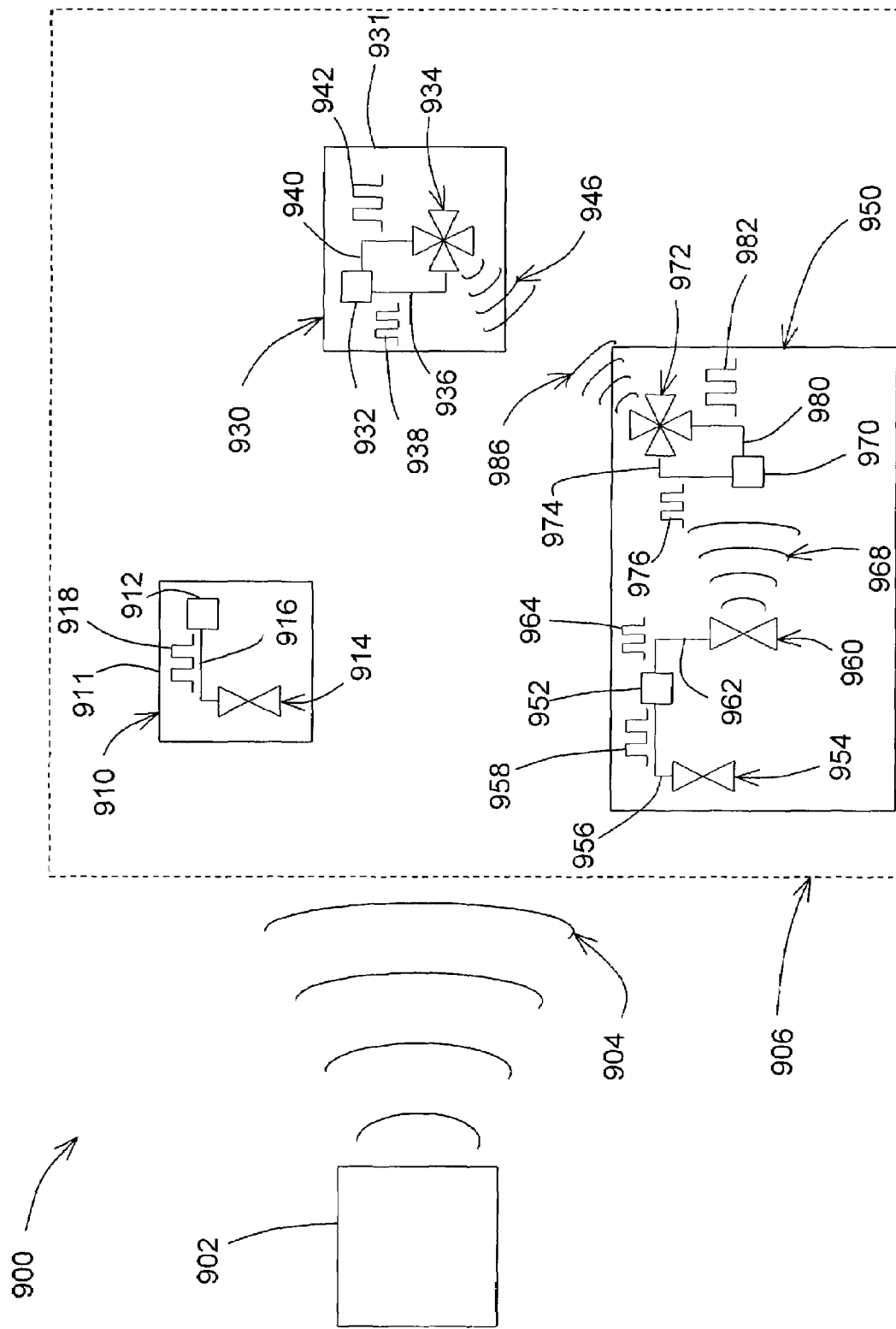
FIG. 10 is a diagrammatic illustration of a power/clock distribution scheme designed in accordance with the present invention.

Turning now to FIG. 10, another possible configuration of the present invention for use in power or clock distribution to a plurality of electrical circuitry is illustrated. A system 900 as shown in FIG. 10 includes an output source 902. Output source 902 may be, for example, a power source which generates and radiates a power signal as an electromagnetic radiation 904 in the form of, for instance, microwaves. Output source 902 may alternatively be a clock generator which generates a clock signal as the electromagnetic radiation in the form of, for instance, optical signals, for synchronizing a plurality of electrical circuitry such as those on chips, boards, or in larger system configurations. Electromagnetic radiation 904 is directed toward a group of sub-systems, indicated by a dashed box 906. Sub-systems 906 may include, for instance, a first chip 910. First chip 910 includes a first substrate 911 on which at least an electrical circuitry 912 is disposed. Electrical circuitry 912 is connected with a receiver 914 by an electrical connection 916. The size and dimensions of receiver 914 are designed such that receiver 914 is responsive to electromagnetic radiation 904. Receiver 914 receives a portion of electromagnetic radiation 904 and converts it to an electrical signal 918 to be directed to electrical circuitry 912 via electrical connection 916. For example, if electromagnetic radiation 904 is a power signal, then electrical signal 918 becomes a power input for electrical circuitry 912. Alternatively, if electromagnetic radiation 904 is a clock signal, then electrical signal 918 acts as a clock input for electrical circuitry 912. In this way, electrical circuitry 912 may be supplied with an external power or clock signal from output source 902 without the need for direct electrical connection with output source 902.

Continuing to refer to FIG. 10, sub-system 906 may also include a second chip 930, which in turn includes a second substrate 931 with an electrical circuitry 932 and a transceiver 934 disposed thereon. Electrical circuitry 932 and transceiver 934 are connected by a first electrical connection 936. Transceiver 934 receives a portion of electromagnetic radiation 904 and converts it to a first electrical signal 938 to be directed to electrical circuitry 932 as, for instance, a power signal to supply power or as a clock signal to electrical circuitry 932. Furthermore, electrical circuitry 932 is additionally connected with transceiver 934 by a second electrical connection 940 and is configured to generate a second electrical signal 942 toward transceiver 934. Transceiver 934 is additionally configured to convert second electrical signal 942 received thereon into a second electromagnetic signal 946 to be radiated away from second chip 930. For example, second electrical signal 942 may contain data, and transceiver 934 converts second electrical signal 942 into second electromagnetic signal 946 containing at least a portion of the data. In this way, electrical circuitry 932 on second chip 930 may receive power or clock signal from an external source as well as transmit a data signal to other components in system 900 without the need for hardwired electrical or optical connections.

Still referring to FIG. 10, sub-system 906 may further include a third chip 950. Third chip 950 includes a third substrate 951 with a primary electrical circuitry 952 and a receiver 954 disposed thereon. Primary electrical circuitry 952 and receiver 954 are connected by a first electrical connection 956. Receiver 954 receives electromagnetic radiation 904, converts it into a first electrical signal 958, and directs it along first electrical connection 956 to primary electrical circuitry 952, for example, as a power signal to supply power or as a clock signal. Third chip 950 also includes a transmitter 960, which is connected with primary electrical circuitry 952 by a second electrical connection 962. Primary electrical circuitry 952 is configured to provide a second electrical signal 964 to be directed toward transmitter 960 through second electrical connection 962. Transmitter 960 receives second electrical signal 964 from primary electrical circuitry 952 and converts it into a third electromagnetic signal 968 to be radiated away from transmitter 960. Third chip 950 further includes a secondary electrical circuitry 970 connected with a transceiver 972 by a third electrical connection 974. Transceiver 972 is also configured to be sensitive to electromagnetic radiation 904 so as to receive electromagnetic radiation 904, convert it to a third electrical signal 976 to be directed toward secondary electrical circuitry 970 through third electrical connection 974 as, for instance, a power or clock signal. Second electrical signal 970 and transceiver 972 are also connected by a fourth electrical connection 980 such that a fourth electrical signal 982 generated by secondary electrical circuitry 970 may be directed along fourth electrical connection 980 toward transceiver 972. Transceiver 972 converts fourth electrical signal 982 received thereon into a fourth electromagnetic signal 986 to be radiated away from transceiver 972. Alternatively, transceiver 972 may additionally be configured to receive, for instance, third electromagnetic signal 968 from transmitter 960 or second electromagnetic signal 946 from transceiver 934 on second chip 930 so as to convert the electromagnetic signal so received into a part of third electrical signal 976 to be directed to secondary electrical circuitry 970. Transceiver 972 may further be configured to receive and modulate first electromagnetic signal 968 so as to provide a modulated electrical signal as a part of third electrical signal 976 to secondary electrical circuitry 970. Such modulation techniques are described in detail in, for instance, the P2 patent and the P3 application.

Various modifications to the system shown in FIG. 10 are contemplated. Additional connections, for instance electrical, optical or RF interconnection, may be provided between each of sub-systems 906. Sub-systems 906 may be located on a single board or be located on different boards arranged in relative proximity such that electromagnetic signal 904 is receivable at each of the sub-systems 906. Electromagnetic radiation 904 may have a frequency different from the carrier frequency of other signals in the system, or be in the same range of frequencies as those used for signal transmission. Electromagnetic signals provided at the various transmitters and transceivers in the system may be directed to, for instance, adjacent chips, external computer and/or other input/output devices. In the clock distribution implementation, output source 902 may be another electrical circuitry—transmitter combination as provided in the present invention in, for instance, the master chip—slave chips configuration of FIG. 9B. System 900 as shown in FIG. 10 is capable of handling a serial information stream or parallel, multi-channel data due to the large bandwidth enabled by the use of, for example, terahertz carrier frequencies. Alternatively, each chip or electrical circuitry may actually be hardwired to a power supply or other devices readily accessible via electrical interconnects, such as low frequency signal sources and input/output ports while higher frequency channels, or channels which are more practically connected via free-space interconnection, may be provided by terahertz wave interconnects.

System 900 as shown in FIG. 10 is advantageous because a group of electrical circuitry, whether on the same chip or on different chips or boards, may receive power and/or synchronized, clock signals from a single external source without direct electrical connection to the source. Simultaneously, signal transmission and inter- or intra-chip communication may be provided by the system of the present invention. In this way, a plurality of chips or other components, each of which performs a specific function, may be readily interconnected and supplied with power or be synchronized by a single clock signal source. In particular, the clock distribution scheme as provided by the present invention enables higher frequency electromagnetic wave clock signals than is feasible using electrical interconnects while providing less skew. Also, the present invention provides a simpler implementation with less power consumption than is feasible using optical clock signals distributed through optical interconnects. The present invention as shown in FIG. 10 may serve as a replacement for hard-wired, electrical interconnects, replacing wires for short reach, high data rate connection. Also, due to the high carrier frequencies used (e.g., frequencies above 30 GHz), higher data rates are enabled. A system such as system 900 is useful in a variety of applications. For example, the system maybe use used in high speed memory access, in which the circuitry on each memory chip is connected with an external microprocessor by the interconnection system of the present invention. Also, the system may be useful in imaging devices, in which a plurality of receivers/transmitters may be used to measure and/or transmit image information.

The interconnect system of the present invention may also be used in an optocoupler configuration. A conventional optocoupler is generally a combination of a light-emitting diode (LED) and a photodetector used to separate two parts of an electrical circuit. An electrical signal in a first part of the electrical circuit is converted to a light signal at the LED, then the light signal is received at the photodetector and converted back to an electrical signal to be directed to a second part of the electrical circuit. An optocoupler is used, for example, to isolate noisy signals or to protect parts of the electrical circuitry from spurious high voltage electrical signals.

Conventional optocouplers, however, are limited in operating speed up to approximately 50 Mbps mostly due to the speed limitations of the LED as a result of its spontaneous emission lifetime. That is, the operating speed of the conventional optocoupler based on an LED-photodetector pair is limited by how fast the LED can be modulated (i.e., turned on and off). Although the LED may be replaced by a faster emitter device such as, for instance, a semiconductor diode laser, the laser is more costly and consumes more power than the LED. Also, there are various packaging complexities to consider in the conventional optocoupler. For instance, the LED and the photodetector are generally fabricated as separate chips. As a result, the LED chip and the photodetector chip must be aligned relative to one another within the overall, optocoupler package in order to provide efficient coupling of the light signal. Further complicating this alignment task is the fact that an LED chip usually emits light out of an edge of the chip while the photodetector usually accepts light normal to the face of the chip; that is, the LED and the photodetector chips must be aligned at right angles to each other.

Figure 11:
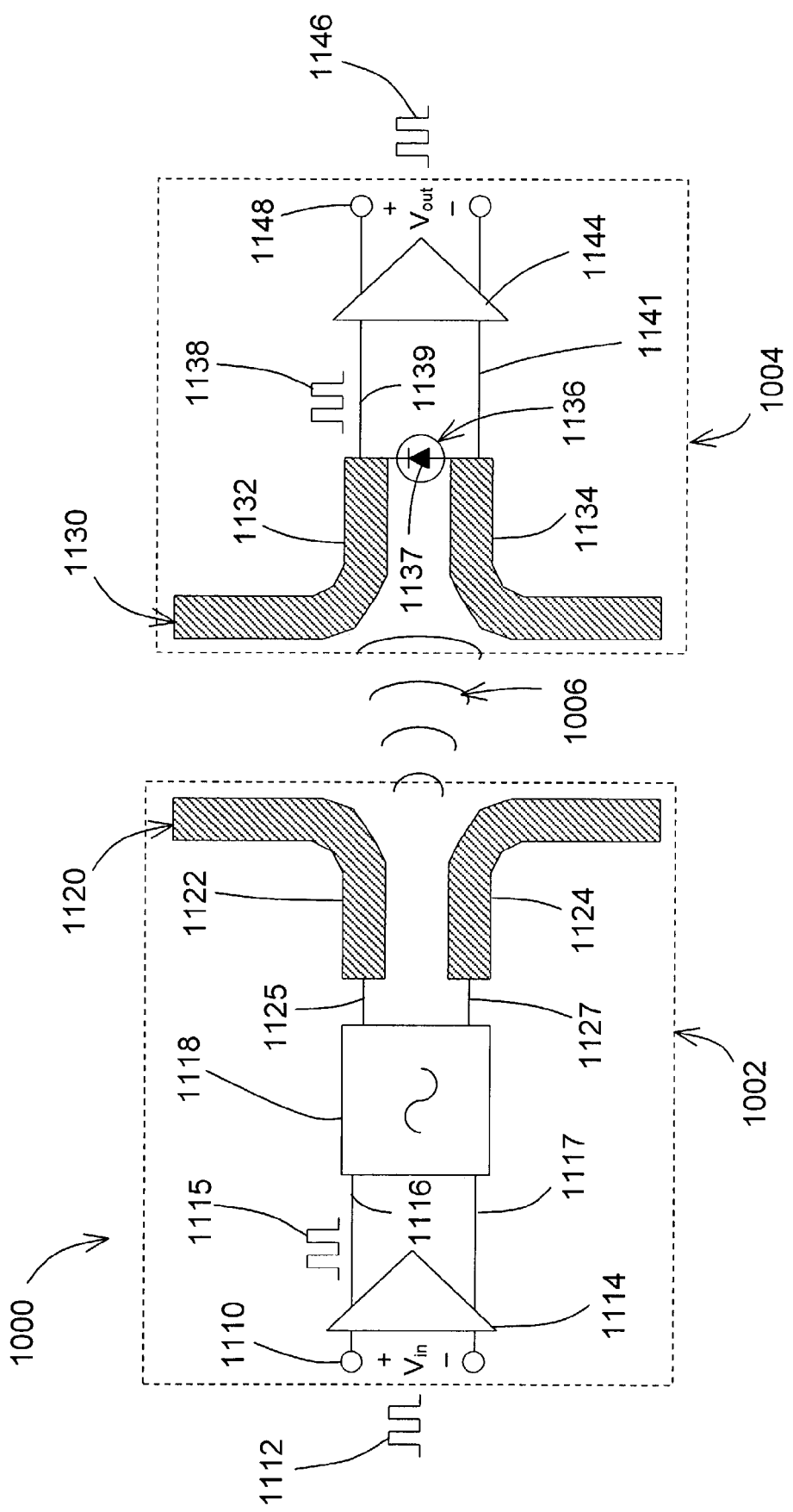
FIG. 11 is a diagrammatic illustration of a terahertz optocoupler designed in accordance with the present invention.

Attention is now directed to FIG. 11, which illustrates an optocoupler 1000 including an interconnect system designed in accordance with the present invention. Optocoupler 1000 includes a transmitter arrangement 1002 and a receiver arrangement 1004 coupled together by an electromagnetic signal 1006. Transmitter arrangement 1002 is configured such that it emits electromagnetic signal 1006 having a carrier frequency in and around the terahertz frequency range (e.g., 0.03 to 10 THz), while receiver arrangement 1004 is configured to be responsive to electromagnetic signal 1006 having a carrier frequency in and around the terahertz range. In the exemplary embodiment shown in FIG. 11, transmitter arrangement 1002 includes a signal input 1110, which receives a first electrical signal 1112 from a first part of an electrical circuitry (not shown), and a driver amplifier 1114, which amplifies the first electrical signal so received and provides a first amplified electrical signal 1115. First amplified electrical signal 1115 is directed through, for example, first and second leads 1116 and 1117 to an oscillator 1118, which converts amplified electrical signal 1115 into electromagnetic signal 1006 to be transmitted through a transmitter antenna 1120. Transmitter antenna 1120 may include, for example, first and second transmitter antenna arms 1122 and 1124, respectively, which are designed to efficiently radiate the electromagnetic signal. Oscillator 1118 may be based, for example, on an electron tunneling device as described in the P1 and P2 patents and the P1-cip, P3, P3-cip and P5 applications. Oscillator 1118 and transmitter antenna 1120 may be connected with each other through first and second electrical interconnections 1125 and 1127, respectively, or the transmitter antenna may be integrally formed from oscillator 1118, as in the case of surface plasmon device 92 as shown in FIG. 1F.

Continuing to refer to FIG. 11, receiver arrangement 1004 of optocoupler 1000 includes a receiver antenna 1130 for receiving electromagnetic signal 1006. In the embodiment shown in FIG. 11, receiver antenna 1130 includes first and second receiver antenna arms 1132 and 1134, respectively, having lengths designed for reception in the carrier frequency range of electromagnetic signal 1006. For instance, first and second receiver antenna arms 1132 and 1134 may be of such dimensions so as to together act as a dipole antenna receptive to electromagnetic signal 1006. Receiver antenna 1130 is connected with a receiver 1136, which may be, for instance, based on an electron tunneling device as described in the P1 and P2 patents and the P1-cip, P3, P3-cip and P5 applications or on other high speed diode technology such as Schottky diodes. Receiver 1136 converts electromagnetic signal 1006 into a second electrical signal 1138. As shown in FIG. 11, receiver 1136 is connected via third and fourth electrical interconnections 1139 and 1141, respectively, with a receiver amplifier 1144. Receiver amplifier 1140 receives second electrical signal 1138 from receiver 1136 then produces an second, amplified electrical signal 1146 at a signal output 1148 to be directed to a second part of the electrical circuitry (not shown). In this way, optocoupler 1000 connects the first and second parts of electrical circuitry by means of terahertz waves while providing high data rates, noise isolation and high voltage protection.

The optocoupler including the interconnect system of the present invention provides several advantages over conventional optocouplers. For example, the terahertz carrier frequency is high enough to support data rates of 10 Gbps and higher. Also, the alignment tolerances of terahertz emitters and detectors (on the order of 100 microns) are much more relaxed in comparison to the precise, sub-micron alignment tolerance required for optical connection. The use of electron tunneling device technology, as described in the P1 and P2 patents and P1-cip, P3, P3-cip and P5 applications, enables practical emitters/oscillators and detectors. For example, metal-insulator-metal-insulator-metal hot electron tunneling transistors coupled with antennas may be used as oscillator 1118, and metal-insulator-metal electron tunneling diodes coupled with antennas may be used as receiver 1136 to provide a low cost, high speed alternative to the conventional optocoupler. Furthermore, as discussed especially in the P5 application, a complete optocoupler including the aforementioned electron tunneling devices may be fabricated monolithically with the transmitter and receiver arrangements being fabricated, for example, in the same process as the two parts of the electrical circuitry, and/or on the same substrate. Also, various antenna designs, such as dipole, vee and Vivaldi, are applicable to the optocoupler of the present invention. In this way, the known alignment and connection concerns of the conventional optocouplers may be alleviated.

An application of the terahertz optocoupler of the present invention is use as a video interconnect. The performance speed of the terahertz optocoupler of the present invention allows the replacement of group of parallel video lines in a video system by a single, serial terahertz optocoupler. In this way, the video connections within a system are simplified while eliminating insertion force problems in high data rate transmission. Furthermore, the terahertz optocoupler may function as a part of a larger, wireless video/audio network within a small area (such as a room) without the problems associated with the electrical interconnect bottleneck.

Another problem which maybe solved using the terahertz interconnect concept of the present invention is the rigidity of microcomputer architecture. Current microcomputer architectures are largely fixed at the time of original design and, therefore, are not flexible once the actual computer has been manufactured. During the design process, the architecture may be designed for a specific microprocessor chip, for instance, and a certain number and types of memory and input/output (I/O) ports, and one or more printed circuit boards, including the mother board, are laid out with data bus lines and control lines for electrically connecting all of the chips intended to be placed on the board. In general, the only flexibility is in the add-on boards that may be placed in standardized I/O sockets pre-positioned on the motherboard. Therefore, in order to add more memory than provided in the original design of the board or to upgrade to a faster microprocessor chip requires a whole new motherboard (or, commonly, a new computer). Additionally, current microcomputer architectures still largely conform to the von Neumann architecture. In this conventional architecture, multi-processing and parallel processing are accomplished in essentially a serial manner through a single main processor. Therefore, although the von Neumann approach has its advantages, it generally cannot accommodate the more parallel processing approach needed in many computing problems. For example, pattern recognition requires tremendous computing resources when performed serially, but may readily be broken down into a number of parallel tasks which may potentially be performed in parallel. Also, other problems such as cognitive computing require massively parallel object associations, which are prohibitively time intensive in a von Neumann architecture.

Just as the internet connects an array of nodes, each of which can perform its function in conjunction with any other node, so a micro-internet may be formned using the components of the current invention. In the micro-internet a node comprises a microprocessor, a memory device, a storage device, an input/output device, a clocking device, a signal repeater, an amplifier, a system, or any other element that functions in conjunction with other nodes. Each interconnected node includes at least one signal emitter, receiver or transceiver. As described herein, the nodes may be interconnected via free space, waveguides or transmission lines. The nodes are situated within no more than a communication distance away from at least one other node, within an enclosure or among enclosures. The nodes may be fixed in position, or mobile, and may operate simultaneously or at different times. The interconnection can function such that any node can communicate with any other node, all nodes communicate through a central node, a reconfigurable cellular configuration, or any other interconnection scheme known to those skilled in the art.

The terahertz interconnect system of the present invention enables the construction of a flexible, networked architecture to solve the aforedescribed problem. In this approach, the computer architecture is considered like a "micro-Internet" where each node within the network includes a terahertz transceiver and at least some processing power and storage capacity. This computer architecture of the present invention is enabled by the chip- and board-integrable, high speed data transfer for low cost as provided, for example, the electron tunneling device technology of the P1 and P2 patents and the P1-cip, P3, P3-cip and P5 applications.

Figure 12A:
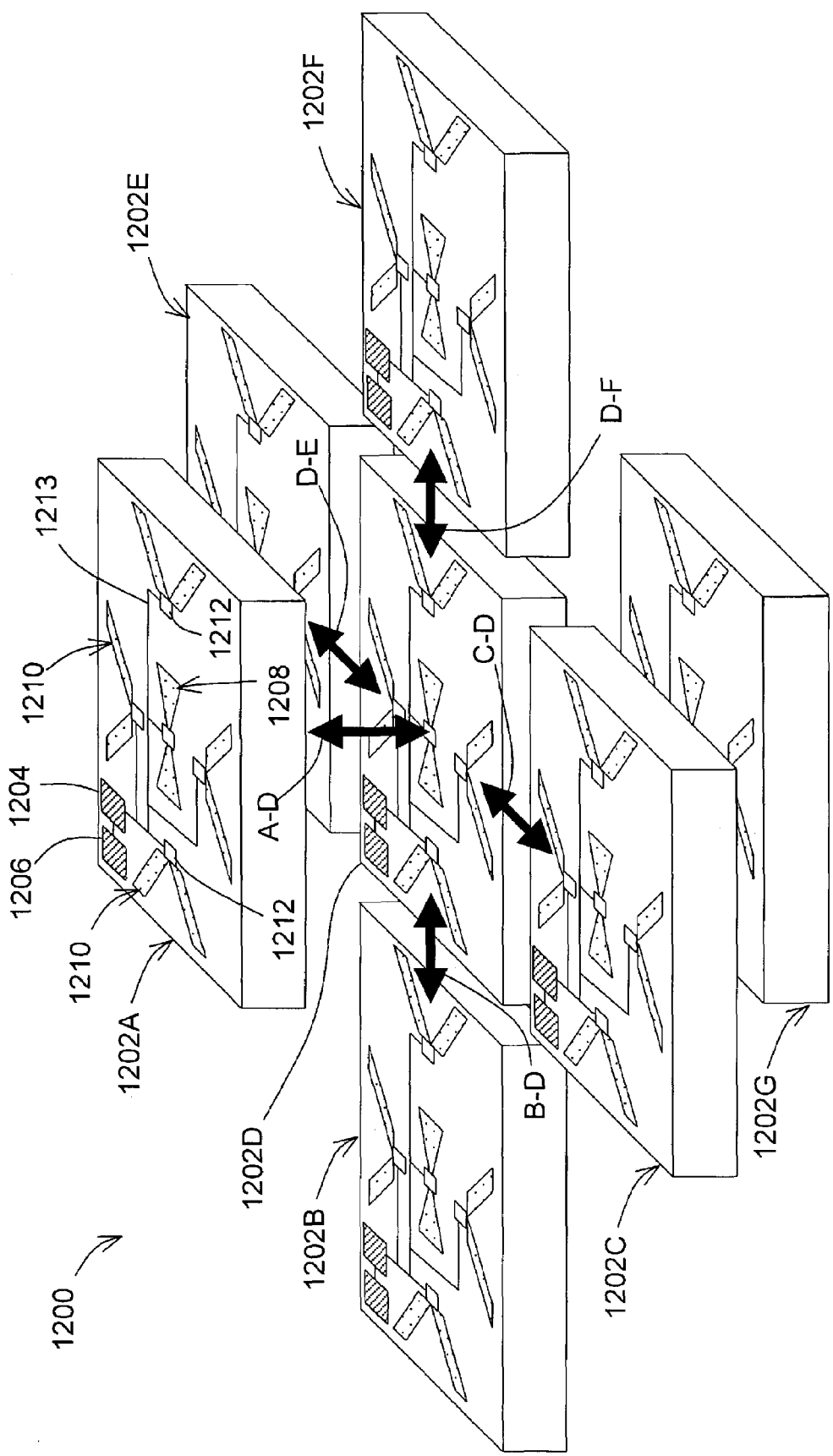
FIGS. 12A and 12B are diagrammatic illustrations, in perspective view, of examples of a three-dimensional interconnection system designed in accordance with the present invention.
Figure 12B:
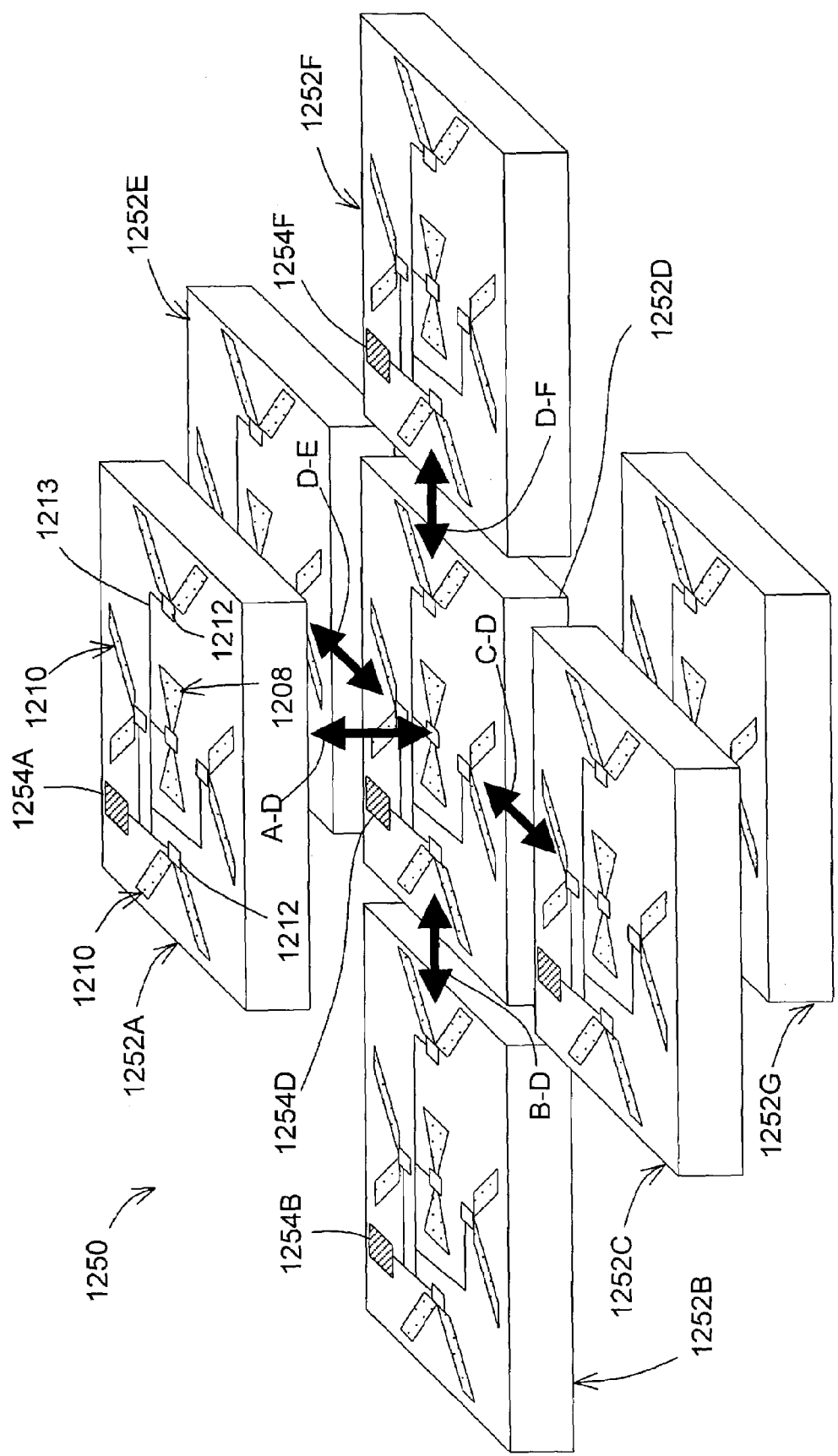

Examples of such a flexible architecture are shown in FIGS. 12A and 12B. A system 1200 includes a plurality of nodes (indicated as 1202A–G in the figure) in a networked architecture. Each one of the nodes may be a chip, a board, or a small system and includes one or more emitters, receivers or transceivers, each connected with an antenna. In the example shown in FIG. 12A, each one of the nodes 1202A–G includes a processor 1204 and memory 1206 such that each node has some "intelligence" (i.e., processing and storage capacity). It should be noted that, although processor 1204 and memory 1206 are shown as being located near a corner of each one of nodes 1202A–G, the processor and memory may be disposed at any convenient position on the node such as, for example, at opposing corners of the node or even embedded within the node.

Continuing to refer to FIG. 12A, each one of the plurality of nodes 1202A–G includes a surface normal antenna 1208 in the center of the node as well as a plurality of edge antennae 1210, each one of the plurality of edge antennae being located near an edge of the node. Surface normal antenna 1208, as well as each one of the plurality of edge antennae 1210, is connected with a transceiver 1212. Transceiver 1212 may be based, for example, on the electron tunneling device technology of the P1 and P2 patents and the P1-cip, P3, P3-cip and P5 applications so as to enable high frequency detection and emission of an electromagnetic signal such as, for instance, terahertz carrier frequency signals. The transceivers on each node are connected with the processor on the node such that electrical signal produced at the processor may be communicated out of the node through the transceivers and the antennae and, simultaneously, the electromagnetic signal received at any of the antennae is converted to an electrical signal and directed to the processor.

Still referring to FIG. 12A, the plurality nodes 1202A–G are each configured to communicate with other adjacent nodes. For example, node 1202A communicates via electromagnetic signal with node 1202D, as indicated by a double-headed arrow A-D, through the centrally located, surface normal antenna 1208 on each node. That is, the surface normal antenna and the corresponding transceiver on each node is configured to send and receive electromagnetic signals in a direction normal to the planar surface of the node. In this way, the processor signal from the processor on node 1202A may be transmitted to the processor on node 1202D, and vice versa by means of the surface normal antennae and associated transceivers. Similarly, node 1202D may communicate with, for example, node 1202B as indicated by a double-headed arrow B-D through adjacent edge antennae via electromagnetic signals.

System 1200 of FIG. 12A has various advantages. New nodes may be readily added in order to add, for example, more processing power, increased storage and input/output capability. In contrast to conventional computers with completely pre-planned interconnections, the networked architecture of system 1200 may grow and evolve over time as needs arise. Old or obsolete nodes may be left in place, except to the extent that they use power and take up space, or they may be removed or exchanged with newer nodes. Node failure or failure of one interconnect link would have minimal effect on the system performance since the network topology of system 1200 allows for bypassing of the failed node or connection. The use of electromagnetic signals, such as terahertz frequency carrier signals, enables flexible, high-speed interconnection between nodes. In addition to the stacked configuration shown in FIG. 12A, the nodes may be connected, for example, in a token-ring type arrangement or in some sort of a network topology (such as packet-switching). Additionally, some of the nodes maybe configured to broadcast the electromagnetic signal over a 2-D area or a 3-D volume so as to enable communication between non-adjacent nodes. The nodes may also be equipped with point-to-point links such as, for example, waveguides in order to reduce external noise and electromagnetic signal transmission loss. Moreover, the electromagnetic signals transmitted through the system may be multiplexed by, for example, frequency-division multiplexing, code-division multiplexing (like a miniature cellular network) or a master-slave architecture, in which a master node controls which of the nodes may communicate with which other nodes at a given time.

For example, system 1200 of FIG. 12A may be adapted to provide interconnects for scalable 3-D storage servers. Modular Internet storage servers, such as the IBM IceCube concept,[5] require low cost, high speed wireless interconnects between processing and storage modules (so-called "Collective Intelligent Bricks" or CIBs). Low cost is a requirement due to the large number of interconnects required in the server. Wireless interconnects are needed so that the bricks may be assembled, interchanged and/or added without hard-wiring. High speed is needed to enable a high rate of data transfer within the system. The use of free-space optical interconnects has been suggested as a possible high speed solution to this problem, but power consumption and alignment precision of optical interconnects make them expensive and impractical to implement. Capacitive interconnects provide some level of high speed and low cost, but are only useful when the wavelength of the signal used to communicate within the system is substantially longer than the capacitive coupling elements. To solve this problem, the plurality of nodes 1202A–G as shown may each be equipped with, for instance, a processor, electronic memory and one or more hard disks, then interconnected through, for example, surface normal and edge antennae as shown in FIG. 12A. In this way, processed data and processing capability are distributed over several nodes while the terahertz interconnection between the nodes enable high speed interconnection with easy alignment of the nodes with respect to each other. For example, using the electron tunneling device technology as disclosed in the P1 and P2 patents as well as the P1-cip, P3, P3-cip and P5 applications, terahertz transmitters and receivers may be built on the outer faces of the nodes rather than taking up valuable on-chip real estate.

A example of the master-slave architecture configuration of node interconnection is shown in FIG. 12B, which shows a system 1250 including a plurality of nodes 1252A–G. In contrast to nodes 1202A–G of FIG. 12A, in which each node is essentially identical to each other node, each one of nodes 1252A–G is configured to perform a different function within a computer architecture. For example, node 1252A may include an arithmetic logic unit (ALU) circuitry 1254A while node 1252D may contain a central processing unit (CPU) circuitry 1254D. In the exemplary embodiment shown in FIG. 12B, node 1252A includes ALU circuitry 1254A, node 1252B includes a random access memory (RAM) circuitry 1254B, and node 1252D includes a CPU circuitry 1254D. Other circuitry such as, but not limited to, video chips, networking chips, read-only memory (ROM) circuitry and a sound chip may also be implemented as the circuitry in a given node. In the example shown in FIG. 12B, node 1252D serves as a central node to which the other nodes are connected via a plurality of transceivers 1212A–G, surface normal antennae 1208 and a plurality of edge antennae 1210 by terahertz interconnection of the present invention such that CPU circuitry 1256 regulates the circuitry on the other nodes. As a result, each one of the various circuitry may be readily interchanged or upgraded by replacing the node associated with that circuitry. For instance, node 1252D may be removed and replaced with a new node including a faster CPU circuitry without disturbing the connection of the various other nodes. Furthermore, although not shown in the present figure, additional nodes including additional circuitry, such as additional RAM, may readily be added in order to provide additional functionality to the system.

One consideration in the use of terahertz range frequencies in interconnects is attenuation of the interconnection signal. Terahertz signals broadcast from transceivers broadcasting isotropically in three dimensions do not have very long propagation length; namely, the signal strength decreases an inverse square of the propagation distance. As a result, the basic concept of interconnecting terahertz transceiver nodes in a 3-D volume is limited in the overall size and interconnection distance by the output power of each transmitter and the detection sensitivity of each receiver. Although this problem may be ameliorated by proper design of the transmitter and receiver antennae, it may still be desirable to increase the propagation distance while limiting the negative effects of, for example, external noise. Furthermore, it would be desirable to provide a structure in which commercially available chips and other circuitry may be readily interfaced with the terahertz interconnect systems of the present invention without requiring extensive modification to the chip or circuitry. Although the metal-insulator-based, electron tunneling technology as disclosed in the P1 and P2 patents and P3, P3-cip, P1-cip and P5 applications enable the direct integration of transmitters and receivers on a chip surface, at times it may not be desirable to bring terahertz carrier signals directly onto the chip because the terahertz carrier signals may contribute to interference or crosstalk with other signals already present on the chip. For instance, metal interconnects on a chip may act as antennas and, if of a suitable length, may act as a receiver for the terahertz waves. Rectifying elements within the chip circuit may the produce unwanted crosstalk signals from these terahertz waves. Also, depending on the wavelength of the carrier signal to be used, the aforedescribed metal-insulator-based tunneling technology may take up too much real estate on the chip. Metal interconnects or highly-doped semiconductor regions on a chip may interfere with terahertz transmission and reception.

A compact solution to this problem of signal attenuation and chip compatibility may be provided by confining the terahertz carrier signal in combination structure of a waveguide and chip package to increase communication range and/or transmission efficiency. 2-D waveguides (e.g., a slab waveguide) or 1-D waveguides (e.g., metal transmission lines, such as coplanar, strip line, and parallel plate configurations) may be used. Such a transceiver may effectively transmit terahertz signals without the need for an antenna. Alternatively, various antenna designs may be used to optimize the signal coupling between the transceiver and the waveguide. The edges and/or ends of the waveguides used in the terahertz interconnection system may include absorbing material to avoid unwanted back reflections. In the case of the 2-D waveguide structure, a slab waveguide, for example, may be provided on a support (such as on a chip, board, etc., across which the interconnection is to be provided), then terahertz transceivers, transmitters and/or receivers maybe be placed anywhere in proximity to or directly on the waveguide surface. Each transceiver or transmitter then broadcasts a terahertz carrier signal through the slab such that the signal is guided along the waveguide. The signal in the waveguide may be picked up by another transmitter or a receiver disposed on or in proximity to the waveguide. For a 1-D waveguide structure, each transceiver or transmitter may be placed on an outer surface of, for example, a transmission line so as to interact with the evanescent field of the traveling wave. Alternatively, the transceiver, transmitter or receiver may be placed inside of the waveguide to absorb and/or detect the terahertz carrier signal traveling therethrough. Also, transceivers may be used to receive and re-transmit signals along a waveguide as necessary so as to act as repeaters. The signal coupling between the waveguide and the transceiver, transmitter or receiver may be optimized by the suitable design of an antenna connected therewith, but an antenna is not absolutely necessary if the transceiver, transmitter or receiver is disposed in close proximity with the waveguide.

Some of the aforementioned guiding and chip package structures are illustrated in FIGS. 13A–13D. FIG. 13A illustrates an assembly for providing terahertz interconnection between two separated electrical circuitry. An assembly 1300 includes a substrate 1302 with a first chip package 1304 disposed thereon. First chip package 1304 is configured to accommodate a first chip 1306, for example, by enveloping first chip 1306 therein. A first transceiver 1308 is embedded within first chip package 1308 as a part of first chip 1306 such that first transceiver 1308 receives electrical signals provided by first chip 1306 and converts the electrical signals so received into a terahertz carrier signal. Assembly 1300 further includes a waveguide arrangement 1310, which in turn includes first and second waveguide couplers 1312 and 1314. First waveguide coupler 1312 is configured to receive the terahertz carrier signal from first transceiver 1308 and direct the terahertz carrier signal through waveguide arrangement 1310 toward second waveguide coupler 1314. Terahertz carrier signal may be coupled into first waveguide coupler by broadcast from first transceiver 1308, for instance, or by near field, mode coupling. Assembly 1300 further includes a second chip package 1316 also disposed on substrate 1302. Second chip package 1316 is configured to accommodate a second chip 1318 with a second transceiver 1320 embedded therein. Second waveguide coupler 1314 is disposed in close proximity to second transceiver 1320 such that the terahertz carrier signal from first transceiver 1308 is coupled to second transceiver 1320. Second transceiver then converts the terahertz carrier signal into a second electrical signal to be directed to second chip 1318. Waveguide arrangement 1310 serves to confine the terahertz carrier signal therein during propagation from first waveguide coupler 1312 to second waveguide coupler 1314 so as to limit propagation loss and introduction of external noise. Furthermore, first and second chip packages 1308 and 1316 cooperate with substrate 1302 and with waveguide arrangement 1310 such that first and second chips, first and second transceivers and first and second waveguide couplers are positioned with respect to each other to yield efficient coupling between the various components. Moreover, assembly 1300 may also function in a reverse direction where second transceiver 1320 converts electrical signals from second chip 1318 into the terahertz carrier signal to be carried through the waveguide arrangement from second chip package 1316 and into first chip package 1304 to be received at transceiver 1308 and, consequently, at first chip 1306. In this way, the data lines that need to be driven for operation of the chip is reduced from the usual ~48 inches down to less than ½-inch. As a result, especially with careful design of, for instance, shielding, crosstalk resulting from the coupling of terahertz signals with logic circuitry is virtually eliminated.

Another example of terahertz interconnect packaging is shown in FIG. 13B. An assembly 1325 of FIG. 13B includes a chip package 1327, which in turn encloses a chip 1329 and a transceiver 1331 while keeping the chip and transceiver in close proximity but not in contact with each other. Transceiver 1331 receives electrical signals produced at chip 1320 then converts the electrical signals into terahertz carrier signals. Assembly 1325 further includes a substrate 1333 with a waveguide arrangement 1335 disposed therein. Waveguide arrangement 1335 includes a waveguide coupler 1337, and chip package 1327 is positioned relative to waveguide arrangement 1335 in such a way that transceiver 1331 and waveguide coupler 1337 are in close enough proximity in order to couple the terahertz carrier signal therebetween.

Assembly 1325 provides further advantages in that chip 1329 does not need to be physically altered in order to be accommodated into the assembly. That is, a commercially available, standard chip circuitry may be used as chip 1329 and accommodated into chip package 1329 without the need, for example, to specially embed a terahertz transceiver therein. The terahertz carrier signal coupled into waveguide arrangement 1335 may be received, for instance, by a receiving arrangement similar to second chip package 1316 of FIG. 13A. Furthermore, no change in the IC design is required, and the chip is only required to drive input/output lines of approximately one centimeter in length such that higher off-chip data rate is possible at lower drive power.

Still another example of the combination of improved chip compatibility and signal propagation is shown in FIG. 13C, which illustrates a socket system 1340. Socket system 1340 includes a socket arrangement 1342, which is configured to accommodate a standard chip package 1346 including a plurality of pin-outs 1348. A transceiver 1350 is embedded within socket arrangement 1342 in close proximity to pin-outs 1348 such that electrical signals from standard chip package 1346 is received through pin-outs 1348 and at transceiver 1350. Socket system 1340 also includes a substrate 1352, which supports socket arrangement 1342 thereon and further includes a waveguide arrangement 1354 with a waveguide coupler 1356 connected therewith. Socket arrangement 1342 is disposed on substrate 1352 such that transceiver 1350 and waveguide coupler 1356 are brought in close proximity to each other. In this way, the electrical signal provided at the standard chip package is converted into a terahertz carrier signal and guided away from standard chip package 1346 by broadcast from the transceiver and/or near field mode coupling, without requiring any modification to the chip package (or the chip enclosed therein) or any hardwired electrical connections outside of the chip package.

Yet another example of the combination of standard chip packaging and waveguiding in a terahertz interconnect system is shown in FIG. 13D. An assembly 1360 of FIG. 13D includes a chip package 1362 enclosing a chip 1364. Chip 1364 is connected through an electrical interconnect 1366 with a transceiver 1370. Transceiver 1370 is enclosed in a transceiver package 1372 and is disposed in close proximity with a waveguide coupler 1374 of a waveguide arrangement 1376. The chip package, electrical interconnect, transceiver package and waveguide arrangement are all supported on a substrate 1378. For short distances, electrical interconnect 1366 may be sufficient to provide relatively noise/loss-free transmission between chip 1364 and transceiver 1370. Assembly 1360 also allows the inclusion of a separately packaged, standard chip with a pre-fabricated terahertz carrier signal waveguide arrangement without any modification to the chip or the chip package.

Another application of the terahertz interconnect system of the present invention is for use as board-to-board interconnects with near-field coupled, terahertz devices. There are various instances where high data rate, wireless communications over very short distances are required. It is submitted that electrical interconnections in such applications are slow and generally result in a data feed bottleneck. As described in the Background section, optical interconnects are currently cost-prohibitive and unpractical due to the precise and stable alignment required. It would be desirable to provide an interconnection scheme which allows a certain degree of tolerance to misalignment while allowing close proximity of transmitter and receiver placement in order to minimize the amount of required transmit power. Furthermore, it would be advantageous to achieve a high degree of energy coupling from the transmitter to the receiver in order to reduce stray radiation, which wastes power and may interfere with other existing circuits.

Figure 14A:
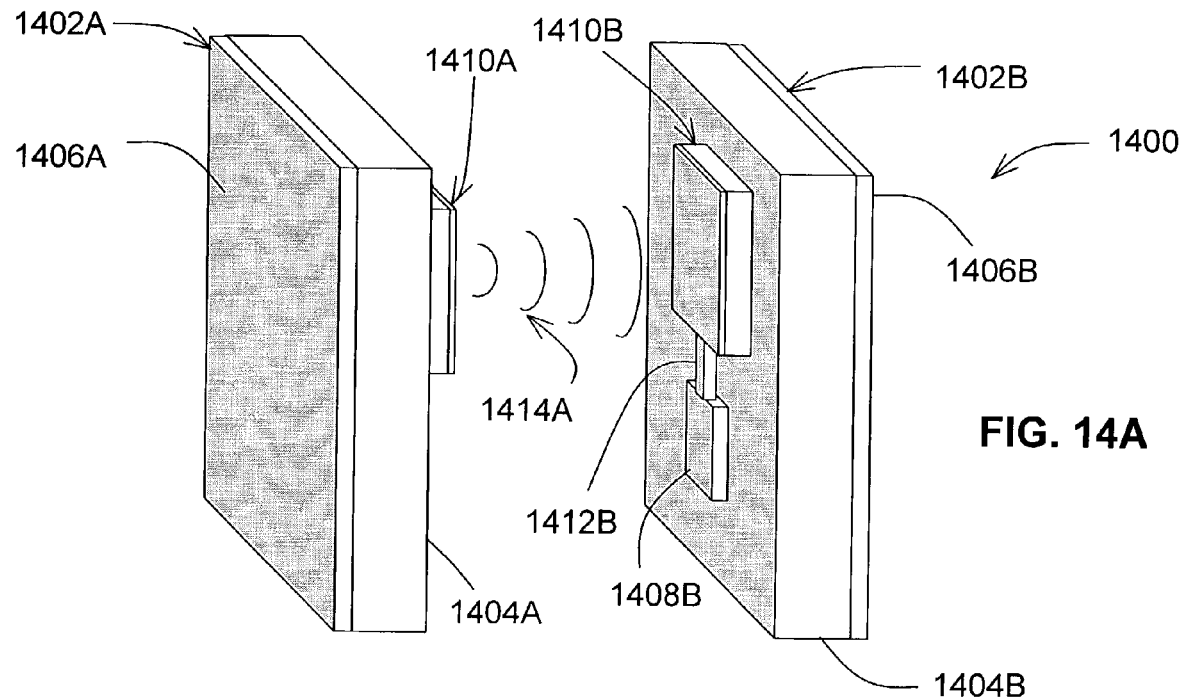
FIGS. 14A–14C are diagrammatic illustrations of a board-to-board interconnection scheme based on the terahertz interconnect of the present invention.
Figure 14B:
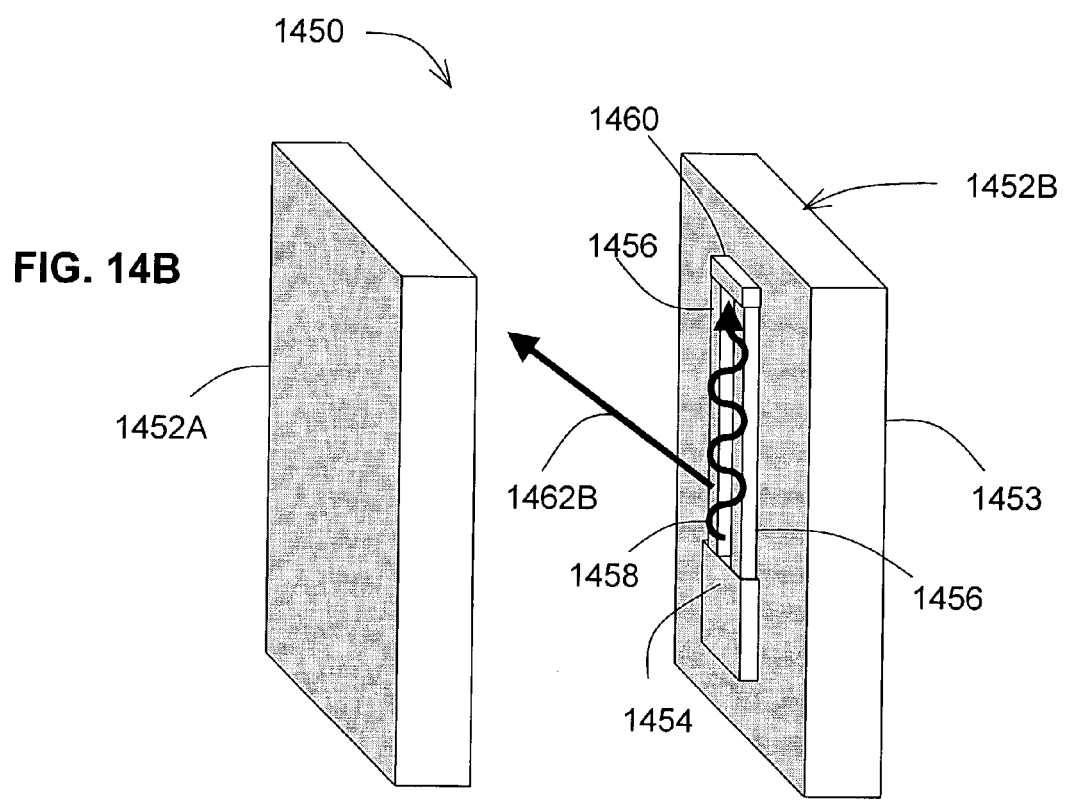
Figure 14C:
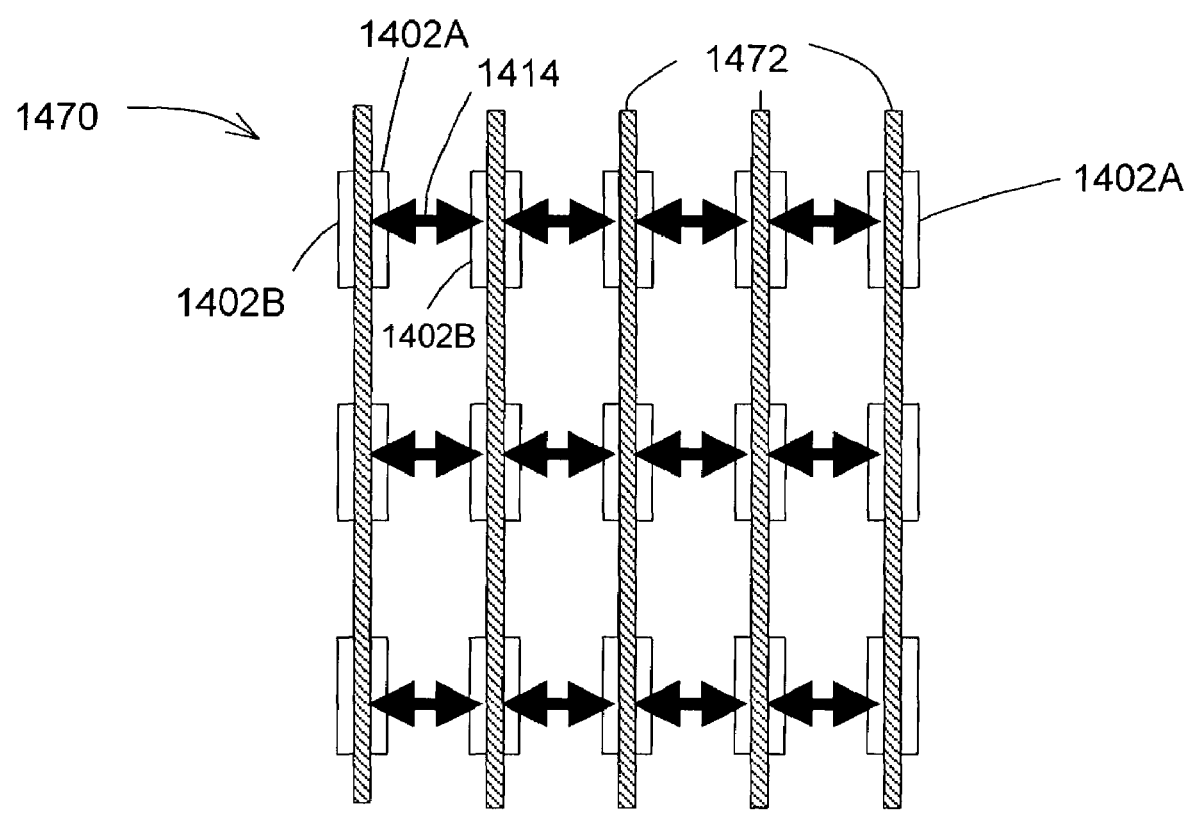

As illustrated in FIGS. 14A–14C, a number of terahertz interconnect components may be grouped together on boards to provide a larger network of interconnected systems. For example, a transceiver pair 1400 as shown in FIG. 14A includes first and second transceiver assemblies 1402A and 1402B. First and second transceiver assemblies 1402A and 1402B include, respectively, first and second substrates 1404A and 1404B, first and second ground planes 1406A and 1406B, with first and second circuitry 1408A (not visible) and 1408B disposed thereon. First and second transceiver circuitry 1408A and 1408B are respectively connected with first and second antennae 1410A and 1410B via first and second electrical interconnects 1412A (not visible) and 1412B. In the example shown in FIG. 14A, first and second antennae 1410A and 1410B are essentially identical and are designed to be poor radiators of terahertz carrier signals in free space (i.e., not well matched to free space impedance). When two such antennae are brought within close proximity of one another (i.e., within a few wavelengths), then the transmit antenna, for example first antenna 1410A in this case, will "see" an identical impedance in the receive antenna, namely second antenna 1410B in this case, and transfer its terahertz carrier signal to the receive antenna. First and second antennae 1410A and 1410B should have fairly high directivity such that the radiation takes place specifically toward each other while minimizing stray radiation. The selection of the antenna design, such as patch antennae, dipole antennae, and so on, would influence the radiation pattern, and therefore the coupling efficiency. For instance, for a surface normal coupling direction, a patch antenna may be preferable over a dipole antenna, which has a more omni-directional radiation pattern than the patch antenna. The process would work just as well in the opposite direction, going from second antenna 1410B to first antenna 1410A.

An alternative approach to using impedance matched, poor radiator antennae is to use coupled transmission lines, as shown in FIG. 14B. A transmitter pair 1450 of FIG. 14B includes first and second transmitter assemblies 1452A and 1452B. As can be seen on second transmitter assembly 1452B, the transmitter assembly includes a transmitter circuitry 1454B driving a pair of terminated, transmission lines 1456B that provides an evanescent field 1458B in the free space immediately surrounding the transmission line pair, terminated by a termination 1460B. Although not visible in the present figure, a matching set of terminated transmission line pair 1456A, with termination 1460A and evanescent field 1458A, is present on the hidden face of transmitter assembly 1452A facing transmitter assembly 1452. Since the transmission line pair 1456B is terminated by termination 1460B, virtually no electromagnetic energy is radiated away from the transmitter assembly. However, when the matching pair of transmission lines 1456A of transmitter assembly 1450A is brought into close proximity with the transmitter transmission line 1456B, energy from the transmitter transmission line couples into the receiver transmission line by evanescent coupling, as represented by an arrow 1462B. Although the two transmission lines would require relatively precise alignment and coupling lengths of several wavelengths long for high percentage coupling, the coupling process itself is quite efficient, while allowing the freedom from hardwired electrical connections. It may be noted that the process described in the foregoing is reversible such that energy transfer may occur from first transmitter assembly 1452A toward 1452B as well.

The near-field terahertz communication link concept may be expanded to provide board-to-board interconnects to provide connections between standard printed circuit boards in an enclosure with high data-rate, low power backplane links. For example, assembly 1470 of FIG. 14C includes a plurality of boards 1472 interconnected by a series of transmitter pairs 1400 from FIG. 14A or transmitter pairs 1450 of FIG. 14B. For example, transceivers on each board are aligned to standardized positions on the boards such that the boards may be stacked in close proximity to one another. Each board-to-board link is terminated at each end with a transceiver assembly 1402A or 1402B with transceiver assemblies mounted on both sides of the boards.

The scheme as shown in FIG. 14C includes a number of advantages over traditional, card-edge, backplane interconnects. First, the communications lines on the board are not required to run all the way to the edge of the board. Second, in contrast to the one-dimensional interconnect array of the traditional card-edge approach, a two dimensional array of interconnects may be implemented on each board, thus resulting in high interconnect density and shorter wire runs on the boards. Third, no card-edge sockets are needed; basically, the boards need only to be generally aligned with the transceiver assemblies in fairly close proximity to each other.

In some applications, it may not be possible to bring the boards to such close proximity due to, for instance, cooling, crosstalk or assembly considerations. In such applications, individual transceiver pairs may be enclosed, for example, in hollow metal waveguides in order to confine the terahertz carrier signals between transceiver pairs. Examples of such waveguided structures are shown in FIGS. 15A–15C as described in detail immediately hereinafter.

Figure 15A:
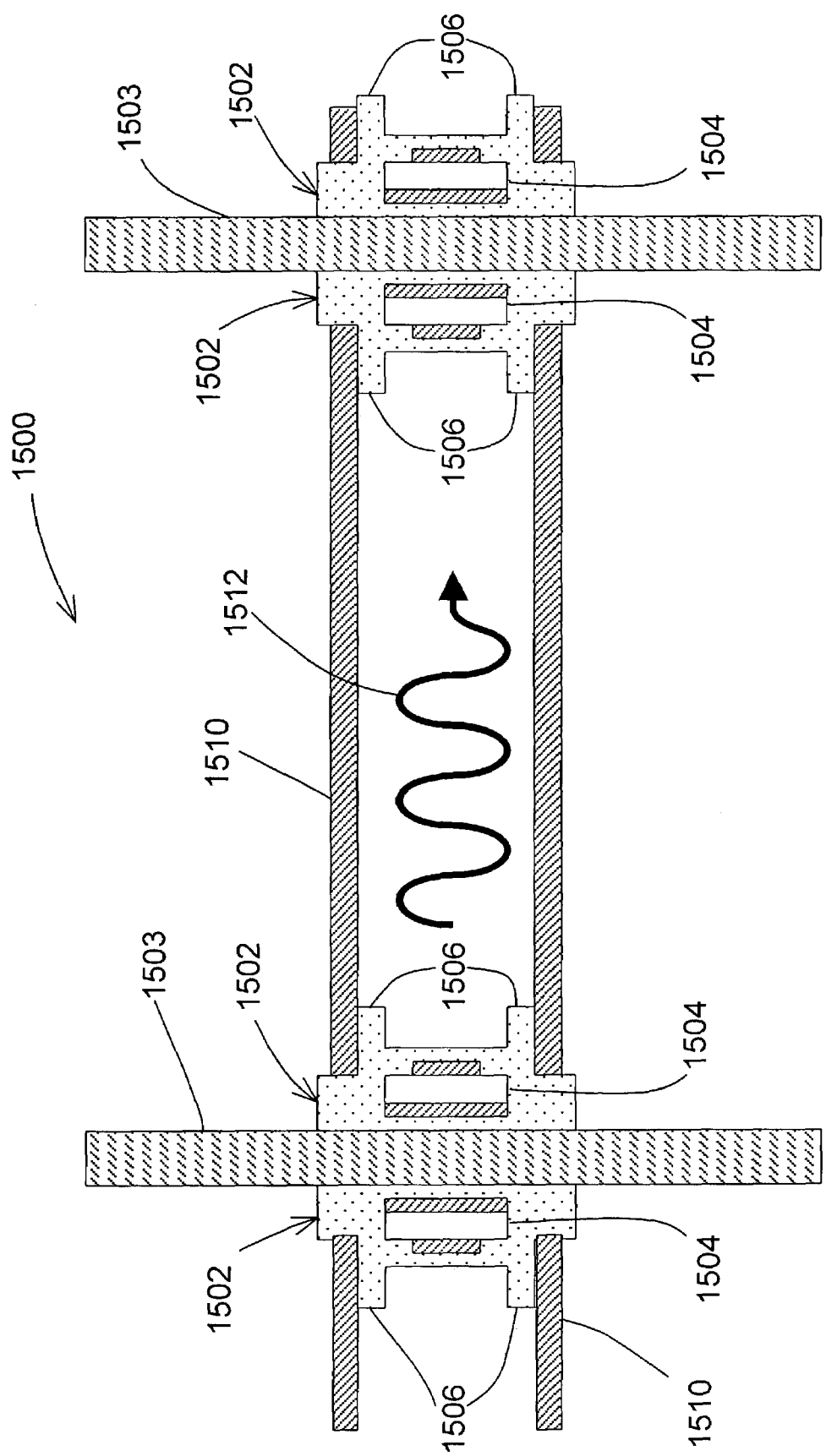
FIGS. 15A–15C are diagrammatic illustrations of terahertz interconnect systems including guided wave configurations in accordance with the present invention.

Referring first to FIG. 15A in conjunction with FIG. 14C, a waveguided interconnect system 1500 includes a plurality of transceiver arrangements 1502 disposed on opposing surfaces of boards 1503. Waveguided interconnect system 1500 would be suitable for use, for example, as one of the transceiver pairs 1402A–1402B as shown in FIG. 14C. Each transceiver arrangement 1502 includes a transceiver 1504 embedded therein and an alignment flange 1506. Alignment flange 1506 may be formed integrally from the transceiver arrangement, as shown in FIG. 15A, or be formed separately then affixed to be a part of transceiver arrangement 1502. Boards 1503 and the corresponding transceiver arrangements 1502 are aligned with respect to each other such that alignment flanges 1506 serve as guides for the alignment of a waveguide 1510 thereacross. Waveguide 1510 may be, for example, a hollow metal tube waveguide such as an extruded metal tubing or metallized plastic tubing. In addition, alignment flanges 1506 on the transceiver arrangements allow waveguide 1510 to be accurately aligned with respect to transceiver 1504. An alignment tolerance of approximately $\lambda/20$ (1/20 of a wavelength) is sufficient for efficient waveguiding. For example, in the case of a 1 THz carrier wave, the signal free-space wavelength is 300 microns, corresponding to an alignment tolerance of approximately 15 microns, which is much relaxed in comparison to the sub-micron alignment tolerances required, for instance, in optical interconnections. Lateral misalignment between transceiver chips between boards corresponds to angular misalignment of transceiver to waveguide. For small angles, it is submitted that this misalignment is not critical due to the large alignment tolerance enabled by the use of terahertz range frequency carrier signals. As a result, waveguide 1510 efficiently guides, for instance, a terahertz carrier signal 1512 from one transceiver 1506 at one end of the waveguide to another transceiver at another end of the waveguide.

Figure 15B:
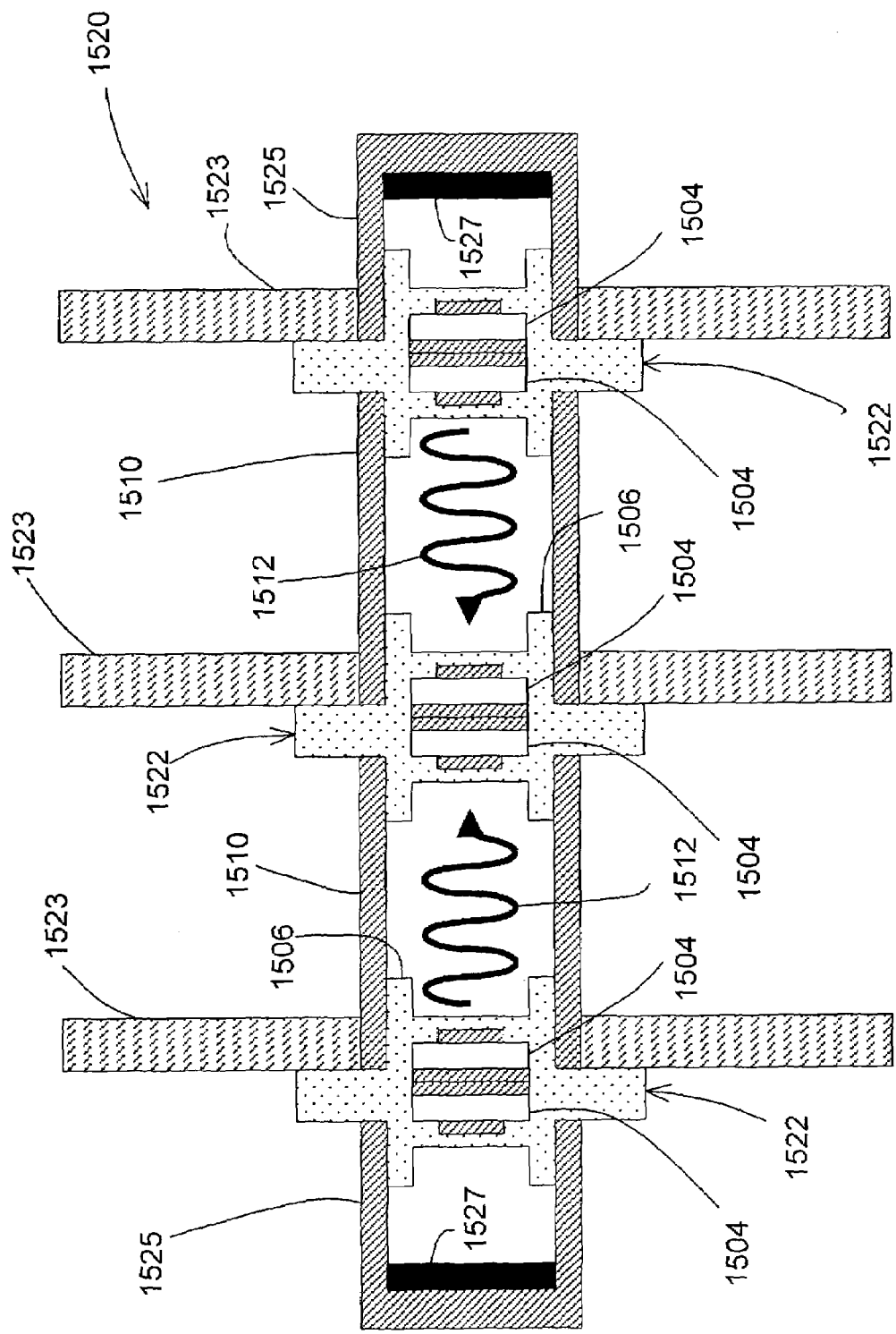
Figure 15C:
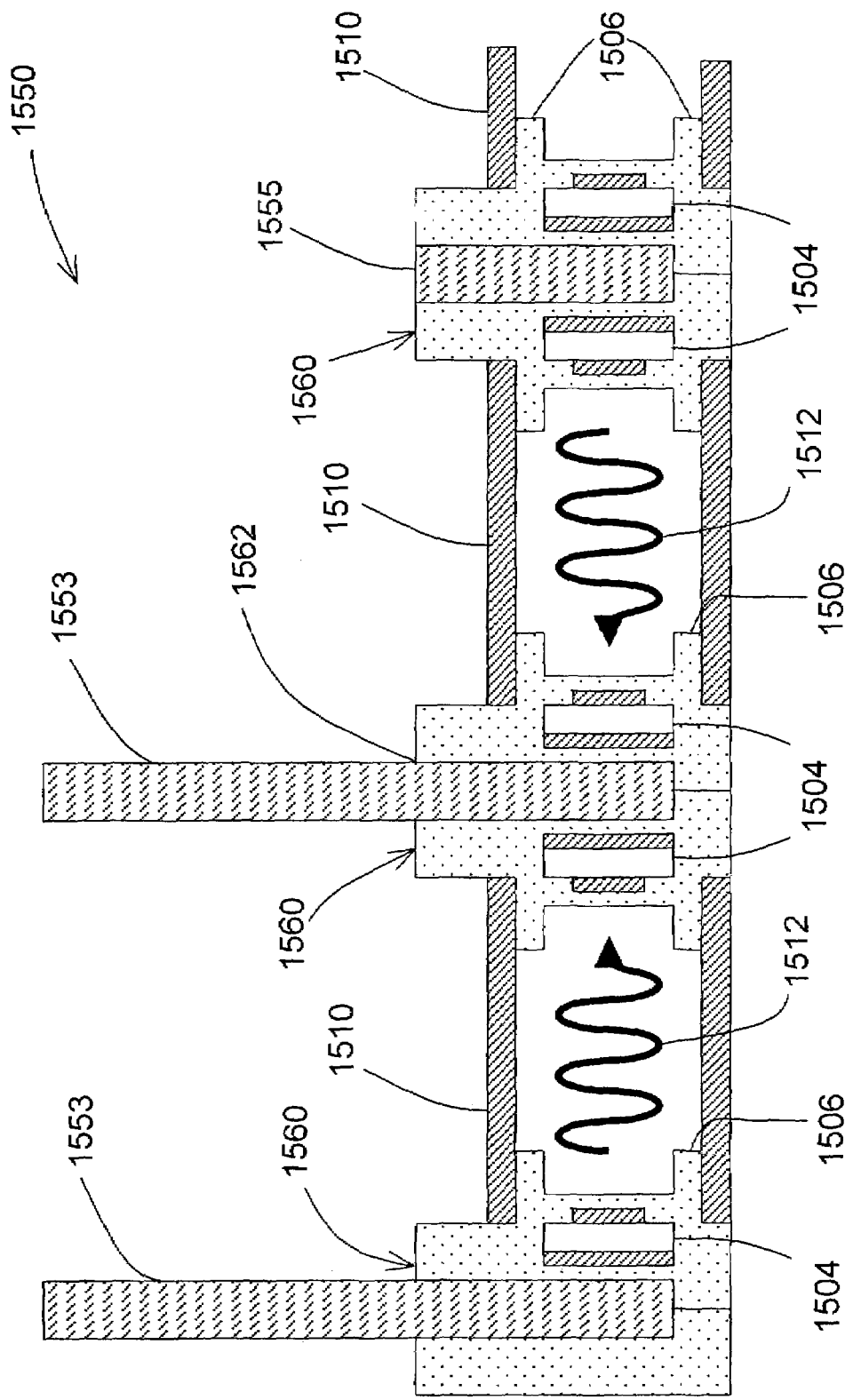

An alternative waveguided interconnect system 1520 is shown in FIG. 15B. In waveguided interconnect system 1520, a plurality of transceiver arrangements 1522 are embedded in boards 1523 such that each transceiver arrangement 1522 actually protrudes on either side of each board 1523. Each one of transceiver arrangements 1522 includes a pair of transceivers 1504 arranged back to back such that transceiver arrangement 1522 is capable of transmitting and receiving a terahertz carrier frequency signal 1512 from either side of board 1523. Like transceiver arrangement 1502 in FIG. 15A, transceiver arrangement 1522 includes alignment flanges 1506 such that waveguide 1510 may be aligned with respect to the transceiver arrangements on adjacent boards in order to guide terahertz carrier signal 1512 therebetween. A terminating waveguide 1525, including an absorber 1527, may be used to cap the transceiver arrangement if no signal transmission in that direction is required.

Finally, to be compatible with traditional circuit board mounting, some applications require a card-edge backplane connector. A waveguided interconnect system 1550 as shown in FIG. 15C accommodates such connection schemes by providing transceiver chips in card-edge socket packages. Waveguided interconnect system 1550 is configured to accept card-edge connected boards 1553 or a pass-through board 1555 to take up an empty slot, and includes a plurality of transceiver arrangements 1560. Transceiver arrangements 1560 includes a slot 1562 configured for board insertion therein. In this way, transceivers 1504 embedded in transceiver arrangements 1560 are aligned at the edge of each board, and waveguide 1510 is aligned at a suitable position to guide the signals transmitted between the transceivers.

Still another interconnect system using coupled transmission lines is illustrated in FIGS. 16A–16C. FIG. 16A shows an interconnect system 1600 including a substrate 1602 with transceiver arrangements 1604 disposed thereon. Each one of transceiver arrangements 1604 includes a transceiver 1606, a transmission line arrangement 1608 and a termination 1610. Transceiver 1606 provides, for example, a terahertz frequency carrier signal (not shown in FIG. 16A for clarity) which is directed through transmission line arrangement 1608 toward termination 1610. As the terahertz frequency carrier signal travels through transmission line arrangement 1608 in one of the transceiver arrangements 1604, the signal is coupled to the transmission line arrangement of the adjacent one of the transceiver arrangements by evanescent coupling. In this way, there is no requirement for energy to be radiated outside of the transceiver arrangement, thus eliminating crosstalk and wasted energy.

The details of the evanescent coupling taking place between transceiver arrangements 1604 are illustrated in FIG. 16B. FIG. 16B illustrates the coupling of a signal (represented by an energy curve 1622) from a first transmission line arrangement 1608A to a second transmission line arrangement 1608B. As signal 1622 propagates along first transmission line arrangement 1608A towards termination 1610A in a propagation direction indicated by an arrow 1624, the evanescent field associated with signal 1622 couples into second transmission line arrangement 1608B, which is placed in close proximity with first transmission line arrangement 1608A. As a result, energy from signal 1622 is directed in a coupling direction, indicated by an arrow 1626, and transferred into second transmission line arrangement 1608B to become signal 1622' propagating in a direction indicated by an arrow 1624'. The process may also take place in the opposite direction from second transmission line arrangement 1608B toward first transmission line arrangement 1608A.

An alternative configuration of the coupled transmission line interconnect system is shown in FIG. 16C. In an interconnect system 1650, the transceiver arrangements 1604 are disposed on opposing surfaces of substrate 1602. In this way, as long as substrate 1602 is thin enough to enable evanescent coupling therethrough, the signal from the top transceiver arrangement may be transferred to the bottom transceiver arrangement, and vice versa.

Figure 17A:
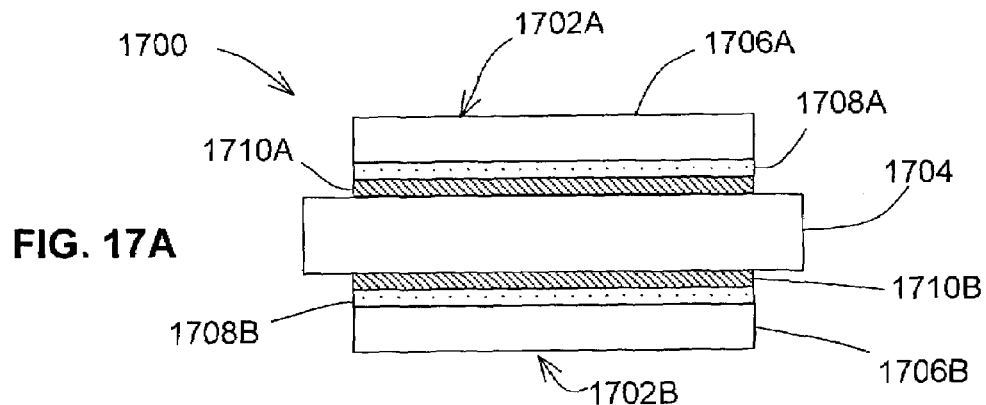
FIGS. 17A–17C are diagrammatic illustrations, in cross-section, of exemplary embodiments of coupling schemes to establish communication between two electronic circuitry on two separate substrates, such as two integrated circuit chips, based on the terahertz interconnect system of the present invention.
Figure 17B:
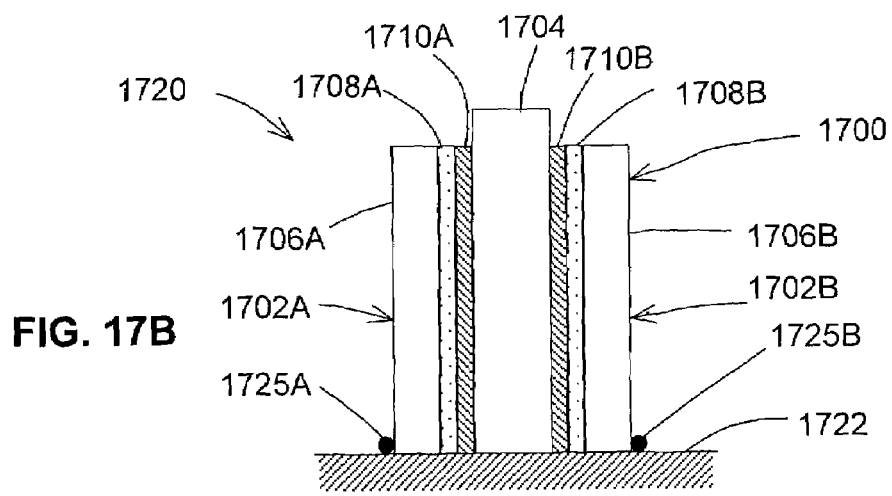
Figure 17C:
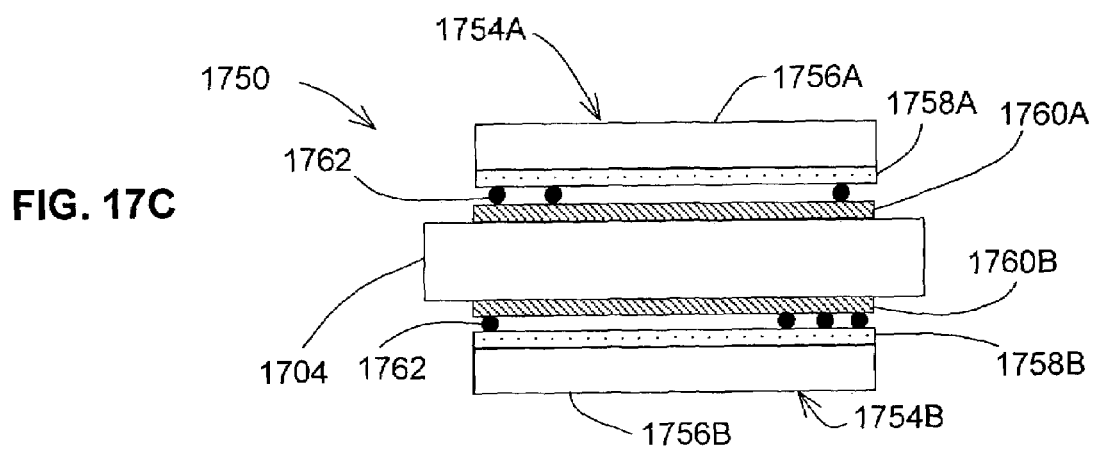

Still another configuration for the opto-coupler of the present invention are illustrated in FIGS. 17A–17C. FIG. 17A shows a terahertz opto-coupler 1700 including a pair of transceiver arrangements 1702A and 1702B coupled through an insulator layer 1704. Transceiver arrangements 1702A and 1702B respectively include substrates 1706A and 1706B, as well as circuitry 1708A and 1708B. Circuitry 1708A and 1708B each includes a transceiver and, optionally, additional electronics. Transceiver arrangements 1702A and 1702B are bonded to insulator layer 1704 by bonding layers 1710A and 1710B, respectively. Terahertz opto-coupler 1700 of FIG. 17A may be readily incorporated into an electrical system by connection with electrical contacts as shown in FIG. 17B. In FIG. 17B, terahertz opto-coupler 1700 is connected with, for example, a chip 1722 by means of ball bonds 1725A and 1725B. In this way, terahertz opto-coupler 1700 may be electrically connected with an existing chip or printed circuit board or other electrical circuitry. In place of the ball bonds, other electrical contact techniques, Such as those used in flip-chip bonding, may be used. FIG. 17C illustrates a further variation of the terahertz opto-coupler including an insulator layer. In FIG. 17C, an opto-coupler 1750 includes integrated circuit assemblies 1754A and 1754B. Integrated circuit assemblies 1754A and 1754B respectively include substrates 1756A and 1756B supporting electronic circuitry 1758A and 1758B, respectively. In addition, on opposing surfaces of insulator layer 1704, transceiver circuitry 1760A and 1760B are disposed thereon. Integrated circuit assemblies 1754A and 1754B are brought into electrical contact with transceiver circuitry 1760A and 1760B by means of a plurality of ball bonds 1762 and/or other types of electrical contact techniques. In this way, the terahertz interconnect techniques of the present invention may be used to provide fast, opto-couplers that are readily compatible with existing electronic circuitry.

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, a reflective layer may be disposed between the circuitry layer and the waveguide layer for better isolation of the waveguide layer from the circuitry as well as for improved coupling of optical signals from the waveguide into the electron tunneling devices (see, for example, the P1-cip application). Also, the waveguide layer shown, for example, in FIG. 1A may be a separately deposited waveguide or a silicon-on-insulator (SOI) integrated waveguide. Furthermore, the substrate itself may be optically transmissive or guiding such that the optical signal may be provided from the substrate side of the interconnect arrangement rather than being edge-fed or incident from the top side. Still further, a variety of light coupling arrangements may be included in the embodiments of the present invention such as, and not limited to, antennas (as shown in, for instance, FIGS. 1A and 6A), grating couplers and surface plasmon evanescent couplers, all of which are discussed in detail in the aforementioned P1 and P2 patents and P3, P3-cip and P1-cip applications. Another application of the terahertz interconnect system of the present invention is an optical-to-terahertz interconnect interface. There is a range of cases in which an incoming signal in an optical fiber, for instance, must be converted to a much lower carrier frequency, such as in or near the terahertz range, and vice versa. There is a range of cases in which an incoming signal in an optical fiber must be converted to a much lower carrier frequency, e.g., having a carrier frequency in or near the terahertz range, or vice versa. This conversion can be accomplished by a number of means. One is to receive the optical signal in a optical fiber receiver that converts the signal to a pure electronic one, and then use this signal to modulate a terahertz-wave transmitter, as described herein. Another approach is to use mixing in a nonlinear device, in which the optical signal is mixed with an optical frequency that differs from that of the optical signal carrier frequency by a specified near-terahertz-range frequency. The result will include the same signal now having a carrier frequency of the specified near-terahertz-range frequency. The nonlinear device that performs this function can include an antenna/metal-insulator based device to perform the receiving, mixing, and/or re-emission functions. Other means for converting a signal having an optical-frequency carrier to a near-terahertz-range-frequency carrier are known to those skilled in the art. Similar means may be used to perform the opposite function of converting a signal having an near-terahertz-range-frequency carrier to a optical frequency carrier. Other examples of applications of terahertz interconnect technology of the present invention are described in a Phiar Corporation white paper,[6] which is attached to the present application as Appendix A and is incorporated herein in its entirety.

Therefore, the present examples are to be considered as illustrative and not restrictive, and the invention is not to be limited to the details given herein but may be modified within the scope of the appended claims.

References

1. Neil Savage, "Linking with Light," *IEEE Spectrum*, vol. 39, Issue 8, pp. 32–36 (2002).
2. A. F. J. Levi, "Optical Interconnects in Systems," *Proceedings of the IEEE*, vol. 88, pp. 750–757 (2002).
3. IEEE Virtual Museum, "Millimeter Waves" (http://www.ieee-virtual-museum.org/collection/tech.php?id=2345917&lid=1) (2003).
4. Brian J. Soller and Dennis G. Hall, "Energy transfer at optical frequencies to silicon-based waveguiding structures," J. Opt. Soc. Am. A, vol. 18, no. 10, pp. 2577–2584 (2001).
5. Winfried Wilcke et al., "IceCube: A System Architecture for Storage and Internet Servers," (http://www.almaden.ibm.com/StorageSystems/autonomic_storage/CIB_Hardware/IceCubePrez.pdf), IBM Almaden Research, Jan. 24, 2002.
6. Garret Moddel et al., "Phiar's Terahertz-Wave Interconnect Technology," Phiar Corporation white paper, Jun. 14, 2003.

What is claimed is:

1. An assembly comprising:
a first electrical circuitry for providing a first electrical signal containing data;
a transmitting arrangement connected with said first electrical circuitry and configured for receiving said first electrical signal and for converting said first electrical signal into an electromagnetic signal containing at least a portion of said data, said electromagnetic signal having a carrier frequency greater than 300 GHz;
a receiving arrangement configured for receiving said electromagnetic signal and for converting said electromagnetic signal into a second electrical signal containing at least some of said portion of said data; and
a second electrical circuitry connected with said receiving arrangement and configured for receiving said second electrical signal,
wherein said transmitting and receiving arrangements are configured to cooperate with one another such that said transmitting arrangement conveys said electromagnetic signal to said receiving arrangement by free-space transmission.

2. The assembly of claim 1 further comprising:
a first substrate configured for supporting said first electrical circuitry and said transmitting arrangement; and
a second substrate separate from said first substrate, said second substrate being configured for supporting said receiving arrangement and said second electrical circuitry.

3. An assembly comprising:
a first electrical circuitry for providing a first electrical signal containing data;
a transmitting arrangement connected with said first electrical circuitry and configured for receiving said first electrical signal and for converting said first electrical signal into an electromagnetic signal containing at least a portion of said data, said electromagnetic signal having a carrier frequency greater than 300 GHz;
a receiving arrangement configured for receiving said electromagnetic signal and for converting said electromagnetic signal into a second electrical signal containing at least some of said portion of said data; and
a second electrical circuitry connected with said receiving arrangement and configured for receiving said second electrical signal,
wherein said transmitting arrangement includes a transmitting antenna for transmitting said electromagnetic signal away from said transmitting arrangement.

4. An assembly comprising:
a first electrical circuitry for providing a first electrical signal containing data;
a transmitting arrangement connected with said first electrical circuitry and configured for receiving said first electrical signal and for converting said first electrical signal into an electromagnetic signal containing at least a portion of said data, said electromagnetic signal having a carrier frequency greater than 300 GHz;
a receiving arrangement configured for receiving said electromagnetic signal and for converting said electromagnetic signal into a second electrical signal containing at least some of said portion of said data; and
a second electrical circuitry connected with said receiving arrangement and configured for receiving said second electrical signal,
wherein said receiving arrangement includes a receiving antenna for receiving said electromagnetic signal.

5. An assembly comprising:
a first electrical circuitry for providing a first electrical signal containing data;
a transmitting arrangement connected with said first electrical circuitry and configured for receiving said first electrical signal and for converting said first electrical signal into an electromagnetic signal containing at least a portion of said data;
a receiving arrangement configured for receiving said electromagnetic signal and for converting said electromagnetic signal into a second electrical signal containing at least some of said portion of said data; and
a second electrical circuitry connected with said receiving arrangement and configured for receiving said second electrical signal,
wherein at least one of said transmitting and receiving arrangements includes an electron tunneling device, said electron tunneling device including
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling, wherein said electron tunneling device is configured such that using only said first layer in the arrangement would result in a given value of nonlinearity in said transport of electrons, with respect to said given voltage, and wherein said arrangement further includes a different, second layer disposed directly adjacent to and configured to cooperate with said first layer such that said nonlinearity, with respect to said given voltage, is increased over and above said given value of nonlinearity by the inclusion of said second layer without the necessity for any additional layer.

6. An assembly comprising:

a first electrical circuitry for providing a first electrical signal containing data;

a transmitting arrangement connected with said first electrical circuitry and configured for receiving said first electrical signal and for converting said first electrical signal into an electromagnetic signal containing at least a portion of said data;

a receiving arrangement configured for receiving said electromagnetic signal and for converting said electromagnetic signal into a second electrical signal containing at least some of said portion of said data; and a second electrical circuitry connected with said receiving arrangement and configured for receiving said second electrical signal, wherein at least one of said transmitting and receiving arrangements includes an electron tunneling device, said electron tunneling device including first and second non-insulating layers spaced apart from one another such that a given voltage can be provided across the first and second non-insulating layers, and an arrangement disposed between the first and second non-insulating layers and configured to serve as a transport of electrons between and to said first and second non-insulating layers, said arrangement including at least a first layer configured such that said transport of electrons includes, at least in part, transport by means of tunneling, wherein said transmitting and receiving arrangements are configured to cooperate with one another such that said transmitting arrangement conveys said electromagnetic signal to said receiving arrangement by free-space transmission.

7. The assembly of claim 6 further comprising:

a first substrate configured for supporting said first electrical circuitry and said transmitting arrangement; and a second substrate separate from said first substrate, said second substrate being configured for supporting said receiving arrangement and said second electrical circuitry.

8. An assembly comprising:

a first electrical circuitry for providing a first electrical signal containing first data;

a first transceiver arrangement connected with said first electrical circuitry and configured for receiving said first electrical signal and for converting said first electrical signal into a first electromagnetic signal containing at least a portion of said first data;

a second transceiver arrangement configured for receiving said first electromagnetic signal and for converting said first electromagnetic signal into a second electrical signal containing at least some of said portion of said first data; and a second electrical circuitry connected with said second transceiver arrangement and configured for receiving said second electrical signal, wherein at least one of said first and second transceiver arrangements includes an electron tunneling device, said electron tunneling device including first and second non-insulating layers spaced apart from one another such that a given voltage can be provided across the first and second non-insulating layers, and an arrangement disposed between the first and second non-insulating layers and configured to serve as a transport of electrons between and to said first and second non-insulating layers, said arrangement including at least a first layer configured such that said transport of electrons includes, at least in part, transport by means of tunneling, wherein said second electrical circuitry is configured for providing a third electrical signal containing second data, wherein said second transceiver arrangement is further configured for receiving said third electrical signal and for converting said third electrical signal into a third electromagnetic signal containing at least a portion of said second data, wherein said first transceiver arrangement is further configured for receiving said third electromagnetic signal and for converting said third electromagnetic signal into a fourth electrical signal containing at least some of said portion of said second data, and wherein said first electrical circuitry is configured for receiving said fourth electrical signal.

9. An assembly comprising:

a first electrical circuitry for providing a first electrical signal containing data;

a transmitting arrangement connected with said first electrical circuitry and configured for receiving said first electrical signal and for converting said first electrical signal into an electromagnetic signal containing at least a portion of said data;

a receiving arrangement for receiving said electromagnetic signal and for converting said electromagnetic signal into a second electrical signal containing at least some of said portion of said data; and a second electrical circuitry connected with said receiving arrangement and configured for receiving said second electrical signal, wherein at least one of said transmitting and receiving arrangements is configured to provide electron tunneling and includes an antenna connected therewith.

10. The assembly of claim 9 wherein said transmitting arrangement includes an electron tunneling device for providing said electron tunneling, and wherein said antenna is a transmitting antenna for transmitting said electromagnetic signal away from said transmitting arrangement.

11. The assembly of claim 9 wherein said receiving arrangement includes an electron tunneling device for providing said electron tunneling, and wherein said antenna is a receiving antenna for receiving said electromagnetic signal.

12. The assembly of claim 9 wherein each of said transmitting and receiving arrangements includes an electron tunneling device for providing said electron tunneling.

13. An assembly comprising:
first electrical means for providing a first electrical signal containing data;
transmitting means connected with said first electrical means and configured for receiving said first electrical signal and for converting said first electrical signal into an electromagnetic signal containing at least a portion of said data;
receiving means for receiving said electromagnetic signal and for converting said electromagnetic signal into a second electrical signal containing at least some of said portion of said data; and
second electrical means connected with said receiving means and configured for receiving said second electrical signal,
wherein at least one of said transmitting and receiving means includes means for providing electron tunneling with an antenna connected therewith.

14. An assembly comprising:
a substrate;
an integrated circuit package supported on said substrate and containing
an integrated circuit module configured for providing an output electrical signal containing output data, and
a transceiver arrangement connected with said integrated circuit module for receiving said output electrical signal and for converting said output electrical signal into an output electromagnetic signal containing at least a portion of said output data; and
a waveguide having a first segment and a distinct, second segment, said first segment being also supported on said substrate and configured for receiving at least a portion of said output electromagnetic signal and directing said portion of said output electromagnetic signal toward said distinct, second segment of said waveguide.

15. The assembly of claim 14 wherein said integrated circuit module is a standard integrated circuit chip.

16. The assembly of claim 14 wherein said transceiver arrangement includes an electron tunneling arrangement for providing electron tunneling.

17. The assembly of claim 16 wherein said electron tunneling device includes
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

18. The assembly of claim 14 wherein said waveguide is further configured for receiving an input electromagnetic signal containing input data at said distinct, second segment and directing said input electromagnetic signal toward said first segment, wherein said transceiver arrangement is further configured for receiving at least a portion of said input electromagnetic signal, for converting said portion of said input electromagnetic signal into an input electrical signal containing at least a portion of said input data, and for directing said input electrical signal to said integrated circuit module.

19. An assembly comprising:
a substrate;
an integrated circuit package including
an integrated circuit module for providing an output electrical signal containing output data, and
a plurality of electrical pin-outs for directing said output electrical signal away from said integrated circuit module and away from said integrated circuit package;
a socket arrangement supported on said substrate and configured for receiving said integrated circuit package thereon, said socket arrangement including a transceiver arrangement disposed therein such that said transceiver arrangement receives said output electrical signal from said plurality of electrical pin-outs and converts said output electrical signal into an output electromagnetic signal containing at least a portion of said output data; and
a waveguide having a first segment and a distinct, second segment, said first segment being also supported on said substrate and configured for receiving at least a portion of said output electromagnetic signal and directing said portion of said output electromagnetic signal toward said distinct, second segment of said waveguide.

20. The assembly of claim 19 wherein said transceiver arrangement includes an electron tunneling arrangement for providing electron tunneling.

21. The assembly of claim 20 wherein said electron tunneling device includes
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

22. The assembly of claim 19 wherein said waveguide is further configured for receiving an input electromagnetic signal containing input data at said distinct, second segment and directing said input electromagnetic signal toward said first segment, wherein said transceiver arrangement is further configured for receiving at least a portion of said input electromagnetic signal, for converting said portion of said input electromagnetic signal into an input electrical signal containing at least a portion of said input data, and for directing said input electrical signal to said integrated circuit module through said plurality of electrical pin-outs.

23. An assembly comprising:
a substrate;
an integrated circuit package supported on said substrate and containing an integrated circuit module, said integrated circuit module being configured for providing an output electrical signal containing output data;
an electrical interconnect also supported on said substrate and having first and second ends, said first end being connected with said integrated circuit module through said integrated circuit package and configured to receive said output electrical signal such that said output electrical signal is directed through said electrical interconnect toward said second end;
a transceiver package also supported on said substrate and including a transceiver chip, said transceiver chip being connected with said second end of said electrical interconnect such that said transceiver chip receives said output electrical signal and converts said output electrical signal into an output electromagnetic signal containing at least a portion of said output data; and a waveguide having a first segment, said first segment being also supported on said substrate and configured for receiving at least a portion of said output electromagnetic signal and directing said portion of said output electromagnetic signal toward a distinct, second segment of said waveguide.

24. The assembly of claim 23 wherein said transceiver chip includes an electron tunneling arrangement for providing electron tunneling.

25. The assembly of claim 24 wherein said electron tunneling device includes
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

26. The assembly of claim 23 wherein said waveguide is further configured for receiving an input electromagnetic signal containing input data at said distinct, second segment and directing said input electromagnetic signal toward said first segment, wherein said transceiver chip is further configured for receiving at least a portion of said input electromagnetic signal, for converting said portion of said input electromagnetic signal into an input electrical signal containing at least a portion of said input data, and for directing said input electrical signal to said second end of said electrical interconnect, wherein said electrical interconnect is further configured for receiving said input electrical signal and directing at least a portion of said input electrical signal to said first end, and wherein said integrated circuit module is further configured to receive said portion of said input electrical signal.

27. In a system including an integrated circuit module configured for providing an output electrical signal containing output data, an assembly for receiving said integrated circuit module and extracting said output data, said assembly comprising:
a substrate;
an integrated circuit package supported on said substrate and configured for accommodating said integrated circuit module thereon, said integrated circuit packaging including a transceiver arrangement connected with said integrated circuit module for receiving said output electrical signal and for converting said output electrical signal into an output electromagnetic signal containing at least a portion of said output data; and
a waveguide having a first segment and a distinct, second segment, said first segment being also supported on said substrate and configured for receiving at least a portion of said output electromagnetic signal and directing said portion of said output electromagnetic signal toward said distinct, second segment of said waveguide.

28. The assembly of claim 27 wherein said integrated circuit package is configured for accommodating a standard integrated circuit chip as said integrated circuit module.

29. The assembly of claim 27 wherein said transceiver arrangement includes an electron tunneling arrangement for providing electron tunneling.

30. The assembly of claim 29 wherein said electron tunneling device includes
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

31. The assembly of claim 27 wherein said waveguide is further configured for receiving an input electromagnetic signal containing input data at said distinct, second segment and directing said input electromagnetic signal toward said first segment, wherein said transceiver arrangement is further configured for receiving at least a portion of said input electromagnetic signal, for converting said portion of said input electromagnetic signal into an input electrical signal containing at least a portion of said input data, and for directing said input electrical signal to said integrated circuit module.

32. In a system including an integrated circuit package, which integrated circuit package includes an integrated circuit module, for providing an output electrical signal containing output data, and a plurality of electrical pin-outs, for directing said output electrical signal away from said integrated circuit module and away from said integrated circuit package, an assembly for receiving said integrated circuit module and extracting said output data, said assembly comprising:
a substrate;
a socket arrangement supported on said substrate and configured for receiving said integrated circuit package thereon, said socket arrangement including a transceiver arrangement disposed therein such that said transceiver arrangement receives said output electrical signal from said plurality of electrical pin-outs and converts said output electrical signal into an output electromagnetic signal containing at least a portion of said output data; and
a waveguide having a first segment and a distinct, second segment, said first segment being also supported on said substrate and configured for receiving at least a portion of said output electromagnetic signal and directing said portion of said output electromagnetic signal toward said distinct, second segment of said waveguide.

33. The assembly of claim 32 wherein said transceiver arrangement includes an electron tunneling arrangement for providing electron tunneling.

34. The assembly of claim 33 wherein said electron tunneling device includes
first and second non-insulating layers spaced apart from one another such that a given voltage can be provided across the first and second non-insulating layers, and
an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

35. The assembly of claim 32 wherein said waveguide is further configured for receiving an input electromagnetic signal containing input data at said distinct, second segment and directing said input electromagnetic signal toward said first segment, wherein said transceiver arrangement is further configured for receiving at least a portion of said input electromagnetic signal, for converting said portion of said input electromagnetic signal into an input electrical signal containing at least a portion of said input data, and for directing said input electrical signal to said integrated circuit module through said plurality of electrical pin-outs.

36. In a system including an integrated circuit package, which integrated circuit package includes an integrated circuit module configuredfor providing an output electrical signal containing output data, an assembly for receiving said integrated circuit module and extracting said output data, said assembly comprising:
  a substrate configured for supporting said integrated circuit module thereon, said substrate including
    an electrical interconnect having first and second ends, said first end being connected with said integrated circuit module through said integrated circuit package and configured to receive said output electrical signal such that said output electrical signal is directed through said electrical interconnect toward said second end,
  a transceiver package including a transceiver chip, said transceiver chip being connected with said second end of said electrical interconnect such that said transceiver chip receives said output electrical signal and converts said output electrical signal into an output electromagnetic signal containing at least a portion of said output data, and
  a waveguide having a first segment and a distinct, second segment, said first segment being configured for receiving at least a portion of said output electromagnetic signal and directing said portion of said output electromagnetic signal toward said distinct, second segment of said waveguide.

37. The assembly of claim 36 wherein said transceiver chip includes an electron tunneling arrangement for providing electron tunneling.

38. The assembly of claim 37 wherein said electron tunneling device includes
  first and second non-insulating layers spaced apart from one another such that a given voltage can be provided across the first and second non-insulating layers, and
  an arrangement disposed between the first and second non-insulating layers and configured to serve as a transport of electrons between and to said first and second non-insulating layers, said arrangement including at least a first layer configured such that said transport of electrons includes, at least in part, transport by means of tunneling.

39. The assembly of claim 36 wherein said waveguide is further configured for receiving an input electromagnetic signal containing input data at said distinct, second segment and directing said input electromagnetic signal toward said first segment, wherein said transceiver chip is further configured for receiving at least a portion of said input electromagnetic signal, for converting said portion of said input electromagnetic signal into an input electrical signal containing at least a portion of said input data, and for directing said input electrical signal to said second end of said electrical interconnect, wherein said electrical interconnect is further configured for receiving said input electrical signal and directing at least a portion of said input electrical signal to said first end, and wherein said integrated circuit module is further configured to receive said portion of said input electrical signal.

40. In a system including an integrated circuit module configured for providing an output electrical signal containing output data, an assembly for receiving said integrated circuit module and extracting said output data, said assembly comprising:
  an integrated circuit package configured for accommodating said integrated circuit module thereon, said integrated circuit package including a transceiver arrangement connected with said integrated circuit module and configured for
    receiving said output electrical signal,
    converting said output electrical signal into an output electromagnetic signal containing at least a portion of said output data, and
    directing said output electromagnetic signal away from said integrated circuit package,
  wherein said transceiver arrangement is further configured for radiating said output electromagnetic signal into free space such that said output electromagnetic signal is directed away from said integrated circuit package.

41. In a system including an integrated circuit module configured for providing an output electrical signal containing output data, an assembly for receiving said integrated circuit module and extracting said output data, said assembly comprising:
  an integrated circuit package configured for accommodating said integrated circuit module thereon, said integrated circuit package including a transceiver arrangement connected with said integrated circuit module and configured for
    receiving said output electrical signal,
    converting said output electrical signal into an output electromagnetic signal containing at least a portion of said output data, and
    directing said output electromagnetic signal away from said integrated circuit package; and
  a waveguide having a first segment and a distinct, second segment, said first segment being connected with said transceiver arrangement and said distinct, second segment being located away from said integrated circuit package, wherein said transceiver arrangement is further configured for directing at least a portion of said output electromagnetic signal into said first segment of said waveguide, and wherein said waveguide is configured for receiving said portion of said output electromagnetic signal and directing said portion of said output electromagnetic signal toward said distinct, second segment of said waveguide and, consequently, away from said integrated circuit package.

42. The assembly of claim 41 further comprising a substrate for supporting said integrated circuit package and at least a portion of said waveguide, wherein said waveguide is a slab waveguide.

43. In a system including an integrated circuit module configured for providing an output electrical signal containing output data, an assembly for receiving said integrated circuit module and extracting said output data, said assembly comprising:
  an integrated circuit package configured for accommodating said integrated circuit module thereon, said integrated circuit package including a transceiver arrangement connected with said integrated circuit module and configured for
    receiving said output electrical signal,
    converting said output electrical signal into an output electromagnetic signal containing at least a portion of said output data, and directing said output electromagnetic signal away from said integrated circuit package;

a substrate for supporting said integrated circuit package thereon; and a transmission line having a first segment and a distinct, second segment, at least said first segment also being supported on said substrate, said distinct, second segment being located away from said integrated circuit package, wherein said transceiver is further configured for directing at least a portion of said output electromagnetic signal toward said first segment of said transmission line, and wherein said first segment of said transmission line is configured for receiving said portion of said output electromagnetic signal and directing said portion of said output electromagnetic signal toward said distinct, second segment of said transmission line and, consequently, away from said integrated circuit package.

44. In a system including an integrated circuit package, which integrated circuit package includes an integrated circuit module, for providing an output electrical signal containing output data, and a plurality of electrical pin-outs, for directing said output electrical signal away from said integrated circuit module and away from said integrated circuit package, an assembly for receiving said integrated circuit module and extracting said output data, said assembly comprising:

a socket arrangement configured for accommodating said integrated circuit package thereon, said socket arrangement including a transceiver arrangement configured for receiving said output electrical signal from said plurality of electrical pin-outs, converting said output electrical signal into an output electromagnetic signal containing at least a portion of said output data, and directing said output electromagnetic signal away from said socket arrangement.

45. The assembly of claim 44 wherein said transceiver arrangement is further configured for radiating said output electromagnetic signal into free space such that said output electromagnetic signal is directed away from said socket arrangement.

46. The assembly of claim 44 further comprising a waveguide having a first segment and a distinct, second segment, said first segment being connected with said transceiver arrangement and said distinct, second segment being located away from said socket arrangement, wherein said transceiver arrangement is further configured for directing at least a portion of said output electromagnetic signal into said first segment of said waveguide, and wherein said waveguide is configured for receiving said portion of said output electromagnetic signal and directing said portion of said output electromagnetic signal toward said distinct, second segment of said waveguide and, consequently, away from said socket arrangement.

47. The assembly of claim 46 further comprising a substrate for supporting said socket arrangement and at least a portion of said waveguide, wherein said waveguide is a slab waveguide.

48. The assembly of claim 44 further comprising:

a substrate for supporting said socket arrangement; and a transmission line having a first segment and a distinct, second segment, at least said first segment also being supported on said substrate, said distinct, second segment being located away from said socket arrangement, wherein said transceiver is further configured for directing at least a portion of said output electromagnetic signal toward said first segment of said transmission line, and wherein said first segment of said transmission line is configured for receiving said portion of said output electromagnetic signal and directing said portion of said output electromagnetic signal toward said distinct, second segment of said transmission line and, consequently, away from said socket arrangement.

49. In a system including an integrated circuit package, which integrated circuit package includes an integrated circuit module configured for providing an output electrical signal containing output data, an assembly for receiving said integrated circuit module and extracting said output data, said assembly comprising:

an electrical interconnect having first and second ends, said first end being connected with said integrated circuit module through said integrated circuit package and configured to receive said output electrical signal such that said output electrical signal is directed through said electrical interconnect toward said second end, a transceiver package including a transceiver chip, said transceiver chip being connected with said second end of said electrical interconnect and configured for receiving said output electrical signal, converting said output electrical signal into an output electromagnetic signal containing at least a portion of said output data, and directing said output electromagnetic signal away from said transceiver package.

50. The assembly of claim 49 wherein said transceiver chip is further configured for radiating said output electromagnetic signal into free space such that said output electromagnetic signal is directed away from said transceiver package.

51. The assembly of claim 49 further comprising a waveguide having a first segment and a distinct, second segment, said first segment being connected with said transceiver chip and said distinct, second segment being located away from said transceiver package, wherein said transceiver chip is further configured for directing at least a portion of said output electromagnetic signal into said first segment of said waveguide, and wherein said waveguide is configured for receiving said portion of said output electromagnetic signal and directing said portion of said output electromagnetic signal toward said distinct, second segment of said waveguide and, consequently, away from said transceiver package.

52. The assembly of claim 51 further comprising a substrate for supporting said transceiver package and at least a portion of said waveguide, wherein said waveguide is a slab waveguide.

53. The assembly of claim 49 further comprising:

a substrate for supporting said electrical interconnect and said transceiver package; and a transmission line having a first segment and a distinct, second segment, at least said first segment also being supported on said substrate, said distinct, second segment being located away from said transceiver package, wherein said transceiver chip is further configured for directing at least a portion of said output electromagnetic signal toward said first segment of said transmission line, and wherein said first segment of said transmission line is configured for receiving said portion of said output electromagnetic signal and directing said portion of said output electromagnetic signal toward said distinct, second segment of said transmission line and, consequently, away from said transceiver package.

* * * * *